United States Patent
Takayama et al.

(10) Patent No.: US 11,070,028 B2
(45) Date of Patent: Jul. 20, 2021

(54) SEMICONDUCTOR LIGHT EMITTING ELEMENT

(71) Applicant: Panasonic Semiconductor Solutions Co., Ltd., Kyoto (JP)

(72) Inventors: Toru Takayama, Toyama (JP); Shinji Yoshida, Shiga (JP); Kunimasa Takahashi, Osaka (JP)

(73) Assignee: NUVOTON TECHNOLOGY CORPORATION JAPAN, Kyoto (JP)

( * ) Notice: Subject to any disclaimer, the term of this patent is extended or adjusted under 35 U.S.C. 154(b) by 0 days.

(21) Appl. No.: 17/017,459

(22) Filed: Sep. 10, 2020

(65) Prior Publication Data

US 2020/0412101 A1 Dec. 31, 2020

Related U.S. Application Data

(63) Continuation of application No. PCT/JP2019/002749, filed on Jan. 28, 2019.

(30) Foreign Application Priority Data

Mar. 30, 2018 (JP) .............................. JP2018-069125

(51) Int. Cl.
*H01S 5/00* (2006.01)
*H01S 5/20* (2006.01)
(Continued)

(52) U.S. Cl.
CPC .......... *H01S 5/2009* (2013.01); *H01S 5/2031* (2013.01); *H01S 5/22* (2013.01);
(Continued)

(58) Field of Classification Search
CPC ............... H01S 5/3407; H01S 5/34333; H01S 5/34346; H01S 5/22; H01S 5/2031;
(Continued)

(56) References Cited

U.S. PATENT DOCUMENTS

| | | | | |
|---|---|---|---|---|
| 6,064,082 A | * | 5/2000 | Kawai | ................ H01L 29/7783 257/191 |
| 2008/0137701 A1 | * | 6/2008 | Freund | ................ H01S 5/32341 372/45.011 |

(Continued)

FOREIGN PATENT DOCUMENTS

| | | |
|---|---|---|
| JP | 2000-299532 A | 10/2000 |
| JP | 2002-270971 A | 9/2002 |

(Continued)

OTHER PUBLICATIONS

International Search Report issued in corresponding International Patent Application No. PCT/JP2019/002749, dated Apr. 23, 2019, with English translation.

(Continued)

*Primary Examiner* — Kinam Park
(74) *Attorney, Agent, or Firm* — McDermott Will & Emery LLP

(57) ABSTRACT

A semiconductor light emitting element includes: a GaN substrate; a first semiconductor layer located above the GaN substrate and including a nitride semiconductor of a first conductivity type; an active layer located above the first semiconductor layer and including a nitride semiconductor including Ga or In; an electron barrier layer located above the active layer and including a nitride semiconductor including Al; and a second semiconductor layer located above the electron barrier layer and including a nitride semiconductor of a second conductivity type. The electron barrier layer includes: a first region having an Al composition ratio changing at a first change rate; and a second region having an Al composition ratio changing at a second change rate larger than the first change rate. In the first second regions, the Al composition ratio monotonically increases at (Continued)

the first change rate in the direction from the active layer toward second semiconductor layer.

20 Claims, 34 Drawing Sheets

(51) Int. Cl.
*H01S 5/22* (2006.01)
*H01S 5/34* (2006.01)
*H01S 5/343* (2006.01)
*H01S 5/30* (2006.01)
*H01S 5/323* (2006.01)

(52) U.S. Cl.
CPC ........ *H01S 5/3407* (2013.01); *H01S 5/34333* (2013.01); *H01S 5/34346* (2013.01); *H01S 5/0087* (2021.01); *H01S 5/305* (2013.01); *H01S 5/3077* (2013.01); *H01S 5/32341* (2013.01)

(58) Field of Classification Search
CPC ...... H01S 5/2009; H01S 5/3077; H01S 5/305; H01S 5/0087; H01S 5/32341
See application file for complete search history.

(56) References Cited

U.S. PATENT DOCUMENTS

| | | | |
|---|---|---|---|
| 2008/0247435 A1 | 10/2008 | Choi | |
| 2011/0182312 A1 | 7/2011 | Chen et al. | |
| 2011/0272667 A1* | 11/2011 | Takayama | B82Y 20/00 257/13 |
| 2014/0029636 A1 | 1/2014 | Hung et al. | |
| 2014/0183447 A1* | 7/2014 | Nago | B82Y 20/00 257/13 |
| 2014/0231838 A1* | 8/2014 | Tokuda | H01S 5/2009 257/94 |
| 2018/0109076 A1* | 4/2018 | Takayama | H01S 5/2206 |
| 2019/0074665 A1* | 3/2019 | Takayama | H01S 5/34333 |

FOREIGN PATENT DOCUMENTS

| | | |
|---|---|---|
| JP | 2005-150568 A | 6/2005 |
| JP | 2014-3329 A | 1/2014 |
| JP | 2014-27240 A | 2/2014 |
| JP | 2014-130897 A | 7/2014 |
| WO | 2016/199363 A1 | 12/2016 |
| WO | 2017/195502 A1 | 11/2017 |

OTHER PUBLICATIONS

Written Opinion issued in corresponding international Patent Application No. PCT/JP2019/002749, dated Apr. 23, 2019, with English translation.

* cited by examiner

FIG. 23
(a) 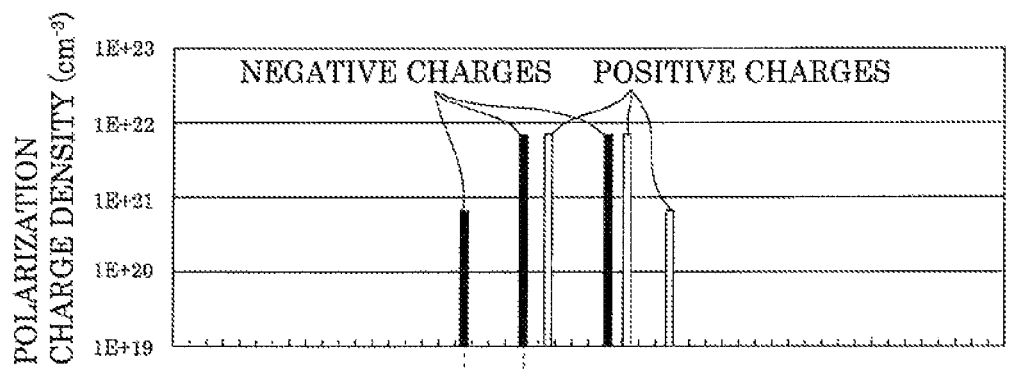
(b) 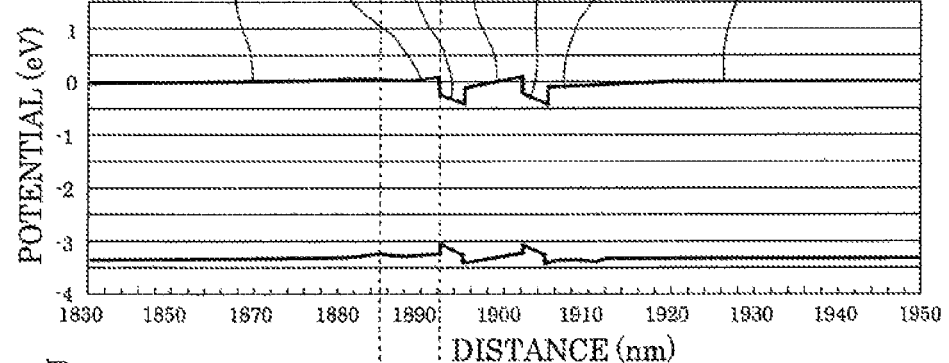
(c) 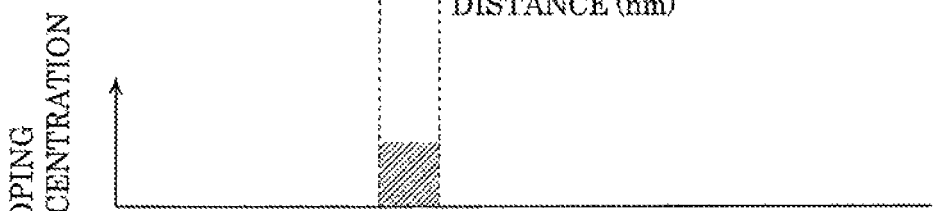
(d) 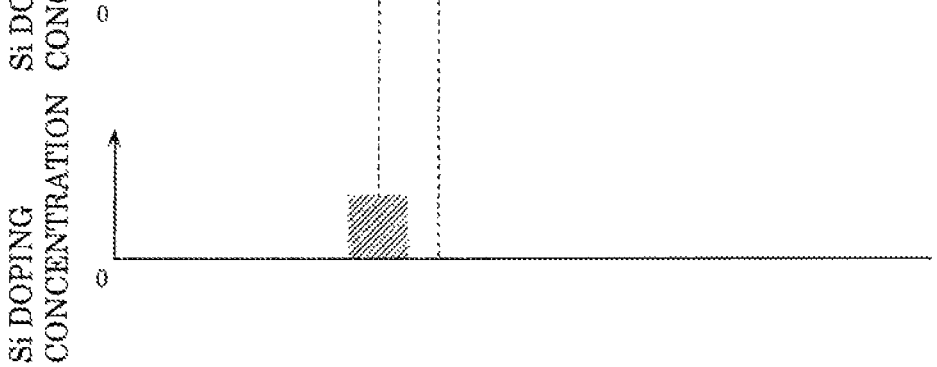

SEMICONDUCTOR LIGHT EMITTING ELEMENT

CROSS REFERENCE TO RELATED APPLICATIONS

This application is a U.S. continuation application of PCT International Patent Application Number PCT/JP2019/002749 filed on Jan. 28, 2019, claiming the benefit of priority of Japanese Patent Application Number 2018.069125 filed on Mar. 30, 2018, the entire contents of which are hereby incorporated by reference.

BACKGROUND

1. Technical Field

The present disclosure relates to a semiconductor light emitting element.

2. Description of the Related Art

In these days, attention has been drawn to on-vehicle laser head light sources which improve brightness by using, as light sources, semiconductor laser elements having a higher light emitting intensity than those of LEDs.

Super high-output semiconductor blue laser elements capable of operating in long periods that are several thousand hours or more even when Watt-class high-output operations are performed at a temperature of 85 degrees Celsius in a wavelength band including 450 nm have been desired as semiconductor laser elements which are used for on-vehicle head light sources.

When yellow light can be obtained by exciting phosphors with such a super high-output blue laser light, it becomes possible to obtain super high-output light sources which output white light as a whole.

In order to provide such highly-reliable super high-output semiconductor laser elements, self-heating in laser oscillation operations needs to be reduced as much as possible. For this reason, there is a need to enable operations that only require super low power consumption in the super high-output semiconductor laser elements.

In order to achieve a semiconductor laser element which requires only a low operation current, it is important to reduce, even in an operation at a high temperature of 85 degrees Celsius, occurrence of reactive current (that is leakage current) leaking from an active layer from a p-type clad layer when electrons injected to the active layer are thermally excited.

In order to reduce occurrence of leakage current, it is effective to provide an electron barrier layer having a band gap energy higher than that of a p-type clad layer between the p-type clad layer and an active layer, as indicated in Patent Literature 1 (Japanese Unexamined Patent Application Publication No. 2002-270971) and Patent Literature 2 (International Publication No. 2017/195502). Such a configuration makes it possible to reduce occurrence of leakage current because it is difficult for electrons injected to the active layer, even when thermally excited, to go beyond the electron barrier layer having the high band gap energy.

For example, a structure of the semiconductor light emitting element disclosed in Patent Literature 1 is described with reference to FIG. 33. FIG. 33 is a schematic diagram illustrating a layer structure of a semiconductor light emitting element disclosed in Patent Literature 1. Each of the structural diagram (a) and graph (b) in FIG. 33 illustrates a stacking structure and a band structure of the semiconductor light emitting element disclosed in Patent Literature 1. As illustrated in FIG. 33, in the semiconductor light emitting element disclosed in Patent Literature 1, active layer 212 is sandwiched between n-type layer 211 and p-type layer 213. Between active layer 212 and upper clad layer 230, p-side electron confinement layer 228 is disposed. The p-side electron confinement layer 228 corresponds to the electron barrier layer having the band gap energy higher than that of upper clad layer 230. With this configuration, electrons injected to active layer 212, even in an operation at a high temperature, less leak to upper clad layer 230 because of an energy barrier of p-side electron confinement layer 228 including AlGaN.

Next, the semiconductor light emitting element disclosed in Patent Literature 2 is described with reference to FIG. 34. FIG. 34 is a schematic diagram illustrating a band structure distribution of the semiconductor light emitting element disclosed in Patent Literature 2. As illustrated in FIG. 34, Patent Literature 2 gradually changes an Al composition ratio at one of the interfaces of electron barrier layer 418 including AlGaN, specifically, the interface at the side of active layer 415. In this way, a polarization field formed at the interface is dispersed in a region in which Al composition ratios vary to reduce change in band structure because of the polarization field of electron barrier layer 418, thereby reducing voltages required for operations.

Here, when the Al composition ratio in a region which is of the electron barrier layer and at an n-type clad layer side is gradually increased from the active layer side toward the p-type clad layer side, it becomes possible to gradually change the polarization field and the band gap. At this time, when it is possible to cancel change in band structure of the valence band because of the polarization field and change in band gap energy, it becomes possible to increase the energy barrier against electrons while reducing increase in the energy barrier against holes in the electron barrier layer.

However, although it is possible to obtain the effect of increasing the energy barrier against holes in the electron barrier layer and the effect of increasing the energy barrier against electrons, the effect of voltage reduction is insufficient.

As described above, super high-output semiconductor blue laser elements capable of operating in long periods that are several thousand hours or more even when Watt-class high-output operations are performed at a temperature of 85 degrees Celsius have been desired for on-vehicle head light sources. Thus, there is a need to reduce electric power to be consumed by the super high-output semiconductor blue laser elements. For this reason, there is a need to reduce waveguide losses, leakage currents, and operation voltages at the same time.

SUMMARY

The present disclosure has been made to solve the above problem, and has an object to provide a semiconductor light emitting element that consumes only low power even in an operation at a high temperature.

A semiconductor light emitting element according to an aspect of the present disclosure includes: a GaN substrate; a first semiconductor layer located above the GaN substrate and including a nitride semiconductor of a first conductivity type; an active layer located above the first semiconductor layer and including a nitride semiconductor including Ga or In; an electron barrier layer located above the active layer and including a nitride semiconductor including at least Al;

and a second semiconductor layer located above the electron barrier layer and including a nitride semiconductor of a second conductivity type different from the first conductivity type. The electron barrier layer includes: a first region in which an Al composition ratio changes at a first change rate in a stacking direction perpendicular to a main surface of the GaN substrate; and a second region which is disposed between the first region and the second semiconductor layer and in which an Al composition ratio changes at a second change rate in the stacking direction. In the first region and the second region, the Al composition ratio monotonically increases at the first change rate in the direction from the active layer toward second semiconductor layer, and the second change rate is larger than the first change rate in the direction from the active layer toward second semiconductor layer.

According to the present disclosure, the surface density of polarization charges formed in the electron barrier layer increases in the stacking direction from the active layer side, which can be shown in a graph with a linear change having a small gradient to a linear change having a large gradient. In this case, the magnitude of the polarization charges is proportional to the change rate of the surface density of the polarization charges, and thus positive polarization charges having a magnitude that increases in two levels in the stacking direction from the active layer side in the electron barrier layer.

As a result, the surface density of the positive polarization charges that occur at the interface which is of the electron barrier layer and at the side of the active layer decreases. At this time, electrons are guided to the interface at the side of the active layer to satisfy an electrical neutrality condition. Since the density of positive polarization charges in a region which is in the electron barrier layer and in the vicinity of the active layer is small, and thus the concentration of electrons electrically guided to the interface is also small.

For this reason, decrease in the band potential due to the influence of electrons occurred at the interface of the electron barrier layer at the side of the active layer is reduced, the potential barrier against holes to be formed in the valence band becomes small, and the potential barrier against electrons to be formed in the conduction band increases.

This results in increase in the effect of reducing, in a high-output operation at a high temperature, a phenomenon (that is, electron overflow) in which electrons are thermally excited, go beyond the electron barrier layer, and leak to the second semiconductor layer.

As a result, it is possible to implement a semiconductor light emitting element which operates at a lower operation voltage and generates a smaller leakage current, compared with the conventional electron barrier layer. In addition, as a result of reduction in self-heating of the semiconductor light emitting element, it becomes possible to obtain a semiconductor light emitting element which consumes only low power even in an operation at a high temperature.

According to the present disclosure, it is possible to provide a semiconductor light emitting element that consumes only low power even in an operation at a high temperature.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

FIG. 23 is a schematic diagram illustrating an aspect of impurity doping according to Embodiment 2;

DETAILED DESCRIPTION OF THE EMBODIMENTS

Hereinafter, embodiments according to the present disclosure are described with reference to the drawings. It is to be noted that each of the embodiments described below indicates a specific example of the present disclosure. Accordingly, the numerical values, shapes, materials, constituent elements, the arrangement and connection of the constituent elements, etc. indicated in the following embodiments are mere examples, and therefore do not limit the scope of the present disclosure. Therefore, among the constituent elements in the following embodiments, constituent elements not recited in the independent claim that defines the most generic concept of the present disclosure are described as optional constituent elements.

It is to be noted that each of the drawings is a schematic diagram, and is not necessarily illustrated precisely. Accordingly, scales, etc. in the respective diagrams are not always the same. In addition, in each of the drawings, substantially the same constituent elements are assigned with the same numerical signs, and overlapping descriptions are omitted or simplified.

In addition, in this Specification, the terms "above" and "below" are used as terms which do not indicate the upper direction (perpendicularly upper direction) and the lower direction (perpendicularly lower direction) in absolute spatial recognition and which are defined by the relative positional relationships based on the stacking orders in the respective stacking structures. In addition, the terms "above" and "below" are also used not only when two constituent elements are arranged apart from each other and another constituent element is present between the two constituent elements but also when two constituent elements are arranged in contact with each other.

Embodiment 1

[1-1. Overall Configuration]

Figure 1A:
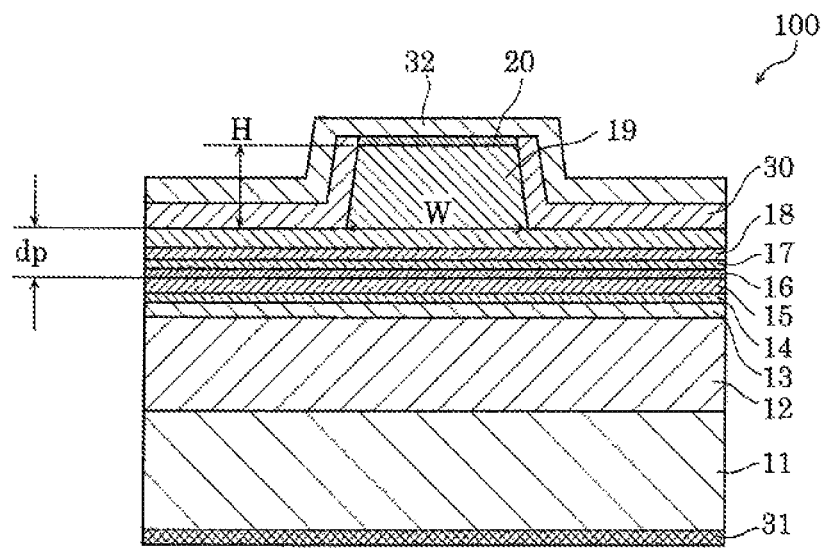
FIG. 1A is a schematic cross-sectional diagram illustrating a schematic configuration of a semiconductor light emitting element according to Embodiment 1.

An overall configuration of a semiconductor light emitting element according to Embodiment 1 is described with reference to FIG. 1A. FIG. 1A is a schematic cross-sectional diagram illustrating a schematic configuration of semiconductor light emitting element 100 according to this embodiment. Semiconductor light emitting element 100 according to this embodiment is a nitride semiconductor laser element. FIG. 1A illustrates a cross section perpendicular to the resonance direction of semiconductor light emitting element 100.

As illustrated in FIG. 1A, semiconductor light emitting element 100 includes GaN substrate 11, first semiconductor layer 12, active layer 15, electron barrier layer 18, and second semiconductor layer 19. In this embodiment, semiconductor light emitting element 100 further includes first light guide layer 13, second light guide layer 14, third light guide layer 16, intermediate layer 17, contact layer 20, current block layer 30, n-side electrode 31, and p-side electrode 32.

First semiconductor layer 12 is a layer disposed above GaN substrate 11 and including a nitride semiconductor of a first conductivity type. In this embodiment, the first conductivity type is n-type. First semiconductor layer 12 includes an n-type AlGaN layer having a film thickness of 1.5 μm.

First light guide layer 13 is a semiconductor layer of the first conductivity type which is disposed above first semiconductor layer 12, includes n-type GaN, and has a film thickness of 100 nm.

Second light guide layer 14 is a layer which is disposed above first light guide layer 13, includes InGaN, and has a film thickness of 180 nm.

Active layer 15 is a layer disposed above first semiconductor layer 12 and including a nitride semiconductor including Ga or In. In this embodiment, active layer 15 is disposed above second light guide layer 14 and including an undoped multi quantum well.

Third light guide layer 16 is a layer disposed above active layer 15, including an InGaN, and having a film thickness of 90 nm.

Intermediate layer 17 is a layer disposed between electron barrier layer 18 and active layer 15 and including a nitride semiconductor. In this embodiment, intermediate layer 17 is disposed between electron barrier layer 18 and third light guide layer 16, includes GaN of a second conductivity type, and has a film thickness of 3 nm. The second conductivity type is a conductivity type different from the first conductivity type, and is p-type in this embodiment.

Electron barrier layer 18 is a layer of the second conductivity type disposed above active layer 15 and including a nitride semiconductor including at least Al. In this embodiment, electron barrier layer 18 is disposed between intermediate layer 17 and second semiconductor layer 19 and includes p-type AlGaN.

Second semiconductor layer 19 is a semiconductor layer of the second conductivity type disposed above electron barrier layer 18, and including a nitride semiconductor of the second conductivity type. In this embodiment, second semiconductor layer 19 is a p-type AlGaN clad layer having a film thickness of 660 nm.

Contact layer 20 is a layer disposed above second semiconductor layer 19 and including a nitride semiconductor of the second conductivity type. In this embodiment, contact layer 20 includes p-type GaN, and has a film thickness of 0.05 μm.

Current block layer 30 is an insulation layer disposed above second semiconductor layer 19 and is transmissive with respect to light from active layer 15. In this embodiment, current block layer 30 includes $SiO_2$.

Here, n-side electrode 31 is a conductive layer disposed below GaN substrate 11. For example, n-side electrode 31 is a single-layer film or a multi-layer film formed to include at least one of Cr, Ti, Ni, Pd, Pt, and Au.

Here, p-side electrode 32 is a conductive layer disposed above contact layer 20. In this embodiment, p-side electrode 32 is disposed above contact layer 20 and current block layer 30. For example, p-side electrode 32 is a single-layer film or a multi-layer film formed to include at least one of Cr, Ti, Ni, Pd, Pt, and Au.

A ridge is formed on second semiconductor layer 19 of semiconductor light emitting element 100. In this embodiment, a ridge width W is approximately 30 μm. In addition, as illustrated in FIG. 1A, the distance between a ridge lowermost portion and the active layer is denoted as dp.

Here, in this embodiment, in order to confine light in the perpendicular direction (normal direction of the substrate) with respect to active layer 15, the Al composition ratio of first semiconductor layer 12 including an n-type AlGaN layer and second semiconductor layer 19 including a p-type AlGaN layer is set to 0.035 (3.5%). As a result, a refractive index of each of first semiconductor layer 12 and second semiconductor layer 19 is smaller than an effective refractive index of a light distribution which occurs in semiconductor light emitting element 100. Thus, each of first semiconductor layer 12 and second semiconductor layer 19 functions as a clad layer.

Increasing the Al composition ratio in each of first semiconductor layer 12 including n-type AlGaN and second semiconductor layer 19 including p-type AlGaN increases the refractive index difference between (i) active layer 15 and (ii) each of first semiconductor layer 12 and second semiconductor layer 19 which functions as the clad layer. This makes it possible to strongly confine light in the stacking direction of active layer 15 (the stacking direction is the direction perpendicular to a main surface of GaN substrate 11). This enables reduction in oscillation threshold current value. However, excessive increase in the Al composition ratio in each of first semiconductor layer 12 and second semiconductor layer 19 including AlGaN generates lattice defects that result in decrease in reliability due to the difference in thermal expansion coefficient between the AlGaN layer and the GaN substrate. Accordingly, in this embodiment, the Al composition ratio of each of first semiconductor layer 12 and second semiconductor layer 19 is set to 0.05 (that is, 5%) or less.

Figure 1B:
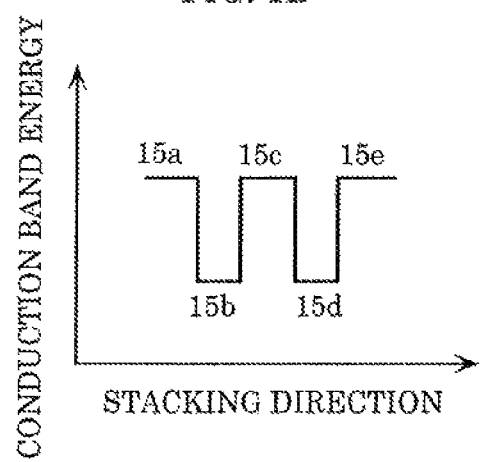
FIG. 1B is a graph showing a conduction band energy distribution in a stacking direction of an active layer according to Embodiment 1.

Next, active layer 15 according to this embodiment is described with reference to FIG. 1B. FIG. 1B is a graph showing a conduction band energy distribution in a stacking direction of active layer 15 according to this embodiment. As illustrated in FIG. 1B, in order to obtain a laser oscillation of a wavelength of 450 nm, active layer 15 has a double quantum well (DQW) structure including two well layers 15b and 15d each having a film thickness of 3 nm and including InGaN having an In composition ratio of 0.16 (that is, 16%). Barrier layers 15a, 15c, and 15e having film thicknesses of 7 nm, 7 nm, and 5 nm, respectively, and includes InGaN having an In composition ratio of 0.04 (that is, 4%). In order to obtain oscillation laser light having a 450 nm band, each of the well layers needs to have a high In composition ratio of 15% or more. In this case, a lattice mismatch between each of the well layers and GaN substrate 11 is 1.7% or more, and thus increasing the film thicknesses inevitably causes lattice defects. Decreasing the film thicknesses reduces light confinement coefficients in the staking direction to the well layers. This increases an oscillation threshold value and an operation carrier density, which results in increase in leakage current in an operation at a high temperature. Accordingly, in this embodiment, the film thickness of each well layer is, for example, in a range from 2.7 nm to 3.3 nm, inclusive.

In addition, second light guide layer 14 and third light guide layer 16 are layers formed to include In so as to have a refractive index higher than those of first semiconductor layer 12 including n-type AlGaN and second semiconductor layer 19 including p-type AlGaN layer. In this way, it is possible to increase the effective refractive index in the distribution of light which propagates in a waveguide corresponding to the ridge, and to increase the light confinement effect in the stacking direction in the light distribution by first semiconductor layer 12 and second semiconductor layer 19.

Here, a small In composition ratio of each of second light guide layer 14 and third light guide layer 16 leads to less light confinement in the perpendicular direction to each well layer. This increases an oscillation threshold value and an operation carrier density. This results in increase in leakage current in an operation at a high temperature. A large In composition ratio of each of second light guide layer 14 and third light guide layer 16 increases lattice mismatches with GaN substrate 11, which increases a possibility that lattice defects occur. For this reason, in order to increase the light confinement coefficients in the perpendicular direction to each well layer without causing lattice defects, in this embodiment, the In composition ratio of each of second light guide layer 14 and third light guide layer 16 is, for example, in a range from 0.03 (that is, 3%) to 0.06 (that is, 6%), inclusive. In this embodiment, forming second light guide layer 14 and third light guide layer 16 to have an In composition ratio of 0.03 (that is, 3%) balances the reduction in occurrence of lattice defects and increase in the light confinement coefficient in the perpendicular direction to each well layer.

In addition, first light guide layer 13 is a GaN layer which has a lattice constant the value of which is between the values of lattice constants of first semiconductor layer 12 and second light guide layer 14, and has a band gap energy the magnitude of which is between that of the band gap energy of each of first semiconductor layer 12 and second light guide layer 14. As a result, compared with the case in which second light guide layer 14 is formed directly on first semiconductor layer 12 including AlGaN, it is possible to prevent the band structure from changing to a spike-shaped band structure due to polarization charges that occur at the interface, and to facilitate conduction of electrons to active layer 15.

In addition, intermediate layer 17 is a GaN layer which has a lattice constant the value of which is between the lattice constants of electron barrier layer 18 and light guide layer 16, and has a band gap energy the magnitude of which is between the band gap energy of electron barrier layer 18 and the band gap energy of third light guide layer 16.

In addition, forming second light guide layer 14, active layer 15, and third light guide layer 16 having a compressive lattice strain including In and forming an AlGaN layer having a tractive lattice strain on the former layers increase stress that occurs at the interface, which may cause crystal defects. Forming intermediate layer 17 to include a GaN layer having a film thickness of 3 nm enables reduction in stress at the interface.

In addition, excessively thick intermediate layer 17 makes second semiconductor layer 19 having a low refractive index apart from active layer 15, which weakens light confinement effect in the stacking direction to active layer 15. For this reason, intermediate layer 17 is formed to have a film thickness of as thin as 10 nm or less. In the semiconductor light emitting element according to this embodiment, intermediate layer 17 is formed to have a film thickness of 3 nm.

In addition, current block layer 30 which is a dielectric including $SiO_2$ and having a film thickness of 0.1 µm is formed on the side surface of the ridge. In this structure, current injected from contact layer 20 is confined only to the ridge portion by current block layer 30, and thus the current is injected dominantly on the region located below the bottom portion of the ridge in active layer 15. In this way, population inversion state necessary for laser oscillation is produced by injecting current of approximately several hundred mA. Light generated by recombination of carriers including electrons injected to active layer 15 and holes is confined, in the stacking direction of active layer 15, by second light guide layer 14, third light guide layer 16, first semiconductor layer 12, and second semiconductor layer 19. As for the direction parallel to active layer 15 (the direction is perpendicular to the stacking direction, and is hereinafter referred to as a horizontal direction), current block layer 30 has a refractive index lower than the refractive indices of first semiconductor layer 12 and second semiconductor layer 19, thus it is possible to confine light. In addition, current block layer 30 has a small light absorption of oscillation laser light, and thus it is possible to produce a low-loss waveguide. In addition, light that propagates in the waveguide can leak largely to current block layer 30, and thus it is possible to precisely obtain ΔN of $10^{-3}$ order suitable for a high-output operation (ΔN denotes the difference in effective refractive index in the stacking direction inside and outside the ridge). Furthermore, it is possible to precisely control the refractive index difference in the same $10^{-3}$ order according to the distance (dp) between current block layer 30 and active layer 15. For this reason, it is possible to obtain semiconductor light emitting element 100 which only consumes low current in operation while precisely controlling a light distribution. In this embodiment, light confinement in the horizontal direction is performed by controlling ΔN to be $4.8 \times 10^{-3}$.

Electron barrier layer 18 is formed on intermediate layer 17 including p-type GaN, and has a band gap energy the magnitude of which is larger than that of second semiconductor layer 19 including p-type AlGaN. By making such settings, it is possible to increase the potential of the conduction band of electron barrier layer 18 to form an energy barrier. As a result, it is possible to reduce a leakage phenomenon (that is, electron overflow) in which the electrons injected to active layer 15 are thermally excited and leak to second semiconductor layer 19, thereby increasing operation characteristics of semiconductor light emitting element 100 at a high temperature.

Here, the band gap energy of a layer including AlGaN becomes larger in proportion to the Al composition ratio. Accordingly, in this embodiment, the Al composition ratio of electron barrier layer 18 is higher than the Al composition ratio of second semiconductor layer 19 including p-type AlGaN. Examples of the Al composition ratio of electron barrier layer 18 include 0.15 (that is, 15%).

In this embodiment, among layers directly on third light guide layer 16 including InGaN, the region which does not include Al is intermediate layer 17. Among the regions including Al above intermediate layer 17, the region below second semiconductor layer 19 is electron barrier layer 18. In electron barrier layer 18, the Al composition ratio gradually increases from the lower part to the upper part, and reaches a maximum value of 15% or more. In electron barrier layer 18, the Al composition ratio decreases from the position at which the maximum value is obtained toward the further upper part, and matches the Al composition ratio of second semiconductor layer 19 at the interface at the side of second semiconductor layer 19.

The distribution shape of the Al composition ratios of electron barrier layer 18 is described in detail later.

[1-2. Configuration of Electron Barrier Layer in Comparison Example]

Figure 2:
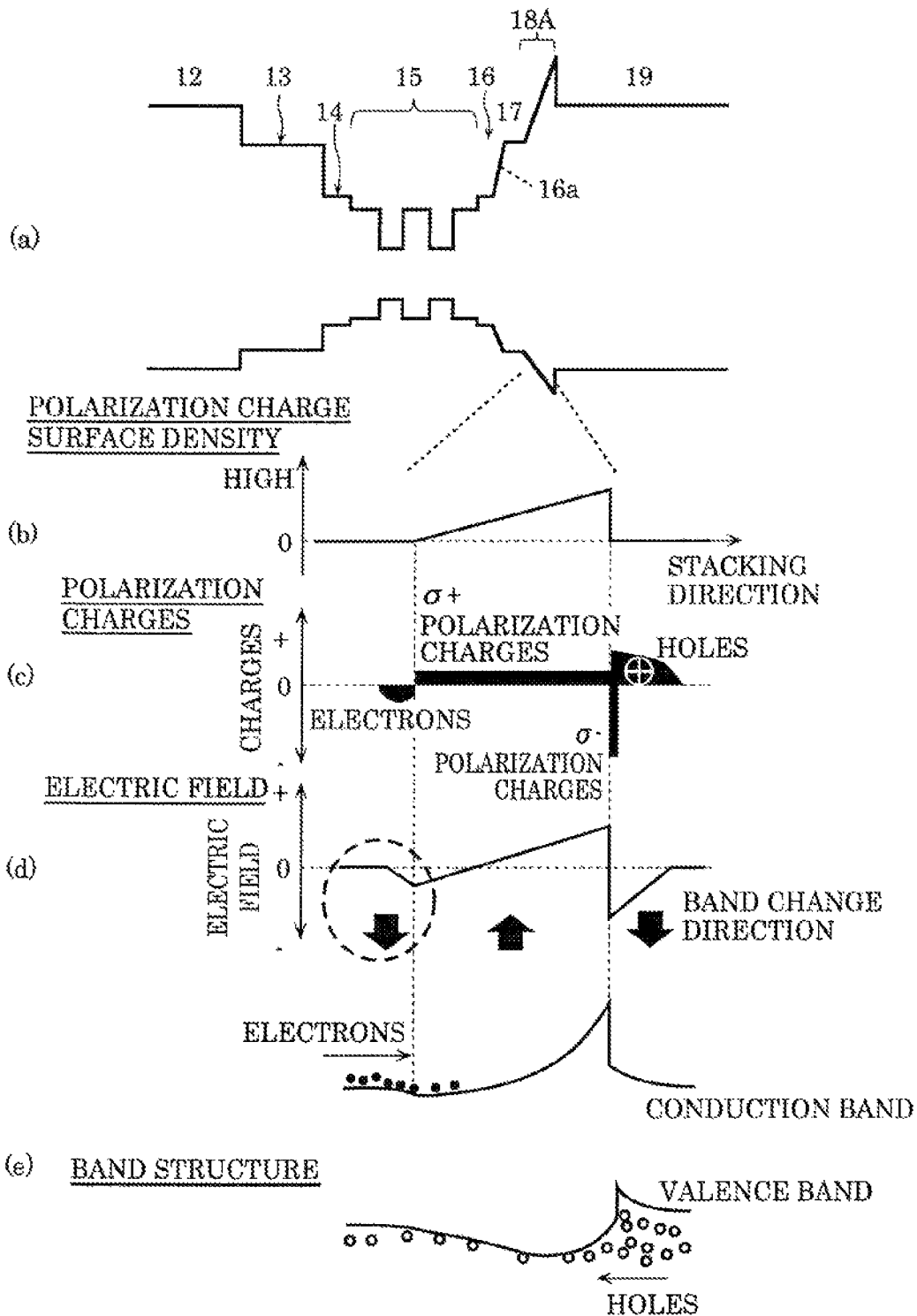
FIG. 2 is a schematic diagram illustrating a configuration of an electron barrier layer of a semiconductor light emitting element according to Comparison Example 1.

Next, prior to the description of effects and advantages of electron barrier layer 18 according to this embodiment, the configuration of the electron barrier layer according to a comparison example is described with reference to FIG. 2. FIG. 2 is a schematic diagram illustrating a configuration of electron barrier layer 18A of a semiconductor light emitting element according to Comparison Example 1. Schematic diagrams (a), (b), (c), (d), and (e) illustrate a band structure distribution of the semiconductor light emitting element according to Comparison Example 1, a polarization charge surface density distribution of electron barrier layer 18A, a polarization charge distribution, and an electric field distribution, and a band structure, respectively.

The semiconductor light emitting element according to Comparison Example 1 is different from semiconductor light emitting element 100 according to this embodiment in the Al composition ratio distribution of electron barrier layer 18A. As illustrated in schematic diagram (a) in FIG. 2, the Al composition ratio of electron barrier layer 18A according to Comparison Example 1 linearly increases from active layer 15 toward a second semiconductor layer 19 side. As illustrated in schematic diagram (a) in FIG. 2, it is to be noted that the semiconductor light emitting element according to Comparison Example 1 is the same as semiconductor light emitting element 100 according to this embodiment in that third light guide layer 16 includes composition ratio gradient region 16a.

The polarization charge surface density formed in the nitride semiconductor depends on a sum of (i) piezo polarization components due to a strain in a constituent layer and (ii) natural polarization components determined by an atom composition. Accordingly, the surface density of polarization charges that are generated in each layer is the sum of (i) the piezo polarization components due to the strain and (ii) the natural polarization components. Each of the magnitude of the strain and the magnitude of natural polarization that are generated in each layer is proportional to the atom composition. For this reason, the surface density of the polarization charges formed in the AlGaN layer is proportional to the Al composition ratio of the AlGaN layer. Accordingly, the surface density of polarization charges formed in electron barrier layer 18A in Comparison Example 1 in which the Al composition ratio increases linearly as illustrated in schematic diagram (b) in FIG. 2.

In this case, the magnitude of the polarization charges is proportional to a change rate in surface density of polarization charges, and thus the amount of polarization charges to be formed is constant within electron barrier layer 18A as illustrated in schematic diagram (c) in FIG. 2.

Positive polarization charges are formed in a region which is in electron barrier layer 18A and at the side of active layer 15, and negative polarization charges are formed in a region which is in electron barrier layer 18A and at the interface distant from active layer 15 among the interfaces of electron barrier layer 18A. As a result, as illustrated in schematic diagram (c) of FIG. 2, opposite-polarity carriers are induced to both interfaces of electron barrier layer 18A in order to satisfy an electrical neutrality condition, and the concentration of electrons to be induced is comparatively small because the positive polarization charge density within electron barrier layer 18A is comparatively small. For example, the density of electrons induced to the interfaces is comparatively small in Comparison Example 1 with respect to the density in the case where the electron barrier layer has a uniform Al composition ratio.

For example, as illustrated in schematic diagram (d) in FIG. 2, a negative electric field is generated due to electrons generated at one of the interfaces of electron barrier layer 18A, specifically the interface at the side of active layer 15. Since the electron density is small, it is possible to reduce decrease in potential at the interface which is of electron barrier layer 18A and in contact with active layer 15 as illustrated in schematic diagram (e) in FIG. 2. In addition, the Al composition ratio and a band gap energy of a region which is in electron barrier layer 18A and at the side of active layer 15 are small. For this reason, it is possible to reduce a potential barrier to be formed at a valence band against holes at the side of active layer 15.

[1-3. Configuration of Electron Barrier Layer According to Embodiment 1]

Figure 3:
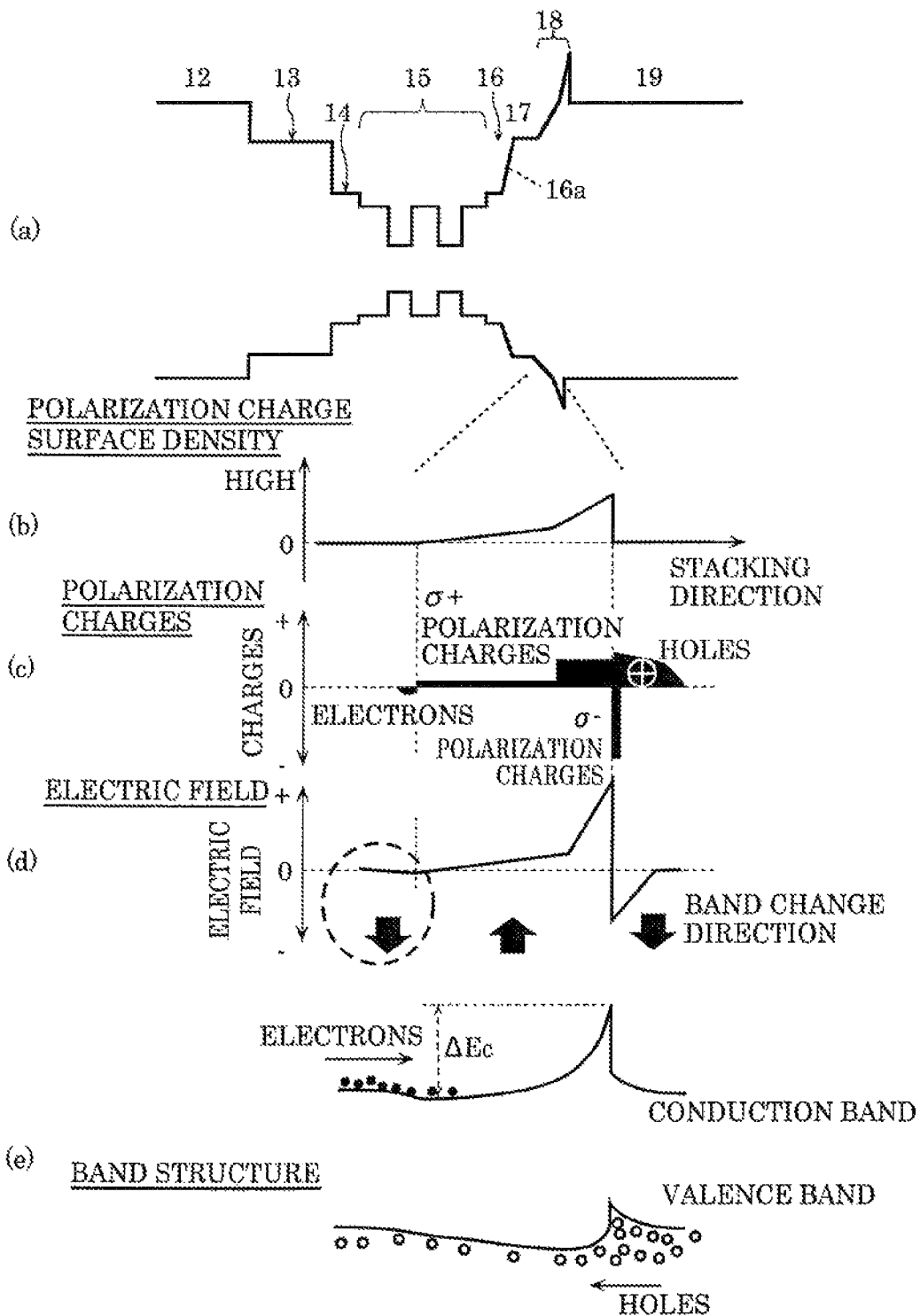
FIG. 3 is a schematic diagram illustrating a configuration of an electron barrier layer of the semiconductor light emitting element according to Embodiment 1.

Next, a configuration of electron barrier layer 18 of semiconductor light emitting element 100 according to this embodiment is described with reference to FIG. 3. FIG. 3 is a schematic diagram illustrating a configuration of electron barrier layer 18 of semiconductor light emitting element 100 according to this embodiment. Schematic diagrams (a), (b), (c), (d), and (e) illustrate a band structure distribution of semiconductor light emitting element 100 according to this embodiment, a polarization charge surface density distribution of electron barrier layer 18, a polarization charge distribution, and an electric field distribution, and a band structure, respectively.

In semiconductor light emitting element 100 according to this embodiment, electron barrier layer 18 includes a first region having a small Al composition ratio change rate and a second region having a large Al composition ratio change rate, in order from the active layer 15 side.

For this reason, as illustrated in schematic diagram (b) in FIG. 3, the surface density distribution of polarization charges formed in electron barrier layer 18 includes a region having a comparatively small change gradient and a region having a comparatively large change gradient.

In this case, the magnitude of polarization charges is proportional to the change rate of polarization charge surface density. Thus, as illustrated in schematic diagram (c) in FIG. 3, the magnitude of the polarization charges is smaller at the side of active layer 15 than the magnitude of polarization charges illustrated in schematic diagram (c) in FIG. 2. In addition, in this embodiment, the magnitude of polarization charges changes in two steps according to the positions in the stacking direction.

Positive polarization charges are formed in a region which is in electron barrier layer 18 and at the side of active layer 15, and negative polarization charges are formed in a region which is in electron barrier layer 18 and at the interface distant from active layer 15 among the interfaces of electron barrier layer 18. As a result, as illustrated in schematic diagram (c) in FIG. 3, opposite-polarity carriers are induced to both interfaces of electron barrier layer 18 in order to satisfy an electrical neutrality condition. In this embodiment, since the positive polarization charge density in the region which is in electron barrier layer 18 and at the side of active layer 15 is small, the electron concentration is smaller than the electron concentration in the case illustrated in schematic diagram (c) in FIG. 2.

For this reason, as illustrated in schematic diagram (d) in FIG. 3, a negative electric field is generated due to electrons induced to one of the interfaces of electron barrier layer 18, specifically, the interface at the side of active layer 15, the electron density is smaller than the one in Comparison Example 1. Accordingly, as illustrated in schematic diagram (e) in FIG. 3, the amount of decrease in potential at the interface which is of electron barrier layer 18 and in contact with active layer 15 reduces. In addition, the Al composition ratio and a band gap energy of a region which is in electron barrier layer 18 and at the side of active layer 15 are small. For this reason, the potential barrier formed in the valence band against holes at the side of active layer 15 is further smaller than the potential barrier in Comparison Example 1 illustrated in FIG. 2. Accordingly, an operation voltage in the semiconductor light emitting element according to this embodiment is further smaller.

In addition, as illustrated in schematic diagram (d) of FIG. 3, since the electric field at one of the interfaces of electron barrier layer 18, specifically the interface at the side of active layer 15 is small, reduction in potential of electron barrier layer 18 at the side of active layer 15 is small, and a potential barrier ($\Delta Ec$ in FIG. 3) of electron barrier layer 18 against electrons becomes large. This increases an effect of reducing, in a high-output operation at a high temperature, the phenomenon (that is, electron overflow) in which the electrons are thermally excited, go beyond electron barrier layer 18, and leak to the second semiconductor layer. As a result, it is possible to implement semiconductor light emitting element 100 which operates with a lower operation voltage and a smaller leakage current, compared with the conventional electron barrier layer. In addition, as a result of reduction in self-heating of the semiconductor light emitting element, it becomes possible to obtain a semiconductor light emitting element which consumes only low power even in an operation at a high temperature. More specifically, it is possible to implement a super high-output semiconductor blue laser element capable of operating in a long period of several thousands of hours even when a Watt-class high-output operation is performed at a high temperature of 85 degrees Celsius.

Figure 4A:
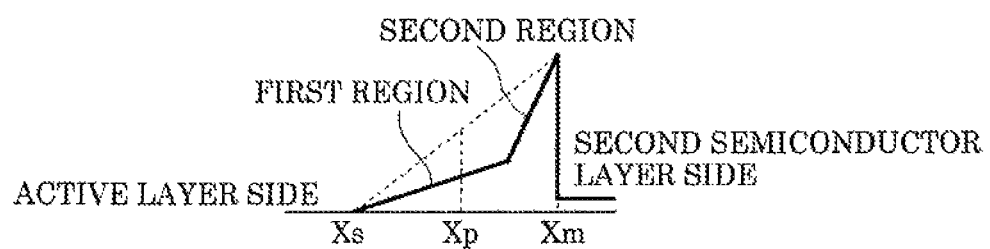
FIG. 4A is a schematic diagram illustrating a first example of a band gap energy distribution in the stacking direction of the electron barrier layer of the semiconductor light emitting element according to Embodiment 1.
Figure 4B:
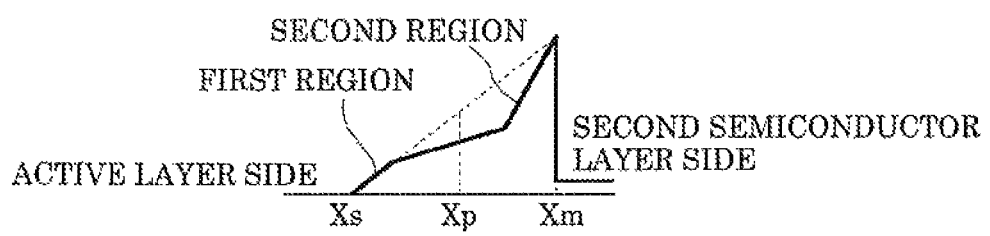
FIG. 4B is a schematic diagram illustrating a second example of a band gap energy distribution in the stacking direction of the electron barrier layer of the semiconductor light emitting element according to Embodiment 1.

Next, an example of a band gap energy distribution in the stacking direction of electron barrier layer 18 of semiconductor light emitting element 100 according to this embodiment is explained with reference to FIGS. 4A and 4B. FIGS. 4A and 4B are schematic diagrams respectively indicating a first example and a second example of band gap energy distributions in the stacking direction of electron barrier layer 18 of semiconductor light emitting element 100 according to this embodiment.

FIG. 4A illustrates a band gap energy distribution in the case where a first region having a small Al composition ratio change rate and a second region having an Al composition ratio change rate larger than that of the first region are in contact with each other. FIG. 4B illustrates a band gap energy distribution in the case where a region having an Al composition ratio change rate smaller than that of the first region having the small Al composition ratio change rate is disposed between the first region and the second region having the Al composition ratio change rate larger than that of the first region.

In any cases illustrated in FIGS. 4A and 4B, in midpoint x=Xp between position x=Xs at the interface which is of electron barrier layer 18 and at the active layer side and position x=Xm at which the largest Al composition ratio is reached in electron barrier layer 18, the Al composition ratio is a value smaller than an average value of the Al composition ratio at position x=Xs and the Al composition ratio at position x=Xm. Furthermore, in the region from position x=Xs to position x=Xm, the magnitude of the Al composition ratio in electron barrier layer 18 is smaller than or equal to the magnitude of a dotted line that connects the Al composition ratio at position x=Xs and the Al composition ratio at position x=Xm in FIGS. 4A and 4B. For this reason, the Al composition ratio change rate of the region between position x=Xs and position x=Xp in electron barrier layer 18 becomes a value smaller than or equal to the change rate indicated by the dotted line.

In addition, in the structure illustrated in FIG. 4B, the Al composition ratio change rate in the first region in which formation of electron barrier layer 18 is started is increased over the Al composition ratio change rate in the region to be formed later. This provides an effect of increasing controllability of the position of the interface which is of electron barrier layer 18 and at the side of active layer 15, that is, the position at which the formation of electron barrier layer 18 is started, and increasing the stability in reproducibility of operation characteristics of semiconductor light emitting element 100.

As described above, in this embodiment, electron barrier layer 18 includes: the first region in which the Al composition ratio changes at a first change rate in the stacking direction perpendicular to the main surface of GaN substrate 11; and the second region which is disposed between the first region and second semiconductor layer 19 and in which the Al composition ratio changes at a second change rate in the stacking direction. In the first region and the second region, the Al composition ratio monotonically increases at the first change rate in the direction from active layer 15 toward second semiconductor layer, and the second change rate is larger than the first change rate in the direction from active layer 15 toward second semiconductor layer.

In this way, it is possible to reduce the influence of the magnitude of polarization charges onto one of the interfaces of electron barrier layer 18, specifically the interface at the side of active layer 15 to be smaller than the influence onto the electron barrier layer having the Al composition ratio distribution indicated by the dotted line in each of FIGS. 4A and 4B. As a result, a decrease in potential of the band structure at the interface of electron barrier layer 18 at the side of active layer 15 becomes smaller than a decrease in potential in the structure indicated by the dotted line, which increases potential barrier $\Delta Ec$. Furthermore, since it is possible to reduce a band barrier against holes in a valence band, it is possible to reduce an operation voltage of semiconductor light emitting element 100. With this, it becomes possible to increase temperature characteristics of semiconductor light emitting element 100. Accordingly, it is possible to implement semiconductor light emitting element 100 which consumes low power even in an operation at a high temperature.

Next, an example of a band gap energy distribution in the stacking direction of electron barrier layer 18 of semiconductor light emitting element 100 according to this embodiment is explained with reference to FIGS. 5A to 5D.

FIGS. 5A to 5D are schematic diagrams respectively indicating a third example to a sixth example of band gap energy distributions in the stacking direction of electron barrier layer 18 of semiconductor light emitting element 100 according to this embodiment.

Figure 5A:
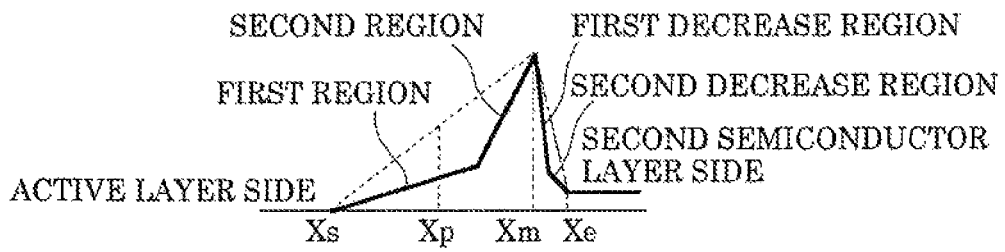
FIG. 5A is a schematic diagram illustrating a third example of a band gap energy distribution in the stacking direction of the electron barrier layer of the semiconductor light emitting element according to Embodiment 1.

FIG. 5A illustrates a band gap energy distribution in the case where a first region having a small Al composition ratio change rate and a second region having an Al composition ratio change rate larger than that of the first region are in contact with each other. Furthermore, the Al composition ratio decreases with closeness from the position at which the Al composition ratio is largest toward second semiconductor layer 19. A first decrease region having a large Al composition ratio decrease rate and a second decrease region having an Al composition ratio smaller than that of the first decrease region are arranged in order from the side of active layer 15.

Figure 5B:
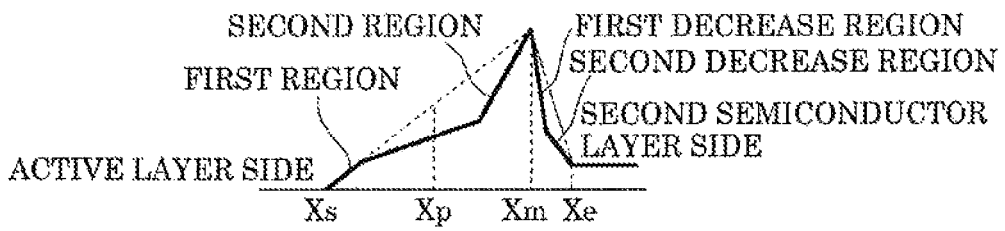
FIG. 5B is a schematic diagram illustrating a fourth example of a band gap energy distribution in the stacking direction of the electron barrier layer of the semiconductor light emitting element according to Embodiment 1.

FIG. 5B illustrates a band gap energy in the case where a region having an Al composition ratio change rate smaller than that of the first region having the smaller Al composition ratio change rate is formed between the first region and the second region having a comparatively large Al composition ratio change rate. Furthermore, the Al composition ratio decreases with closeness from the position at which the Al composition ratio is largest toward second semiconductor layer 19. A first decrease region having a large Al composition ratio decrease rate and a second decrease region having an Al composition ratio smaller than that of the first decrease region are arranged in order from the side of active layer 15.

Figure 5C:
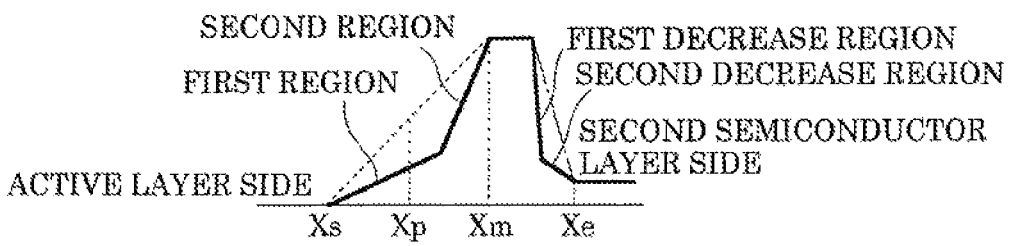
FIG. 5C is a schematic diagram illustrating a fifth example of a band gap energy distribution in the stacking direction of the electron barrier layer of the semiconductor light emitting element according to Embodiment 1.

FIG. 5C illustrates a band gap energy distribution in the case where a first region having a small Al composition ratio change rate and a second region having an Al composition ratio change rate larger than that of the first region are in contact with each other. Furthermore, a constant region having a constant Al composition ratio from the point at which the Al composition ratio is largest, a first decrease region having a large Al composition ratio change rate, and a second decrease region having an Al composition ratio change rate smaller than that of the first decrease region are arranged in order from the side of active layer 15.

Figure 5D:
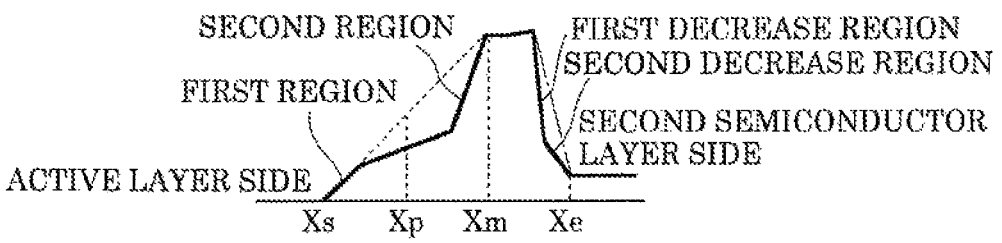
FIG. 5D is a schematic diagram illustrating a sixth example of a band gap energy distribution in the stacking direction of the electron barrier layer of the semiconductor light emitting element according to Embodiment 1.

FIG. 5D illustrates a band gap energy distribution in the case where a region having an Al composition ratio change rate smaller than that of the first region having the small Al composition ratio change rate is disposed between the first region and the second region having the Al composition ratio change rate larger than that of the first region. Furthermore, a constant region having a constant Al composition ratio from the point at which the Al composition ratio is largest, a first decrease region having a large Al composition ratio change rate, and a second decrease region having an Al composition ratio change rate smaller than that of the first decrease region are arranged in order from the side of active layer 15.

In any of the cases illustrated in FIGS. 5A to 5D, midpoint x=Xp between position x=Xs at which formation of electron barrier layer 18 is started and position x=Xm at which the largest Al composition ratio is reached, the Al composition ratio is a value smaller than an average value of the Al composition ratio at position x=Xs and the Al composition ratio at position x=Xm. Furthermore, in the region from position x=Xs to position x=Xm, the magnitude of the Al composition ratio in electron barrier layer 18 is smaller than or equal to the magnitude of a range below a dotted line that connects the Al composition ratio at position x=Xs and the Al composition ratio at position x=Xm in each of FIGS. 5A to 5D. For this reason, in each of FIGS. 5A to 5D, the Al composition ratio change rate of the region between position x=Xs and position x=Xp in electron barrier layer 18 indicated by the solid line becomes a value smaller than or equal to the change rate indicated by the dotted line.

In this way, in this embodiment, it is possible to reduce the influence of the magnitude of polarization charges onto the interface which is of electron barrier layer 18 and at the side of active layer 15 to be smaller than the influence onto the electron barrier layer having the Al composition ratio distribution indicated by the dotted line. As a result, a decrease in potential of the band structure at the interface of electron barrier layer 18 at the side of active layer 15 becomes smaller than the decrease obtainable by the structure indicated by the dotted line, which increases potential barrier ΔEc. Furthermore, since it is possible to reduce a valence band barrier against holes, it is possible to reduce an operation voltage of semiconductor light emitting element 100. With this, it becomes possible to increase temperature characteristics of semiconductor light emitting element 100.

In addition, electron barrier layer 18 includes, in order from active layer 15 side: a first decrease region in which the Al composition ratio decreases monotonically in a direction from position x=Xm toward second semiconductor layer 19; and a second decrease region in which the Al composition ratio decreases monotonically less than in the first decrease region in the direction from position x=Xm toward second semiconductor layer 19. For this reason, an average Al composition ratio becomes smaller in a region in which the Al composition ratio decreases more significantly than in a configuration showing a constant Al composition ratio decrease rate indicated by the dash-dot line in the drawings.

In addition, position x=Xe in electron barrier layer 18 at the side of second semiconductor layer 19 is the position at which an average Al composition ratio in second semiconductor layer 19 and the Al composition ratio in electron barrier layer 18 are the same in value. When second semiconductor layer 19 is formed with a super lattice of an AlGaN layer including two different kinds of materials including GaN having different Al composition ratios, position x=Xe means the position at which the average Al composition ratio in the stacking direction of second semiconductor layer 19 and the Al composition ratio in electron barrier layer 18 are the same.

Here, in AlGaN having a high Al composition ratio, the activation rate of Mg which is usually used as a dopant is low. For this reason, the AlGaN having the high Al composition ratio has a higher resistance than AlGaN having a low Al composition ratio. For this reason, in electron barrier layer 18, an increase in the film thickness of a region having a high Al composition ratio increases the film thickness of a region in which a potential barrier for inhibiting electrical conduction of holes toward active layer 15 in a valence band structure, which inhibits conduction of the holes. This increases an operation voltage. For this reason, it is excellent that a total of film thicknesses of the second decrease region and the first decrease region which are decrease regions where the Al composition ratio decreases in the direction of film growth is small as much as possible. The total film thickness is, for example, 4 nm or less. In addition, the total film thickness may be 2 nm or less.

In any cases illustrated in FIGS. 5A to 5D, an average Al composition ratio in a region in which the Al composition ratio decreases becomes smaller than an average Al composition ratio in a configuration showing a constant Al composition ratio decrease rate indicated by the dash-dot line in the diagram, which enables reduction in increase in operation voltage of semiconductor light emitting element 100.

In addition, in the example illustrated in each of FIGS. 5C and 5D, a region in which the Al composition ratio is constant is formed. The region is formed with consideration of variation in Al composition ratio in the same wafer surface at the time of manufacturing of semiconductor light emitting element 100. In this way, in electron barrier layer 18 in the same wafer surface, it is possible to obtain a constant largest Al composition ratio, and thus it is possible to increase uniformity in the wafer surface having a size enough to form potential barrier ΔE. However, excess increase in the film thickness of the region having the constant Al composition ratio increases the film thickness of the region to be formed to have a high Al composition ratio, which causes increase in operation voltage as described above. For this reason, it is excellent to form the region having the constant Al composition ratio which is thinner as much as possible. The film thickness of the region having the constant Al composition ratio is, for example, 2 nm or less. In addition, the film thickness of the region having the constant Al composition ratio may be 1 nm or less.

Figure 6:
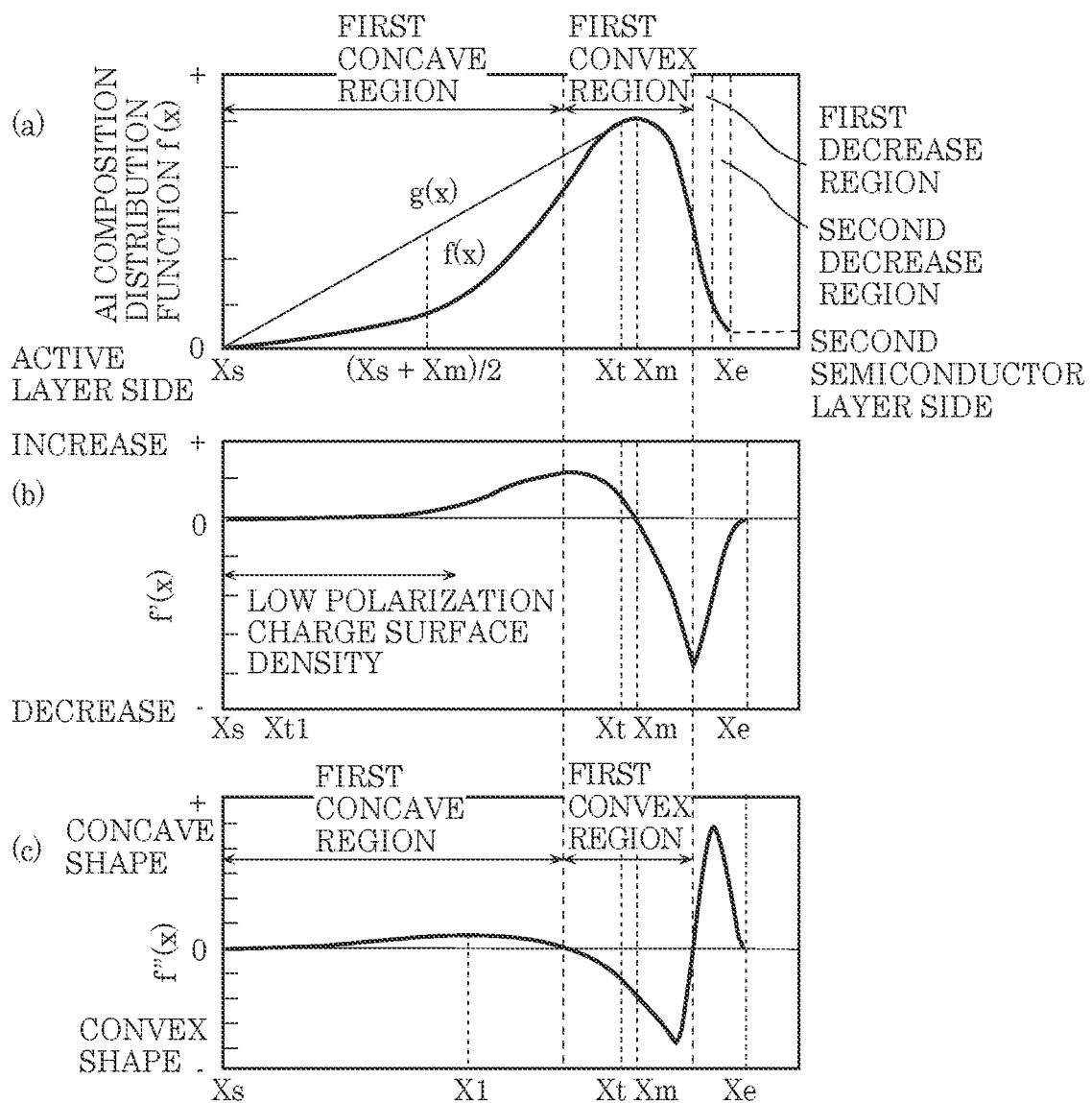
FIG. 6 is a diagram illustrating one example of an Al composition ratio in the stacking direction of the electron barrier layer according to Embodiment 1.

Although the case in which the Al composition ratio distribution of electron barrier layer 18 is represented by a plurality of linear lines is described above, a case in which an Al composition ratio distribution is represented by function f(x) which is not limited to a linear line is described with reference to FIG. 6. It is to be noted here that the stacking direction perpendicular to the main surface of GaN substrate 11 is assumed to be an x-axis direction. FIG. 6 includes diagrams each illustrating one example of an Al composition ratio distribution in the stacking direction of electron barrier layer 18 according to this embodiment. In FIG. 6, graph (a) is a graph showing function f(x) indicating an Al composition ratio distribution. In FIG. 6, graphs (b) and (c) are graphs showing first derivative f'(x) and second derivative f''(x) of function f(x), respectively.

As illustrated in FIG. 6, electron barrier layer 18 includes a first concave region in which f'(x)>0 and f''(x)>0 are satisfied in a region that satisfies Xs<x≤Xm. When this relationship is satisfied, f(x) is represented by a concave shape (that is, a downward convex shape) in the region between position x=Xs and position x=Xm as shown in graph (a) in FIG. 6.

In addition, as shown in graph (c) in FIG. 6, second derivative f''(x) reaches a local maximum at position x=X1 in the first concave region. Because of this, position x=X1 at which the change rate in Al composition ratio reaches the largest is present in the first concave region, and the change rate in the Al composition ratio is to increase gradually in a region from position x=Xs to position x=X1.

In this case, the change rate in Al composition ratio is smaller at the side of active layer 15 than at the other side. Thus, it is possible to reduce the magnitude of polarization charges in the near-interface region at the side of active layer 15. For this reason, as described above, it is possible to reduce the concentration of electrons present at the interface at the side of active layer 15 near position x=Xs, and thus to reduce increase in potential of a hole barrier to be formed in the valence band of electron barrier layer 18. As a result, it is possible to reduce in operation voltage required for the element and increase potential barrier ΔEc.

As shown in graph (b) in FIG. 6, the magnitudes of f'(x) are continuous, and there is no position at which magnitudes of f'(x) are discontinuous. For this reason, there is no position at which the surface density of polarization charges to be formed in electron barrier layer 18 changes abruptly. Accordingly, it is possible to prevent occurrence of a position at which polarization charges to be formed in electron barrier layer 18 increase sharply.

As a result, it is possible to reduce the electron concentration in the near-interface region of electron barrier layer 18 at the side of active layer 15, and to reduce an operation voltage.

In addition, as shown in graph (a) in FIG. 6, electron barrier layer 18 includes a first convex region in which f'(x)≤0 is satisfied in a region that satisfies X1<x≤Xe regarding position x.

At this time, in the first convex region, function f(x) has an upward convex shape. Accordingly, the shape of function f(x) shows a configuration in which the first convex region which is an upward convex is formed in the first concave region which is a downward convex at the side of second semiconductor layer 19. Position x=Xm having the largest Al composition ratio is located in the first convex region.

In the case of this Al composition ratio distribution shape, polarization charges which are formed in electron barrier layer 18 is approximately proportional to f'(x). Thus, the magnitude of the polarization charges is smaller in the near-interface region which is of electron barrier layer 18 and at the side of active layer 15, than a near-interface region which is of electron barrier layer 18 and at the side of second semiconductor layer 19.

In this case, since the magnitude of polarization charges in the near-interface of electron barrier layer 18 at the side of active layer 15 is reduced, it is possible to reduce the concentration of electrons present at the interface at the side of active layer 15 near position x=Xs as described above, and thus to reduce increase in the potential of a hole barrier to be formed in the valence band of electron barrier layer 18. As a result, it is possible to reduce an operation voltage required for the element and increase potential barrier ΔEc.

In addition, since the Al composition ratio distribution shape of the first convex region is an upward convex shape, the change rate in Al composition ratio in the vicinity of position x=Xm having the largest Al composition ratio becomes small. For this reason, the controllability of the largest value in Al composition ratio is excellent. In view of this, it is possible to reduce variation in largest in-plane Al composition ratio of wafer surfaces at the time of manufacturing of semiconductor light emitting elements 100. For this reason, it is possible to obtain an element with a high reproducibility, large potential barrier ΔEc, and excellent temperature characteristics.

In addition, electron barrier layer 18 includes, in order from active layer 15 side: a first decrease region in which the Al composition ratio decreases monotonically in a direction from position x=Xm toward second semiconductor layer 19; and a second decrease region in which the Al composition ratio decreases monotonically less than in the first decrease region in the direction from position x=Xm toward second semiconductor layer 19. In other words, the absolute value of the change rate of the Al composition ratio in the second decrease region is smaller than the absolute value of the change rate of the Al composition ratio in the first decrease region.

Here, when a total of film thicknesses of the first decrease region and the second decrease region is large, the Al composition ratio is higher than an average Al composition ratio in the second semiconductor layer of the second conductivity type, which leads to increase in the film thickness of the region that inhibits electrical conduction of holes. This increases an operation voltage.

Accordingly, it is excellent that the total of film thicknesses of the second decrease region and the first decrease region is small as much as possible. In this embodiment, the total film thickness is, for example, 4 nm or less. The total film thickness may be 2 nm or less.

In addition, as shown in graph (a) in FIG. 6, when the linear function that passes through a point (Xs, f(Xs)) and is tangent to function f(x) at position x=Xt in the first convex region is g(x), function f(x), function g(x), and first derivative f'(x) satisfy the relationship g(x)>f(x) and f'(x)>0, at position x that satisfies Xs<x<Xt.

In this case, the Al composition ratio that is determined by f(x) is smaller than the Al composition ratios in a triangle-shaped distribution that is defined by g(x) between position x=Xs and position x=Xt.

For this reason, the Al composition ratio of electron barrier layer 18 in the region between position x=Xs and position x=Xt is a value smaller than or equal to the Al composition ratio that is determined by g(x).

In this case, it is possible to reduce the magnitude of polarization charges in the near-interface region of electron barrier layer 18 at the side of activation layer 15 to be smaller than the magnitude of polarization charges in the electron barrier layer having the Al composition ratio distribution represented by g(x). As a result, the potential in the band structure at the interface of electron barrier layer 18 at the side of active layer 15 decreases less compared with the potential in the configuration of the electron barrier layer having the Al composition ratio represented by g(x) in the region between position x=Xs and position x=Xt, which increases potential barrier ΔEc. Furthermore, since it is possible to reduce a valence band barrier against holes, it is possible to reduce an operation voltage of semiconductor light emitting element 100. With this, it becomes possible to increase temperature characteristics of semiconductor light emitting element 100.

Figure 7:
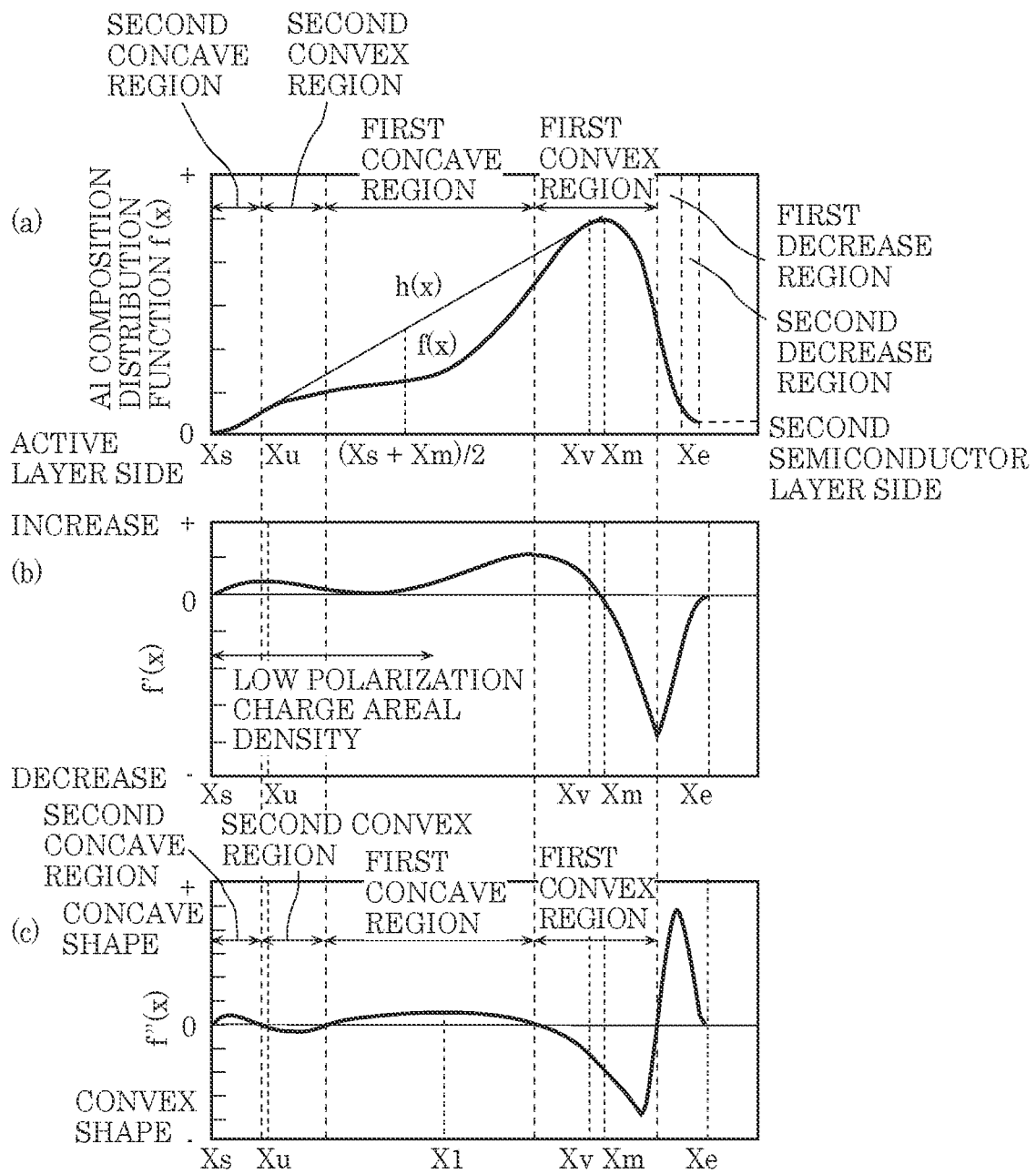
FIG. 7 is a diagram illustrating one example of an Al composition ratio in the stacking direction of the electron barrier layer according to Embodiment 1.

Next, another example in the case where the Al composition ratio distribution of electron barrier layer 18 is represented by function f(x) which is not limited to a linear line is described with reference to FIG. 7. FIG. 7 is a diagram illustrating one example of an Al composition ratio in the stacking direction of electron barrier layer 18 according to this embodiment. In FIG. 7, graph (a) is a graph showing function f(x) indicating an Al composition ratio distribution. In FIG. 7, graphs (b) and (c) are graphs showing first derivative f'(x) and second derivative f''(x) of function f(x), respectively.

Electron barrier layer 18 having function f(x) indicating an Al composition ratio distribution shown in graphs (a) to (c) in FIG. 7 includes a first concave area that satisfies f''(x)>0 and f'(x)>0 in a region that satisfies Xs<x≤Xm regarding position x. When this relationship is satisfied, f(x) is represented by a concave shape (that is, a downward convex shape) in the region between position x=Xs and position x=Xm as shown in graph (a) in FIG. 7.

In addition, as shown in graphs (a) to (c) in FIG. 7, position x at which f''(x) reaches the local maximum is represented by position x=X1. In a region that satisfies Xs≤x<X1 regarding position x, electron barrier layer 18 includes a second concave region in which f'(x) changes continuously and which includes a position at which f'(x)>0 is satisfied and f'(x) reaches a local maximum.

In this case, a region having an Al composition ratio increase rate higher than that of the first concave region and a second concave region without an abrupt step-shape change are formed in the near-interface region of electron barrier layer 18 at the side of active layer 15.

When an Al composition ratio increases in an abrupt step-shape, many polarization charges are generated at the step-shape change position. This increases the concentration of electrons to be generated at the interface between electron barrier layer 18 and active layer 15, which leads to increase in operation voltage.

In this embodiment, the Al composition ratio change in the vicinity of the interface between electron barrier layer 18 and active layer 15 is not step-shaped, and thus it is possible to reduce increase in operation voltage.

In addition, as shown in graphs (a) to (c) in FIG. 7, electron barrier layer 18 includes, in a region, a second convex region in which f''(x)≤0 is satisfied. The region including the second convex region satisfies Xs≤x<X1 regarding position x. In this way, the Al composition ratio distribution shape of the second convex region is an upward convex shape.

By sequentially forming a second concave region having an concave shape (that is, a downward convex shape) and a second convex region having an upward convex shape at the interface in the vicinity of active layer 15, it is possible to increase an Al composition ratio increase rate at an initial formation stage of electron barrier layer 18 compared with the Al composition ratio increase rate in the case where such a second concave region and a second convex region are not sequentially formed. As a result, an effect of increasing controllability of the position at which formation of electron barrier layer 18 is started and an effect of increasing reproducibility of operation characteristics of the element.

Here, a first concave region having a concave shape is formed at the side of second semiconductor layer 19 in the second convex region. In other words, the second convex region is disposed between the second concave region and the first concave region. In this case, a region having a high Al composition ratio increase rate is formed, and thus it is possible to locate the region in which many polarization charges are to occur away from the active layer 15 side.

In addition, a first convex region having an upward convex shape is formed at the second semiconductor layer 19 side in the first concave region. The first convex region includes position x=Xm at which a largest Al composition ratio is reached.

In this case, the Al composition ratio change rate is small in the vicinity of position x=Xm at which the largest Al composition ratio is reached, and thus it is possible to obtain the largest value of the Al composition ratio with excellent controllability. In view of this, it is possible to reduce variation in largest in-plane Al composition ratio of wafer surfaces at the time of manufacturing of semiconductor light emitting elements. For this reason, it is possible to obtain an element with a high reproducibility, large potential barrier ΔEc, and excellent temperature characteristics.

In addition, as illustrated in graph (a) in FIG. 7, a linear function that is tangent to function f(x) at a position (Xu, f(Xu)) in the second convex region and is tangent to function f(x) at a position (Xv, f(Xv)) in the first convex region is assumed to be function h(x). At position x that satisfies Xu<x<Xv, function f(x), function h(x), and first derivative f'(x) satisfy the relationship h(x)>f(x) and f'(x)>0.

In this case, the Al composition ratio which is determined by f(x) is smaller in value than Al composition ratios in a trapezoidal-shaped distribution which is determined by h(x) between position x=Xu and position x=Xv.

For this reason, the Al composition ratio of electron barrier layer 18 in the region between position x=Xu and position x=Xv is a value smaller than or equal to the Al composition ratio that is determined by h(x).

Polarization charges which are formed within the electron barrier layer are proportional to f'(x) as described above.

In this case, since the region in which a comparatively large positive polarization charge surface is formed is the region in the vicinity of the local maximum of f'(x) as shown in graph (b) in FIG. 7, the positive polarization charges are greater in the vicinity of position x=Xv than at position x=Xu.

As a result, it is possible to reduce the positive polarization charges in the vicinity of position x=Xu to be smaller than the positive polarization charges in the electron barrier layer having the Al composition ratio shown by h(x). For this reason, the potential of the band structure at the interface of electron barrier layer 18 at the side of active layer 15 is reduced less than the potential in the configuration having an Al composition ratio between position x=Xu and position x=Xv which is shown by h(x). Furthermore, since it is possible to reduce the potential of a band barrier against holes in the valence band, it is possible to reduce an operation voltage of semiconductor light emitting element 100. With this, it becomes possible to increase temperature characteristics of semiconductor light emitting element 100.

In addition, electron barrier layer 18 includes, in order from the active layer 15 side: a first decrease region in which the Al composition ratio decreases monotonically in a direction from position x=Xm toward a second semiconductor layer; and a second decrease region in which the Al composition ratio decreases monotonically less than in the first decrease region in the direction from position x=Xm toward the second semiconductor layer. Here, when a total of film thicknesses of the first decrease region and the second decrease region is large, the Al composition ratio is higher than an average Al composition ratio in second semiconductor layer 19, which leads to increase in film thickness of the region that inhibits conduction of holes. This increases an operation voltage.

Accordingly, it is excellent that the total of film thicknesses of the second decrease region and the first decrease region is small as much as possible. In this embodiment, the total film thickness is, for example, 4 nm or less. The total film thickness may be 2 nm or less.

In addition, in the Al composition ratio distribution shape of electron barrier layer 18 shown in FIGS. 6 and 7, f"(x)>0 and f'(x)>0 are satisfied at position x=(Xs+Xm)/2.

In this way, at the midpoint between position x=Xs and position x=Xm, f(x) is an increasing function of a concave shape (that is, a downward convex shape). Here, f(x) is smaller than the triangle-shape Al composition ratio distribution which is determined by g(x) or the trapezoidal-shape Al composition ratio distribution which is determined by h(x). Thus, it is possible to reduce influence of polarization charges of electron barrier layer 18 at position x=Xs, which leads to reduction in electron concentration.

For this reason, the potential of the band structure at the interface of electron barrier layer 18, specifically the interface at the side of active layer 15 reduces less than the potential in the configuration shown by g(x) or h(x), which increases potential barrier ΔEc. Furthermore, since it is possible to reduce the potential of a valence band barrier against holes, it is possible to reduce an operation voltage of semiconductor light emitting element 100. With this, it becomes possible to increase temperature characteristics of semiconductor light emitting element 100.

In the Al composition ratio distribution shape of electron barrier layer 18 illustrated in FIGS. 6 and 7, the first concave region has a width of (Xm−Xs)/2 or more.

In this case, it is possible to place the region in which many polarization charges are present can be placed closer to the Al composition ratio largest point Xm in the range from position x=Xs to position x=Xm, and thus it is possible to locate the polarization charge occurrence position away from the interface of electron barrier layer 18 at the side of active layer 15.

For this reason, decrease in the potential of the band structure of electron barrier layer 18 at the interface at the side of active layer 15 is reduced less than decrease in the potential in the configuration shown by g(x) or h(x), which increases potential barrier ΔEc. Furthermore, since it is possible to further reduce the potential of the valence band barrier against holes, it is possible to reduce an operation voltage of semiconductor light emitting element 100. With this, it becomes possible to increase temperature characteristics of semiconductor light emitting element 100.

In addition, Mg is doped in electron barrier layer 18 of semiconductor light emitting element 100 according to this embodiment. AlGaN having a high Al composition ratio is used in the first convex region in electron barrier layer 18. In this way, an increase in potential barrier ΔEc enables reduction in electron leakage to the second semiconductor layer. The largest Al composition ratio may be, for example, 0.2 or more, or 0.3 or more. In this way, an increase in the Al composition ratio increases the difference between the energy of an Mg acceptor level and the energy of an AlGaN valence band, which makes it difficult for Mg to become active as an acceptor. For this reason, the concentration of Mg to be doped to electron barrier layer 18 may be increased to $1 \times 10^{19}$ cm$^{-3}$ or more to increase the concentration of the acceptor to be activated. However, when the Mg doping concentration is increased excessively to $3 \times 10^{19}$ cm$^{-3}$ or more, crystallizability in electron barrier layer 18 is decreased, which may lead to reduction in reliability of semiconductor light emitting element 100 in a high-output operation at a high temperature. For this reason, the Mg doping concentration may be less than $3 \times 10^{19}$ cm$^{-3}$.

In semiconductor light emitting element 100 according to this embodiment, electron barrier layer 18 is subjected to Mg doping from $1 \times 10^{19}$ cm$^{-3}$ to $2 \times 10^{19}$ cm$^{-3}$, inclusive.

In addition, an activation rate of Mg as an acceptor is high in the region having a comparatively low Al composition ratio and located between position x=Xs and position x=(Xs+Xm)/2, and thus it is also excellent to set the concentration of Mg to be doped to $1 \times 10^{19}$ cm$^{-3}$ and to increase the concentration of Mg to be doped to a comparatively high value of $2 \times 10^{19}$ cm$^{-3}$. In this way, it is possible to reduce decrease in crystallizability in electron barrier layer 18 due to increase in Mg concentration.

In addition, in the configuration of electron barrier layer 18 illustrated in each of FIGS. 4A and 4B, and FIGS. 5A to 5D, the first region may have a film thickness of more than 50% and no larger than 80% of the film thickness of electron barrier layer 18, and the Al composition ratio at position x=(Xm+Xs)/2 may be no larger than 50% of the largest Al composition ratio in electron barrier layer 18. In this way, as described above, it is possible to reduce waveguide losses, increase potential barrier ΔEc, and reduce leakage currents at the same time.

The rate of change in Al composition ratio in the first region in electron barrier layer 18 having an Al composition ratio distribution represented by a plurality of linear lines illustrated in FIGS. 4A and 4B is small, and the rate of change in Al composition ratio in the second region at the side of second semiconductor layer 19 is large.

In comparison, electron barrier layer 18 having a curved Al composition ratio distribution shown in each of FIGS. 6 and 7 is characterized in that the increase rate (f"(x)) in Al composition ratio is large in the region closer to second semiconductor layer 19 than position x=X1, the curvature is increased, and the curvature of function f(x) indicating the magnitude of the Al composition ratio is increased.

In this way, in electron barrier layer 18 having the curved Al composition ratio distribution shown in FIGS. 6 and 7, the first region shown in FIGS. 4A and 4B corresponds to the region closer to active layer 15 with respect to position x=X1 at which the largest Al composition ratio change rate (f"(x)) is reached in the first concave region.

Accordingly, when the first region has a film thickness larger than 50% and no larger than 80% of the film thickness of electron barrier layer 18, and the first region has, at position x=(Xm+Xs)/2, an Al composition ratio of no larger than 50% of the largest Al composition ratio in electron barrier layer 18 having the curved Al composition ratio distribution shown in FIGS. 6 and 7, it is possible to reduce leakage currents, increase potential barrier ΔEc, and reduce leakage currents at the same time.

As described above, in this embodiment, the Al composition ratio changes continuously in the region in which the Al composition ratio changes in electron barrier layer 18. Such an Al composition ratio distribution of electron barrier layer 18 is formed using, for example, metal organic chemical vapour deposition (MOCVD). In MOCVD, for example, it is possible to freely adjust an Al composition ratio distribution by temporally changing the supply amount of gas including a crystal material when causing crystal growth. The shape of each of the Al composition ratio distributions can be made by changing the Al supply amount in minor steps with time. In this case, it is to be noted that, even when the Al supply amount has been changed linearly with time, the Al composition ratio distribution may become a curved shape due to time delay of a material that reaches the crystal growth surface because of the influence such as viscosity of source gas.

[1-4. Effects and Advantages of Electron Barrier Layer]

Next, effects and advantages of electron barrier layer 18 according to this embodiment is described with reference to FIGS. 8 to 12.

Figure 8:
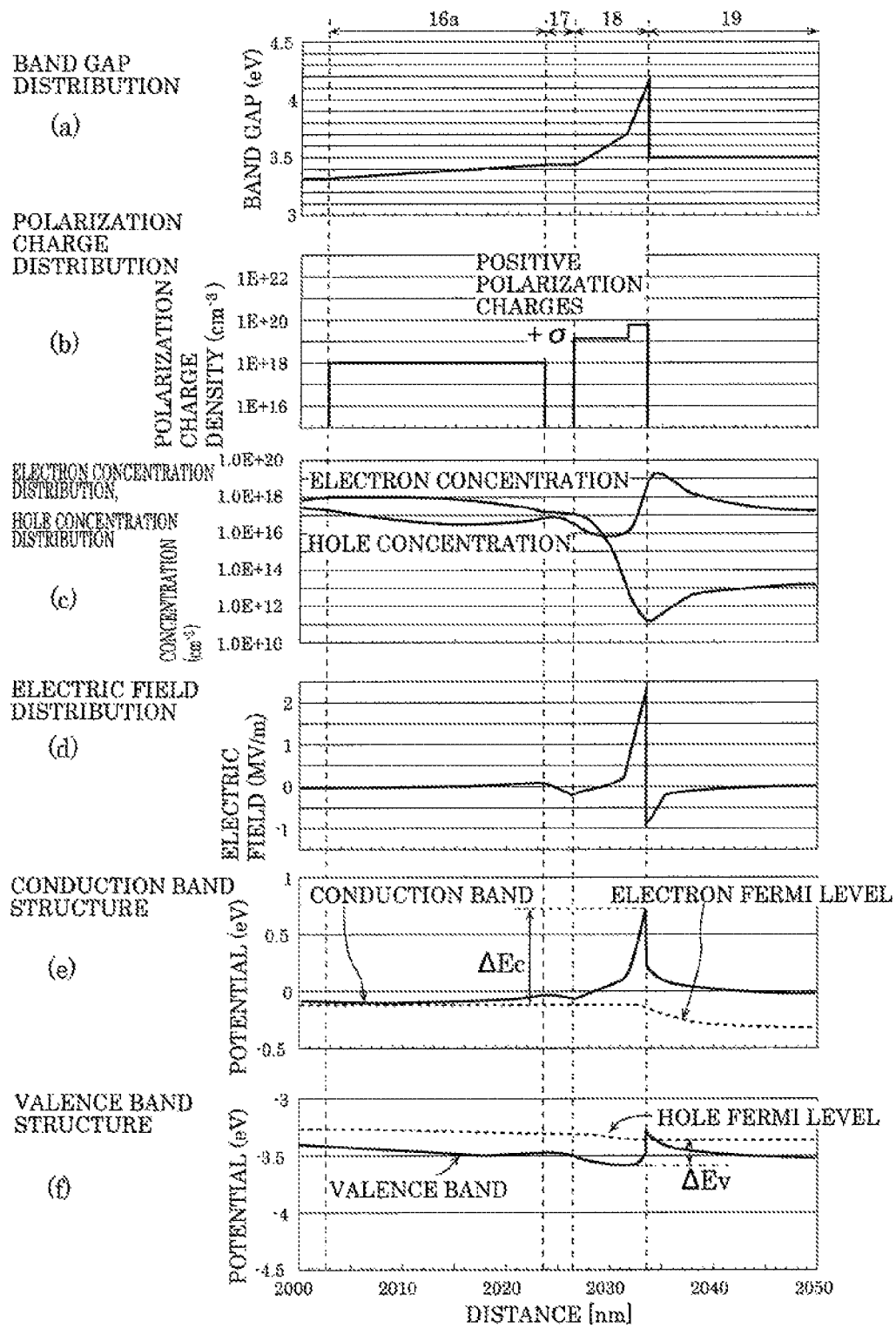
FIG. 8 is a diagram indicating a simulation result of a first configuration example of the semiconductor light emitting element according to Embodiment 1.
Figure 9:
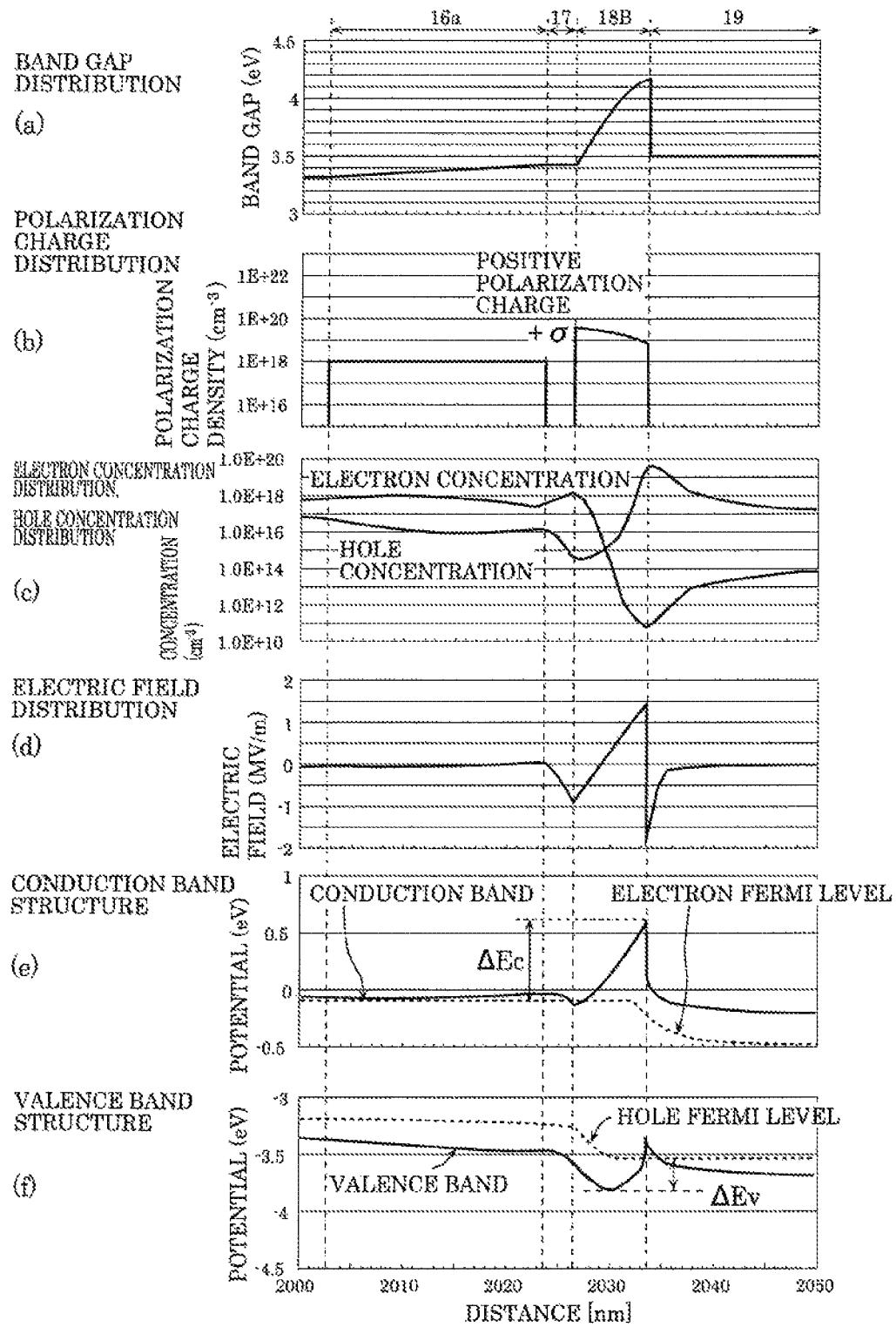
FIG. 9 is a diagram indicating a simulation result of the semiconductor light emitting element according to Comparison Example 2.
Figure 10:
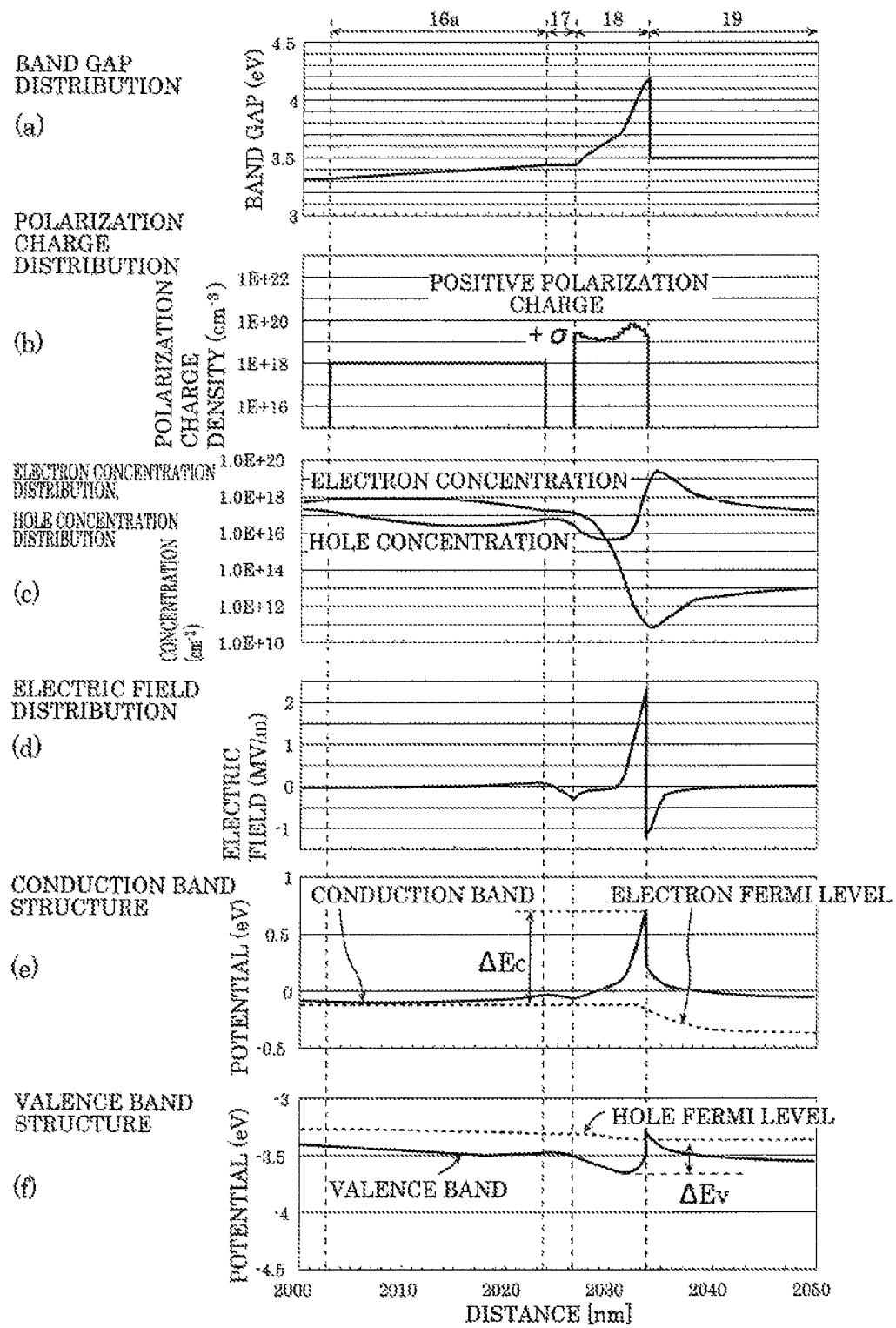
FIG. 10 is a diagram indicating a simulation result of a second configuration example of the semiconductor light emitting element according to Embodiment 1.
Figure 11:
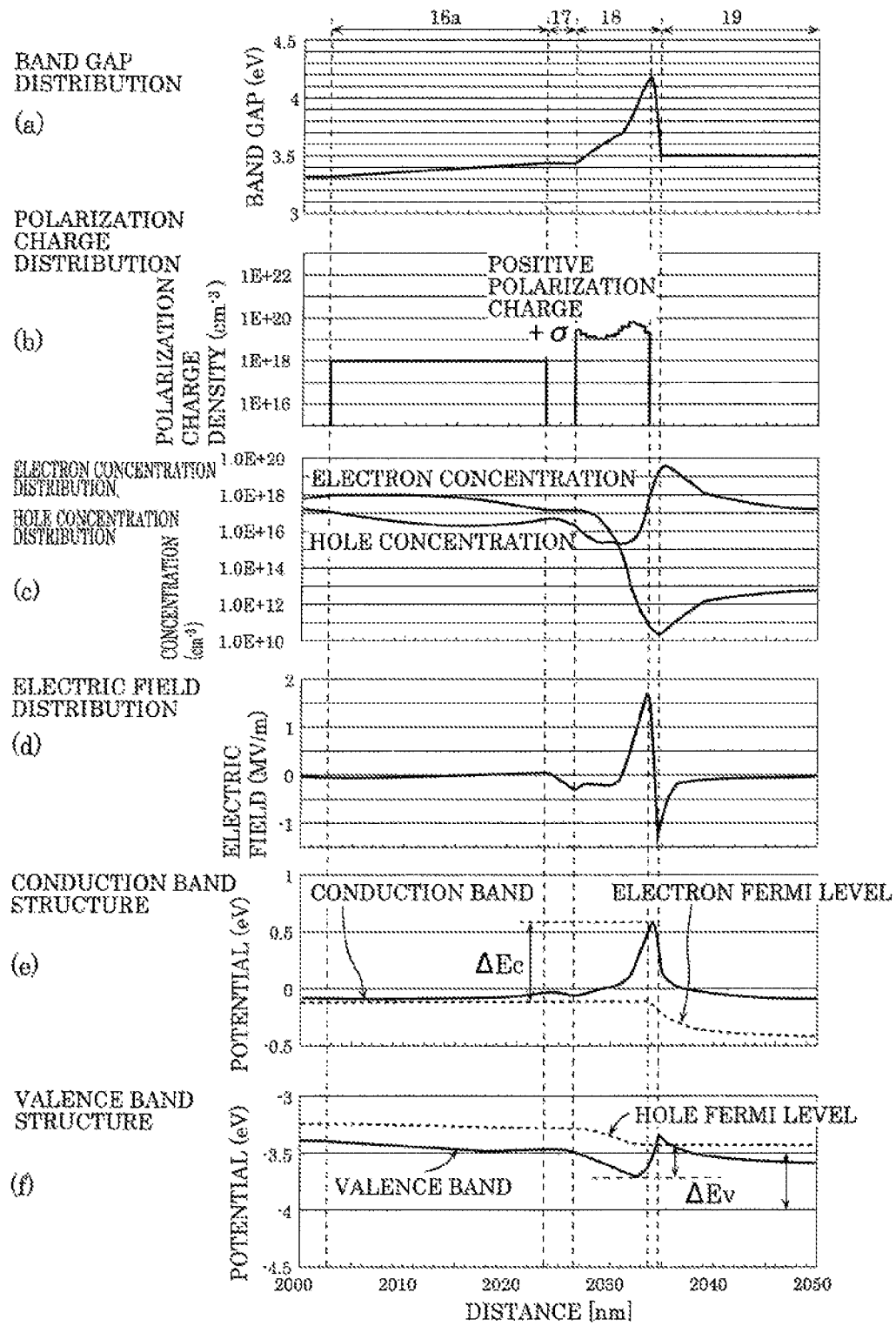
FIG. 11 is a diagram indicating a simulation result of a third configuration example of the semiconductor light emitting element according to Embodiment 1.
Figure 12:
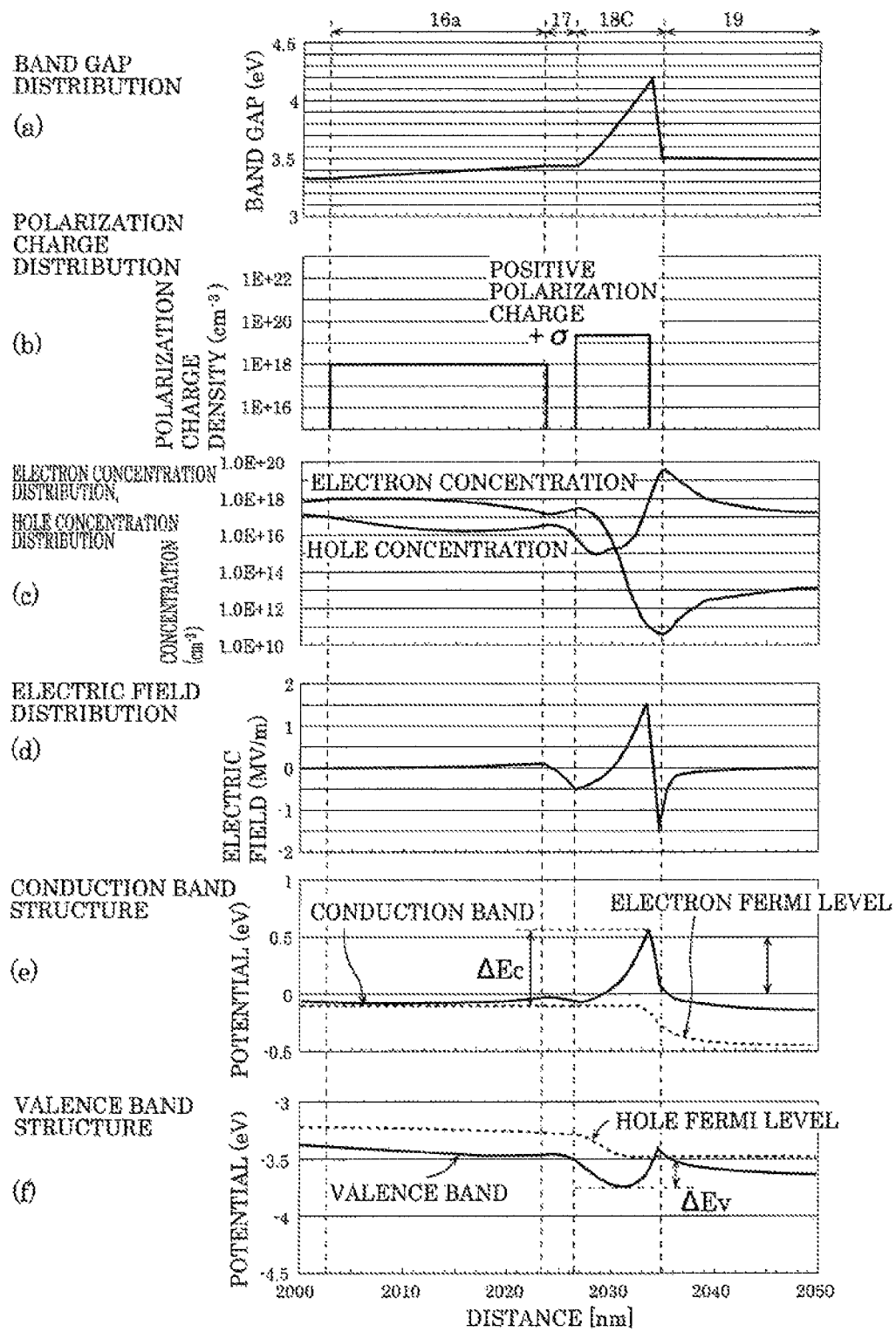
FIG. 12 is a diagram indicating a simulation result of the semiconductor light emitting element according to Comparison Example 3.

FIG. 8 is a diagram indicating a simulation result of a first configuration example of semiconductor light emitting element 100 according to this embodiment. FIG. 9 is a diagram indicating a simulation result of the semiconductor light emitting element according to Comparison Example 2. FIG. 10 is a diagram indicating a simulation result of a second configuration example of semiconductor light emitting element 100 according to this embodiment. FIG. 11 is a diagram indicating a simulation result of a third configuration example of semiconductor light emitting element 100 according to this embodiment. FIG. 12 is a diagram indicating a simulation result of the semiconductor light emitting element according to Comparison Example 3. It is to be noted that, in any of the simulations, the operation current of the semiconductor light emitting element is set to 300 mA.

In each of FIGS. 8 to 12, graph (a) indicates the band gap energy distribution in the vicinity of the electron barrier layer, and graph (b) indicates the distribution of polarization charges per unit volume in the vicinity of the electron barrier layer. In each of FIGS. 8 to 12, graph (c) indicates the electron distribution and hole concentration distribution in the vicinity of electron barrier layer 18, and graph (d) indicates the electric field distribution in the vicinity of electron barrier layer 18. In each of FIGS. 8 to 12, graph (e) indicates the conduction band structure and electron Fermi energy distribution in the vicinity of electron barrier layer 18, and graph (0 indicates the valence band structure and hole Fermi energy distribution in the vicinity of electron barrier layer 18.

FIG. 8 shows a simulation result in the case where electron barrier layer 18 has a film thickness of 7 nm. In the simulation, electron barrier layer 18 includes a first region having a film thickness of 5 nm and a second region having a film thickness of 2 nm. In the first region, the Al composition ratio is increased linearly from 0 to 0.15 with advancement from the active layer 15 side to the second semiconductor layer 19 side. In the second region, the Al composition ratio is increased linearly from 0.15 to 0.35 with advancement from the active layer 15 side to the second semiconductor layer 19 side.

As shown in graph (b) in FIG. 8, positive polarization charges of $1 \times 10^{19}$ cm$^{-3}$ are generated in a region in electron barrier layer 18, specifically the region at the side of active layer 15, and positive polarization charges of $1 \times 10^{19}$ cm$^{-3}$ are generated in a region in electron barrier layer 18, specifically the region at the side of second semiconductor layer. Graph (b) in FIG. 8 shows only positive polarization charges. The amount of polarization charges corresponds to 1% compared to the amount obtainable when the electron barrier layer has a uniform Al composition ratio of 0.35. In addition, not-shown negative polarization charges having a surface density of $-5.3 \times 10^{-2}$ C/m$^2$ are formed at the interface between electron barrier layer 18 and second semiconductor layer 19. Here, the elementary charge quantity per electron is $1.6 \times 10^{-19}$ C. Assuming that the film thickness at the interface is 0.01 nm that is approximately one-several tenths of a c-axis lattice constant of AlGaN, it is considered that negative polarization electrodes corresponding to an electron concentration of approximately $1 \times 10^{22}$ cm$^{-3}$ are generated. In this way, with electron barrier layer 18 according to this embodiment, polarization charges at the active layer 15 side can be reduced. In the present disclosure, the volume density of the polarization charges is a value obtained through conversion into an electron concentration.

As shown in graph (c) in FIG. 8, electrons having a concentration of $1 \times 10^{17}$ cm$^{-3}$ are induced at the interface of electron barrier layer 18 at the active layer side in order to satisfy an electrical neutrality condition with the positive polarization charges generated at the interface of electron barrier layer 18. With this, an electric field is generated at the interface of electron barrier layer 18 at the active layer side, and the intensity has been reduced to −0.2 MV/cm. As a result, as shown in graphs (e) and (f) in FIG. 8, decreases in the potentials of the conduction band and the valence band at the interface of electron barrier layer 18 at the side of active layer 15 are also reduced, and thus decrease in potential barrier ΔEc against electrons and increase in potential barrier ΔEv against holes are reduced. In the configuration shown in FIG. 8, potential barrier ΔEc is 0.77 eV, and potential barrier ΔEv is 0.22 eV. In addition, with reference to, for example, also the simulation result in Comparison Example 1 shown in FIG. 2, it has been found that potential barrier ΔEc against electrons becomes larger and potential barrier ΔEv against holes becomes smaller when the Al composition ratio distribution of electron barrier layer 18 has a concave shape (a downward convex shape) like electron barrier layer 18 shown in FIG. 8.

FIG. 9 shows a simulation result of a semiconductor light emitting element according to Comparison Example 2 compared with semiconductor light emitting element 100 according to this embodiment. The semiconductor light emitting element according to Comparison Example 2 differs from the semiconductor light emitting element in this embodiment only in configuration of electron barrier layer 18B. Electron barrier layer 18B according to Comparison Example 2 has a film thickness of 7 nm. The Al composition ratio is increased from 0 to 0.35 in a forward direction from the active layer 15 side to the second semiconductor layer 19 side in electron barrier layer 18B. It is to be noted that the Al composition ratio is increased so that an increase rate of the Al composition ratio is gradually decreased. In other words, the graph showing the Al composition ratio distribution has not a linear-line shape but an upward convex shape.

As illustrated in graph (b) in FIG. 9, positive polarization electrodes of $5\times10^{19}$ cm$^{-3}$ have been generated in a region which is in electron barrier layer 18B and at the side of active layer 15. Graph (b) in FIG. 9 shows only positive polarization electrodes. This value is five times of the value obtained by the simulation of semiconductor light emitting element 100 according to this embodiment shown in FIG. 8. In addition, not-shown negative polarization electrodes of $-5.3\times10^{-2}$ C/m$^2$ have been generated at the interface between electron barrier layer 18 and second semiconductor layer 19. Here, the elementary charge quantity per electron is $1.6\times10^{-19}$ C. Assuming that the film thickness at the interface is 0.01 nm that is approximately one-several tenths of a c-axis lattice constant of AlGaN, it is considered that negative polarization electrodes corresponding to an electron concentration of approximately $1\times10^{22}$ cm$^{-3}$ are generated.

Graph (c) in FIG. 9 shows that electrons having a concentration of $1\times10^{18}$ cm$^{-3}$ are induced at the interface of electron barrier layer 18B at the side of active layer 15 in order to satisfy an electrical neutrality condition with the positive polarization charges generated at the interface of electron barrier layer 18. This concentration corresponds to approximately ten times of the value shown in graph (c) in FIG. 8. For this reason, the electric field that are generated at the interface of electron barrier layer 18B at the side of active layer 15 is $-0.9$ MV/cm, and the absolute value is approximately 4.5 times of the value obtainable in the case shown in graph (c) in FIG. 8. As a result, as shown in graphs (e) and (f) in FIG. 8, decreases in the potentials of the conduction band and the valence band at the interface of electron barrier layer 18B at the side of active layer 15 become large compared to the results shown in FIG. 8. With this, potential barrier ΔEc against electrons decreases, and potential barrier ΔEv against holes increases. In the configuration shown in FIG. 9, potential barrier ΔEc against electrons is 0.68 eV, and potential barrier ΔEv against holes is 0.28 eV.

FIG. 10 shows the simulation results in the case where electron barrier layer 18 has a film thickness of 7 nm. In this simulation, in the region having a film thickness of 5 nm which is in electron barrier layer 18 and at the side of active layer 15, the Al composition ratio is increased gradually (linearly) from 0 to 0.15 with advancement from the active layer 15 side to the second semiconductor layer 19 side. In addition, in the region having a film thickness of 2 nm which is in electron barrier layer 18 and at the side of second semiconductor layer 19, the Al composition ratio is increased gradually to 0.35 with advancement from the active layer 15 side to the second semiconductor layer 19 side. In this case, in the region having the film thickness of 2 nm in electron barrier layer 18 at the side of second semiconductor layer 19, the Al composition ratio distribution has a concave shape (a downward convex shape).

As shown in graph (b) in FIG. 10, a region in electron barrier layer 18, specifically the region closer to active layer 15 than to second semiconductor layer 19 has a positive polarization charge distribution in which positive polarization charges decrease from $2\times10^{19}$ cm$^{-3}$ to $1\times10^{19}$ cm$^{-3}$ with increase in distance from active layer 15. Graph (b) in FIG. 10 shows only positive polarization charges. In addition, not-shown negative polarization charges having a surface density of $-5.3\times10^{-2}$ C/m$^2$ are formed at the interface between electron barrier layer 18 and second semiconductor layer 19. Here, the elementary charge quantity per electron is $1.6\times10^{-19}$ C. Assuming that the film thickness at the interface is 0.01 nm that is approximately one-several tenths of a c-axis lattice constant of AlGaN, it is considered that negative polarization electrodes corresponding to an electron concentration of approximately $1\times10^{22}$ cm$^{-3}$ are generated.

As shown in graph (c) in FIG. 10, electrons having a concentration of $1\times10^{17}$ cm$^{-3}$ are induced to the interface of electron barrier layer 18 at the side of active layer 15 in order to satisfy an electrical neutrality condition with positive polarization charges generated at the interface of electron barrier layer 18. The concentration has been reduced to approximately one tenth of the concentration in the case shown in graph (c) in FIG. 9. For this reason, the absolute value of the electric field generated at the interface of electron barrier layer 18 at the side of active layer 15 is also reduced to $-0.3$ MV/cm. As a result, as shown in graphs (e) and (f) in FIG. 10, decreases in the potentials of the conduction band and the valence band at the interface of electron barrier layer 18 at the side of active layer 15 are also reduced, and thus potential barrier ΔEc against electrons increases and potential barrier ΔEv against holes decreases. In the configuration shown in FIG. 10, potential barrier ΔEc against electrons is 0.77 eV, and potential barrier ΔEv against holes is 0.23 eV.

Compared to the electron barrier layer shown in FIG. 10, electron barrier layer 18 used in the simulation shown in FIG. 11 has a configuration further including, at a region closer to second semiconductor layer 19 than to active layer 15, a region in which the Al composition ratio decreases with advancement from the active layer 15 side to the second semiconductor layer 19 side (hereinafter, the region is also referred to as an "Al composition ratio decrease region").

In the Al composition ratio decrease region in electron barrier layer 18, the Al composition ratio decreases to be the same as the Al composition ratio of second semiconductor layer 19 in such a manner that the absolute value of the decrease rate of an Al composition ratio gradually increases with advancement from the active layer 15 side to second semiconductor layer 19 side and then gradually decreases. In other words, the Al composition ratio decrease region has an Al composition ratio distribution having a concave shape (that is, a downward convex shape) region in a region which has an upward convex shape in an Al composition ratio distribution and at the side of second semiconductor layer 19.

As shown in graph (b) in FIG. 11, a region in electron barrier layer 18, specifically the region closer to active layer 15 than to second semiconductor layer 19 has a positive polarization charge distribution in which positive polarization charges decrease from $2\times10^0$ cm$^{-3}$ to $1\times10^{19}$ cm$^{-3}$ with increase in distance from active layer 15. Graph (b) in FIG. 11 shows only positive polarization charges. In addition, not-shown negative polarization charges approximately corresponding to $2\times10^{20}$ cm$^{-3}$ are formed in an Al composition ratio decrease region which is in electron barrier layer 18 and at the side of second semiconductor layer 19.

As shown in graph (c) in FIG. 11, electrons having a concentration of $1\times10^{17}$ cm$^{-3}$ are induced to the interface of electron barrier layer 18 at the side of active layer 15 in order to satisfy an electrical neutrality condition with positive polarization charges generated at the interface of electron barrier layer 18.

The electron concentration has a value equivalent to the value obtainable in the configuration shown in FIG. 10. However, the smallest value of the potential of the valence band structure decreases as shown in graph (f) in FIG. 11 because of the Al composition ratio decrease region additionally included in electron barrier layer 18 at the side of second semiconductor layer 19, and the operation voltage of semiconductor light emitting element 100 increases because of increase in potential barrier ΔEv against holes.

As shown in graphs (e) and (f) in FIG. 11, the potentials of the conduction band and the valence band of electron barrier layer 18 at the side of active layer 15 are also decreased compared to those obtainable in the configuration shown in FIG. 10. For this reason, potential barrier ΔEc against electrons decreases, and potential barrier ΔEv against holes increases. In the configuration shown in FIG. 11, potential barrier ΔEc against electrons is 0.68 eV, and potential barrier ΔEv against holes is 0.28 eV.

Potential barrier ΔEv against holes increases by approximately 0.05 eV compared to potential barrier ΔEv obtainable in the configuration shown in FIG. 10, and is to increase a rise voltage by approximately 0.04 V in current-voltage characteristics of semiconductor light emitting element 100. For this reason, it is excellent that the Al composition ratio decrease region in electron barrier layer 18 is thin as much as possible.

FIG. 12 shows results of simulations of a semiconductor light emitting element according to Comparison Example 3 compared with semiconductor light emitting element 100 according to this embodiment. The semiconductor light emitting element according to Comparison Example 3 differs from the semiconductor light emitting element in this embodiment only in configuration of electron barrier layer 18C. Electron barrier layer 18C according to Comparison Example 3 has a film thickness of 9 nm. The Al composition ratio is increased from 0 to 0.35 in a region having a film thickness of 7 nm in electron barrier layer 18C at the active layer 15 side with an advancement from the active layer 15 side to the second semiconductor layer 19 side in electron barrier layer 18C. In the Al composition ratio decrease region having a film thickness of 2 nm in electron barrier layer 18C at the side of second semiconductor layer 19, the Al composition ratio is decreased to be equal to the Al composition ratio of second semiconductor layer 19 with advancement from active layer 15 side to second semiconductor layer 19 side.

In the Al composition ratio decrease region in electron barrier layer 18C, the Al composition ratio decreases in such a manner that the absolute value of the decrease rate of an Al composition ratio gradually increases and then gradually decreases, from the active layer 15 side to second semiconductor layer 19 side. In other words, the Al composition ratio decrease region has an Al composition ratio distribution having a concave shape (that is, a downward convex shape) region in a region which has an upward convex shape in an Al composition ratio distribution and at the side of second semiconductor layer 19.

As shown in graph (b) in FIG. 12, positive polarization charges of $2 \times 10^{19}$ cm$^{-3}$ are present in a region in electron barrier layer 18C at the activation layer side. Graph (b) in FIG. 12 shows only positive polarization charges. In addition, not-shown negative polarization charges approximately corresponding to $2 \times 10^{20}$ cm$^{-3}$ are formed in an Al composition ratio decrease region which is in electron barrier layer 18 and at the side of second semiconductor layer 19.

As shown in graph (c) in FIG. 12, electrons having a concentration of $2 \times 10^{17}$ cm$^{-3}$ are induced to the interface of electron barrier layer 18C at the side of active layer 15 in order to satisfy an electrical neutrality condition with positive polarization charges generated at the interface of electron barrier layer 18C.

In this way, the electron concentration increases to approximately twice the electron concentration obtainable in the configuration shown in FIG. 11. This is because the Al composition ratio in a region having a film thickness of 7 nm in electron barrier layer 18C is larger than the Al composition ratio obtainable in the configuration shown in FIG. 11. In other words, the concentration of electrons to be induced can be reduced more in the case of the Al composition ratio distribution having a concave shape as in the configuration shown in FIG. 11.

As shown in graphs (e) and (f) in FIG. 12, the potentials of the conduction band and the valence band of electron barrier layer 18C at the side of active layer 15 are also decreased compared to those obtainable in the configuration shown in FIG. 11. For this reason, potential barrier ΔEc against electrons decreases, and potential barrier ΔEv against holes increases. In the configuration shown in FIG. 12, potential barrier ΔEc against electrons is 0.66 eV, and potential barrier ΔEv against holes is 0.30 eV.

Figure 13:
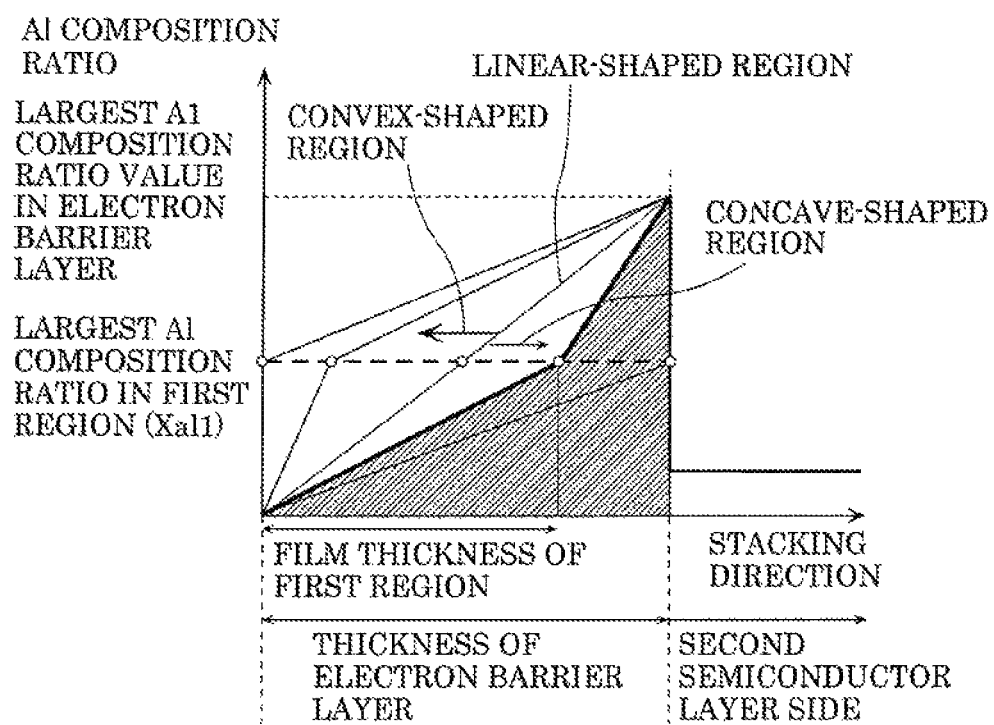
FIG. 13 is a schematic diagram illustrating an Al composition ratio distribution shape of the electron barrier layer used in the simulation.
Figure 14:
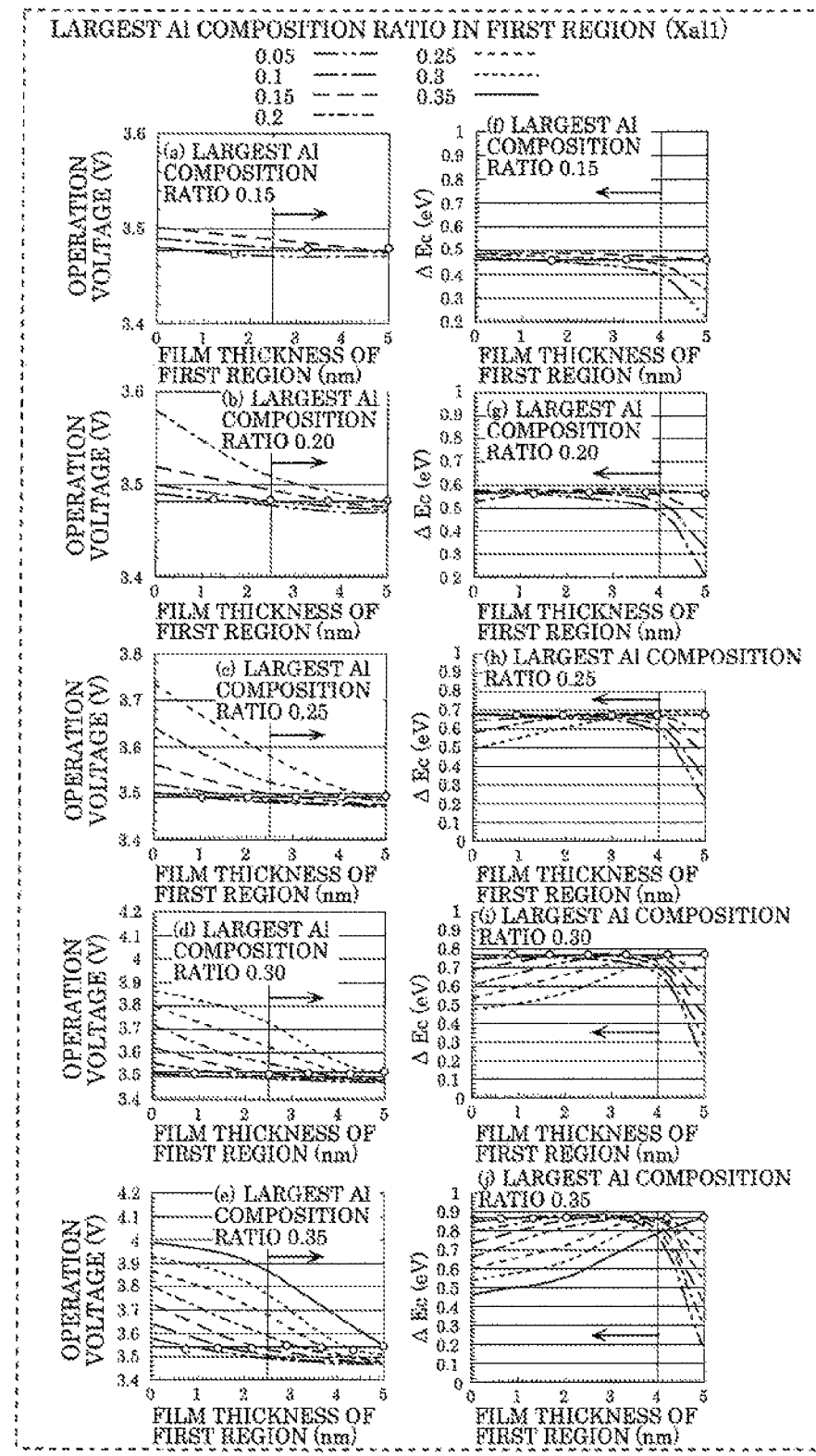
FIG. 14 includes graphs each showing simulation results in the case where the electron barrier layer has a film thickness of 5 nm.
Figure 15:
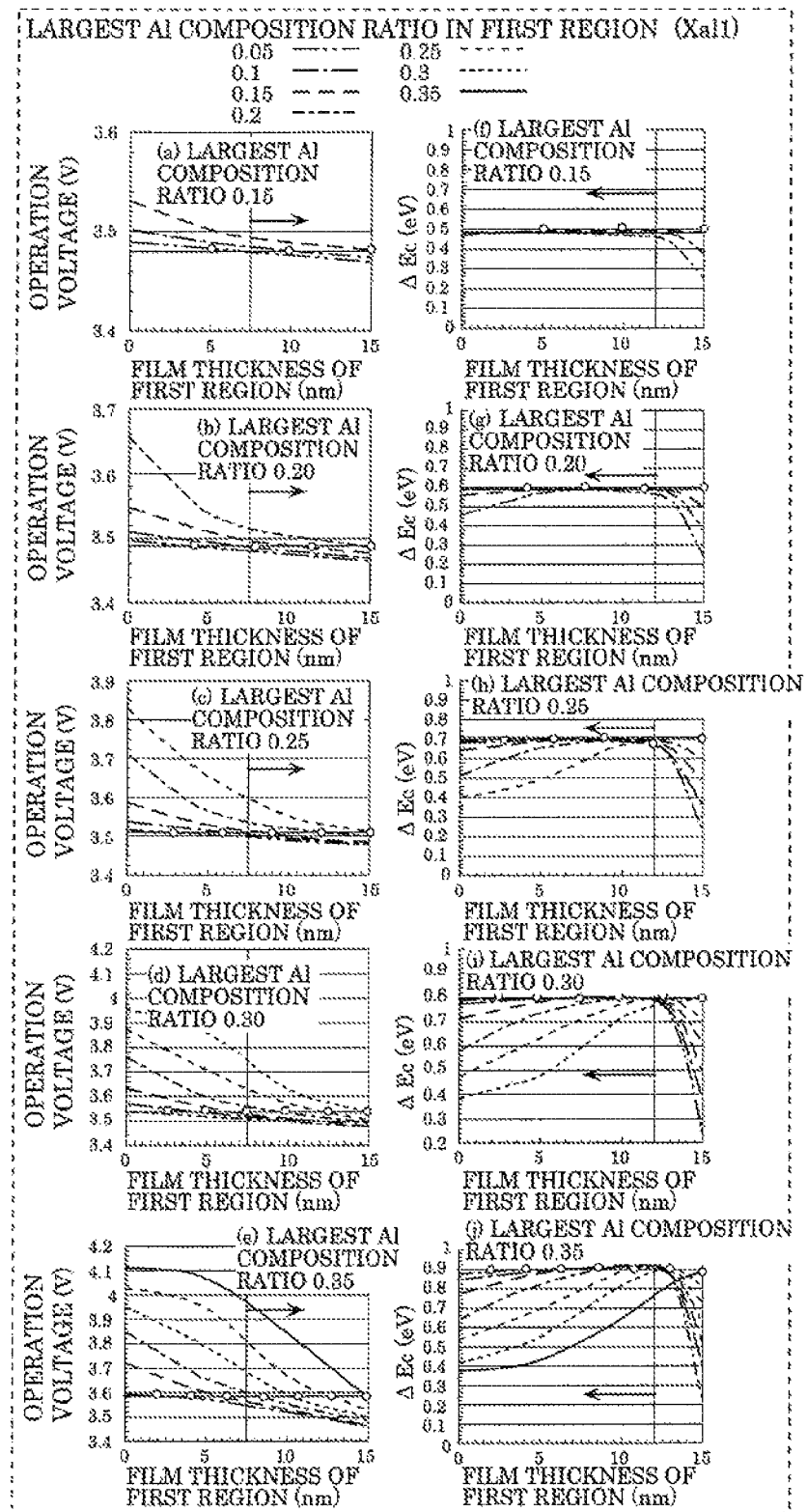
FIG. 15 includes graphs each showing simulation results in the case where the electron barrier layer has a film thickness of 15 nm.

Next, the relationship between (i) the shape of the Al composition ratio distribution of electron barrier layer 18 according to this embodiment and (ii) an operation voltage of semiconductor light emitting element 100 and potential barrier ΔEc against electrons is described with reference to FIGS. 13 to 15. FIG. 13 is a schematic diagram illustrating an Al composition ratio distribution shape of the electron barrier layer used in the simulation. FIGS. 14 and 15 are graphs showing simulation results in the case where the electron barrier layer has a film thickness of 5 nm and 15 nm, respectively.

In the simulations in each of the cases where the electron barrier layer has the film thickness of 5 nm or 15 nm, an Al composition ratio largest value in the electron barrier layer, an Al composition ratio largest value in a first region, and the film thickness of the first region have been changed, the operation voltage at an operation current value of 300 mA and potential barrier ΔEc against electrons have been estimated, and reduction in electron leakage and shapes effective for reduction in voltage have been studied.

First, with reference to FIG. 14, the simulation results in the case where the electron barrier layer has a film thickness of 5 nm is described.

In FIG. 14, each of graphs (a) to (e) shows the calculation results of dependencies of operation voltages with respect to the film thicknesses of the first region in operations at a current of 300 mA, and each of graphs (f) to (j) shows the calculation results of dependencies of potential barriers ΔEc against electrons with respect to the film thicknesses of the first region in operations at a current of 300 mA. Each of graphs (a) and (f) shows the calculation results in a corresponding one of cases in each of which the largest Al composition ratio is 0.15 and the largest Al composition ratio in the first region is 0.05, 0.1, or 0.15. Each of graphs (b) and (g) shows the calculation results in a corresponding one of cases in each of which the largest Al composition ratio is 0.2 and the largest Al composition ratio in the first region is 0.05, 1.0, 0.15, or 0.2. Each of graphs (c) and (h) shows the calculation results in a corresponding one of cases in each of which the largest Al composition ratio is 0.25 and the largest Al composition ratio in the first region is 0.05, 1.0, 0.15, 0.2, or 0.25. Each of graphs (d) and (i) shows the calculation results in a corresponding one of cases in each of which the largest Al composition ratio is 0.3 and the largest Al composition ratio in the first region is 0.05, 1.0, 0.15, 0.2, 0.25, or 0.3. Each of graphs (e) and (j) shows the calculation results in a corresponding one of cases in each of which the largest Al composition ratio is 0.35 and the largest Al composition ratio in the first region is 0.05, 1.0, 0.15, 0.2, 0.25, 0.3, or 0.35.

In each graph, white-circle points represent the film thicknesses of the first region when the Al composition ratio distribution has a "linear-line shape" which defines the boundary between the region having the concave shape (that is, the downward convex shape) and the region having the convex shape (that is, the upward convex shape) in the Al composition ratio distribution shown in FIG. 13.

Graphs (a) to (j) in FIG. 15 show calculation results similar to the calculation results obtained in graphs (a) to (j) in FIG. 14 although the electron barrier layer in FIG. 15 has the film thickness of 15 nm.

In each graph in FIG. 15, each white-circle point represents the film thickness of the first region having the "linear-line shape" as in each graph in FIG. 14.

As illustrated in each of graphs (a) to (e) in FIGS. 14 and 15, a value that is no larger than the operation voltages when the Al composition ratio distribution has the linear-line shape is obtained when (i) the largest Al composition ratio in the first region is smaller than or equal to 50% of the largest Al composition ratio in the electron barrier layer and (ii) the first region has a film thickness corresponding to 50% or more of the film thickness of the electron barrier layer, in the range in which the largest Al composition ratio in the electron barrier layer is in a range from 0.15 to 0.35, inclusive, and the largest Al composition ratio in the first region is in a range from 0.05 to 0.35, inclusive.

When the film thickness of the first region is the same as the film thickness of the electron barrier layer, the largest Al composition ratio of the electron barrier layer is the largest Al composition ratio of the first region. Accordingly, as the film thickness of the first region becomes closer to the film thickness of the electron barrier layer, the film thickness of the region having a large band gap energy in the electron barrier layer becomes thin. For this reason, due to the influence of quantum-mechanical tunnel effects, potential barrier $\Delta Ec$ against electrons becomes closer to the value of $\Delta Ec$ in the case where the largest Al composition ratio of the electron barrier layer is the largest Al composition ratio of the first region.

As illustrated in graphs (f) to (g) in each of FIGS. 14 and 15, decrease in potential barrier $\Delta Ec$ against electrons can be reduced when the film thickness of the first region is smaller than or equal to 80% of the thickness of the electron barrier layer, in the range in which the largest Al composition ratio in the electron barrier layer is 0.15 to 0.35, inclusive, and the largest Al composition ratio of the first region is 0.05 to 0.35, inclusive.

The results in FIGS. 14 and 15 show that it is possible to reduce the operation voltage below the operation voltage in the case of the linear-line shape and to reduce decrease in potential barrier $\Delta Ec$ caused by reduction in the film thickness of the high Al composition ratio region in the electron barrier layer, when the largest Al composition ratio in the first region is 50% or less of the largest Al composition ratio in the electron barrier layer and the film thickness of the first region is in a range from 50% to 80%, inclusive, of the film thickness of the electron barrier layer.

Here, when the film thickness of the electron barrier layer becomes 2 nm or less, the film thickness of the electron barrier layer is reduced. This increases the possibility of occurrence of a tunnel current and an electron overflow in which electrons present at the interface of the electron barrier layer at the active layer side are thermally excited and go beyond the electron barrier layer.

In addition, increasing the largest Al composition ratio value in the electron barrier layer to 15% or more necessitates doping of Mg at high concentration, and increasing the film thickness of the electron barrier layer increases a waveguide loss.

Accordingly, there is a need to form an electron barrier layer having a film thickness in a range from 3 nm to 20 nm, inclusive.

In addition, it is also excellent that an electron barrier layer having a film thickness in a range from 5 nm to 15 nm, inclusive, is formed, the largest Al composition ratio in the first region is 50% or less of the largest Al composition ratio in the electron barrier layer, and that the film thickness of the first region is in a range from 50% to 80%, inclusive, of the film thickness of the electron barrier layer. In this way, it is possible to reduce operation voltages while stably reducing occurrence of tunnel currents and electron overflow without increasing waveguide losses.

In this embodiment, increase in temperature characteristics and reduction in operation voltage are balanced by configuring the electron barrier layer having a film thickness of 7 nm, the first region having a film thickness of 4 nm, and the second region having a film thickness of 3 nm.

[1-5. Impurity Doping Profile]

Figure 16:
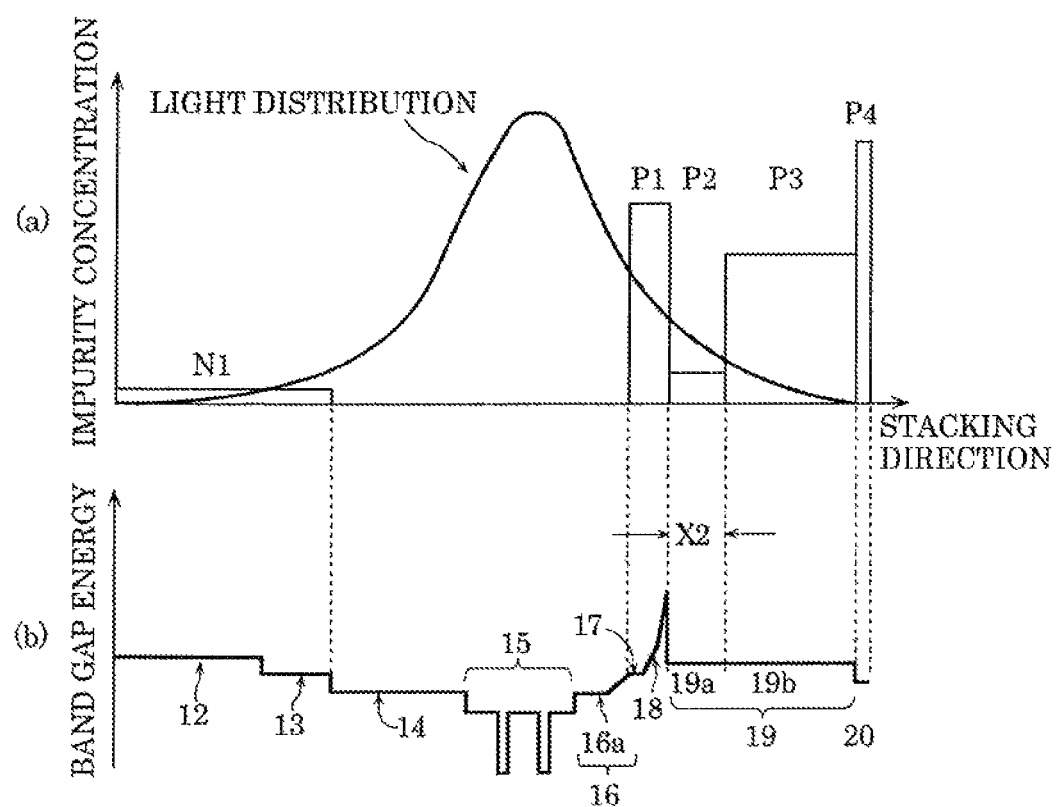
FIG. 16 is a schematic diagram indicating an impurity doping profile of a second semiconductor layer in the semiconductor light emitting element according to Embodiment 1.

Next, an impurity doping profile in second semiconductor layer 19 of semiconductor light emitting element 100 according to this embodiment is described with reference to FIG. 16. FIG. 16 is a schematic diagram illustrating an impurity doping profile in second semiconductor layer 19 of semiconductor light emitting element 100 according to this embodiment.

As shown in FIG. 16, second semiconductor layer 19 is formed above electron barrier layer 18 having an impurity concentration of P1 ($=1 \times 10^{18}$ cm$^3$). Second semiconductor layer 19 includes low impurity concentration region 19a having impurity concentration P2 and film thickness X2 and high impurity concentration region 19b having impurity concentration P3, in order from the electron barrier layer 18 side. In this way, waveguide losses are reduced by reducing free carrier losses incurred by light distributed in second semiconductor layer 19.

However, a resistance increases and an operation voltage increases when impurity concentration P2 becomes too small or film thickness X2 becomes too large. For this reason, study is made for film thickness X2 and impurity concentration P2 of low impurity concentration region 19a for achieving a low waveguide loss while reducing increase in operation voltage.

In FIG. 16, N1 denotes the concentration of an n-type impurity including Si in first semiconductor layer 12 including n-type AlGaN and first light guide layer 13 including n-type GaN. Here, the concentration is $1 \times 10^{18}$ cm$^{*3}$. In addition, P4 shown in FIG. 16 denotes the concentration of p-type impurity including Mg in contact layer 20 including p-type GaN. Here, the concentration is $1 \times 10^{20}$ cm$^{-3}$. Under the conditions, the relationship between (i) film thickness X2 and impurity concentration P2 of low impurity concentration region 19a and (ii) operation voltages and waveguide losses are explained with reference to FIGS. 17A and 17B, respectively.

Figure 17A:
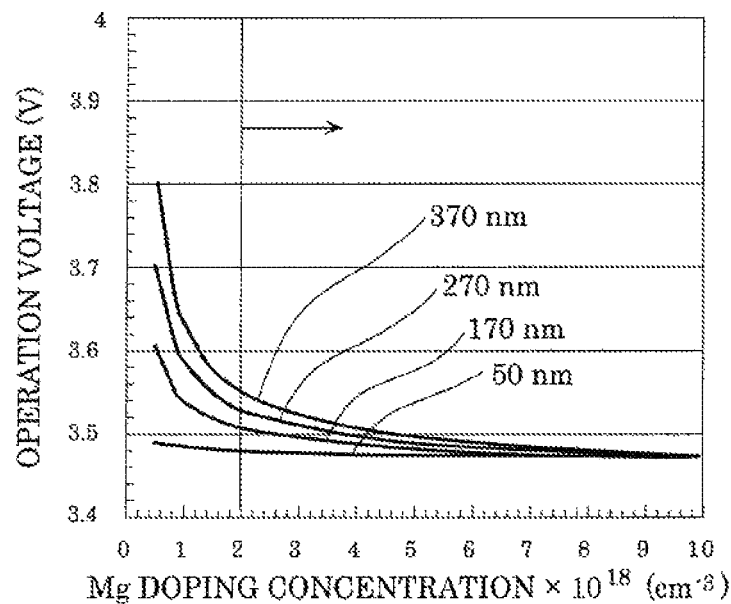
FIG. 17A is a graph showing impurity concentration dependencies in a low impurity concentration region with respect to operation voltages in the semiconductor light emitting element according to Embodiment 1.
Figure 17B:
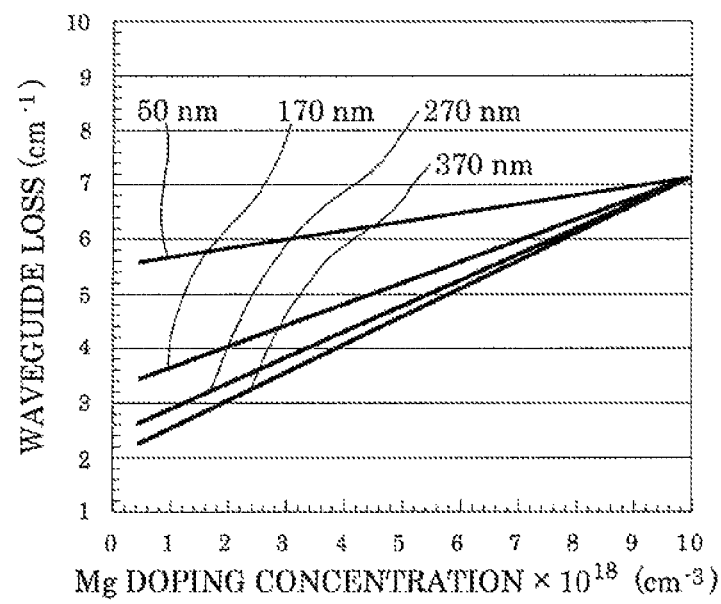
FIG. 17B is a graph showing impurity concentration dependencies in a low impurity concentration region with respect to waveguide losses in the semiconductor light emitting element according to Embodiment 1.

Each of FIGS. 17A and 17B is a graph showing impurity concentration dependencies of low impurity concentration region 19a with respect to operation voltages and waveguide losses in semiconductor light emitting element 100 according to this embodiment. Each of FIGS. 17A and 17B is a graph showing impurity concentrations with respect to operation voltages and waveguide losses in operations at 300 mA in the case where impurity concentrations P2 are in a range from $0.5 \times 10^{18}$ cm$^{-3}$ to $1 \times 10^{10}$ cm$^{-3}$. In addition, each of FIGS. 17A and 17B shows the calculation results of the impurity concentration dependencies in the case where film thicknesses P2 of low impurity concentration region 19a are 50 nm, 170 nm, 270 nm, and 370 nm.

As illustrated in FIG. 17A, an operation voltage increases abruptly when the concentration of Mg which is a p-type impurity decreases to $1.5 \times 10^{18}$ cm$^{-3}$ or less.

As illustrated in FIG. 17B, a waveguide loss reduction result is large when the film thickness of low impurity concentration region 19a is 170 nm or more.

In view of this, in this embodiment, reduction in operation voltage and reduction in waveguide loss are achieved by configuring low impurity concentration region 19a having a film thickness of 170 nm and an Mg doping concentration of $2 \times 10^{18}$ cm$^{-3}$. With this Mg doping profile, it is possible to reduce increase in operation voltage in an operation at 300 mA to 0.1 V and reduce the waveguide loss from 7 cm$^{-1}$ to 4 cm$^{-1}$ which corresponds to the half of the waveguide loss obtainable in the case where impurity doping in second semiconductor layer 19 is constant at $1 \times 10^{19}$ cm$^{-3}$.

Figure 18:
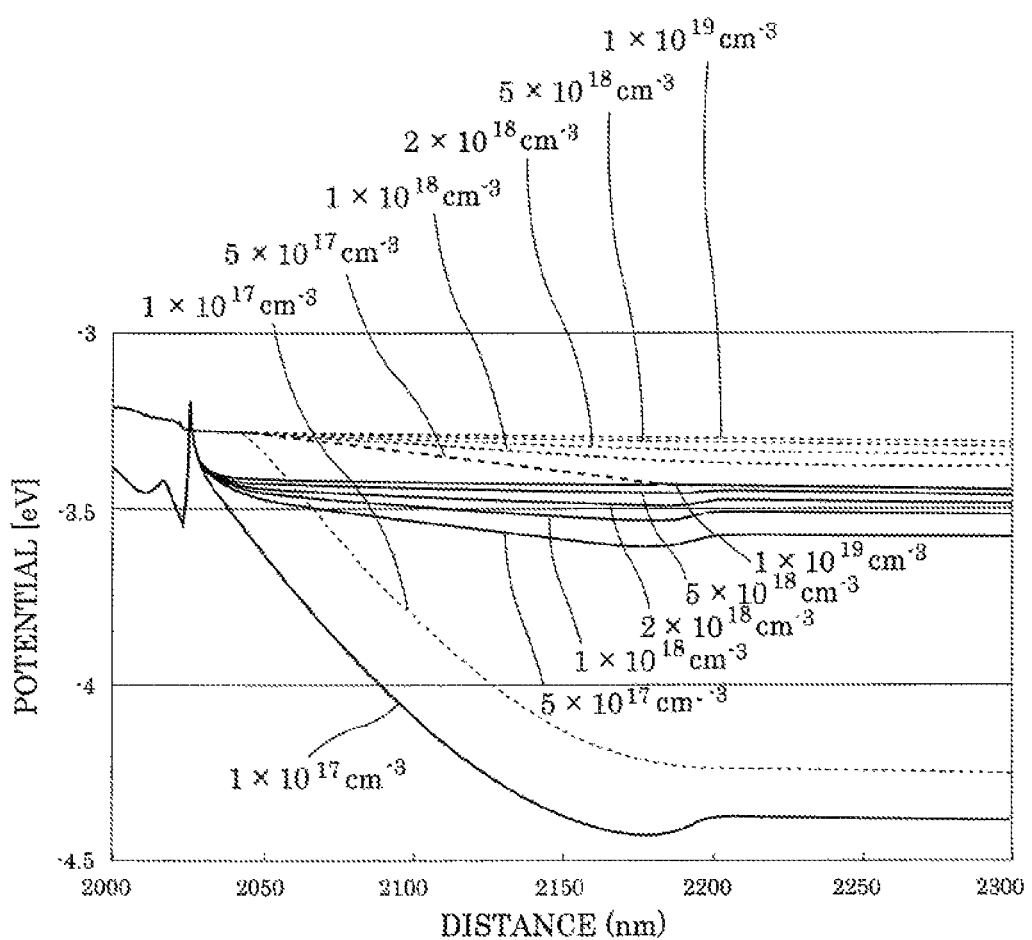
FIG. 18 is a graph showing calculation results of valence band structures and hole Fermi levels in the case where the impurity doping concentration in the low impurity concentration region according to Embodiment 1 is changed from $1 \times 10^{17}$ cm$^{-3}$ to $1 \times 10^{19}$ cm$^{-3}$.

Next, the relationships between (i) impurity doping concentrations in low impurity concentration region 19a of second semiconductor layer 19 according to this embodiment and (ii) valence band structures and hole Femi levels are explained with reference to FIG. 18. FIG. 18 is a graph showing calculation results of valence band structures and hole Femi levels in the case where the impurity doping concentration of low impurity concentration region 19a according to this embodiment is changed from $1 \times 10^{17}$ cm$^{-3}$ to $1 \times 10^{19}$ cm$^{-3}$. Here, the Mg doping concentration of high impurity concentration region 19b of second semiconductor layer 19 is $1 \times 10^{19}$ cm$^{-3}$.

As known from FIG. 18, decreasing the Mg doping concentration of low impurity concentration region 19a increases the gradient of the valence band structure, and holes are accelerated by the electric field and obtain high energy. The high-energy holes are further accelerated to obtain high energy by the gradient of the valence band structure in a region in the electron barrier layer at the active layer side. Such holes cause occurrence of leakage hole currents.

In addition, allowing the high-energy holes to pass through an electron barrier layer having an Mg doping concentration of $1 \times 10^{19}$ cm$^{-3}$ causes crystal defects, which becomes a cause of reduction in reliability of semiconductor light emitting element 100.

As known from FIG. 18, the gradient of the valence band structure described above increases when the Mg doping concentration of low impurity concentration region 19a is reduced to $1 \times 10^{18}$ cm$^{-3}$ or less.

Accordingly, this shows that it is excellent to configure low impurity concentration region 19a to have an Mg doping concentration in a range from $1 \times 10^{18}$ cm$^{-3}$ to $2 \times 10^{18}$ cm$^{-3}$, inclusive, in order to prevent increase in waveguide loss and operation voltage and reduce occurrence of high-energy holes due to the gradient of the valence band structure in low impurity concentration region 19a in holes.

Considering the results shown in FIGS. 17A and 17B together with the result in FIG. 18, it is possible to prevent increase in waveguide loss and operation voltage and reduce occurrence of high-energy holes due to the gradient of the valence band structure by configuring low impurity concentration region 19a to have a film thickness in a range from 150 nm to 200 nm, inclusive, and controlling Mg doping concentration within a range from $1 \times 10^{18}$ cm$^{-8}$ to $2 \times 10^{18}$ cm$^{-3}$, inclusive. In this way, it is possible to increase operation characteristics at a high temperature and reduce operation current values, which makes it possible to increase operation reliability of semiconductor light emitting element 100.

Figure 19:
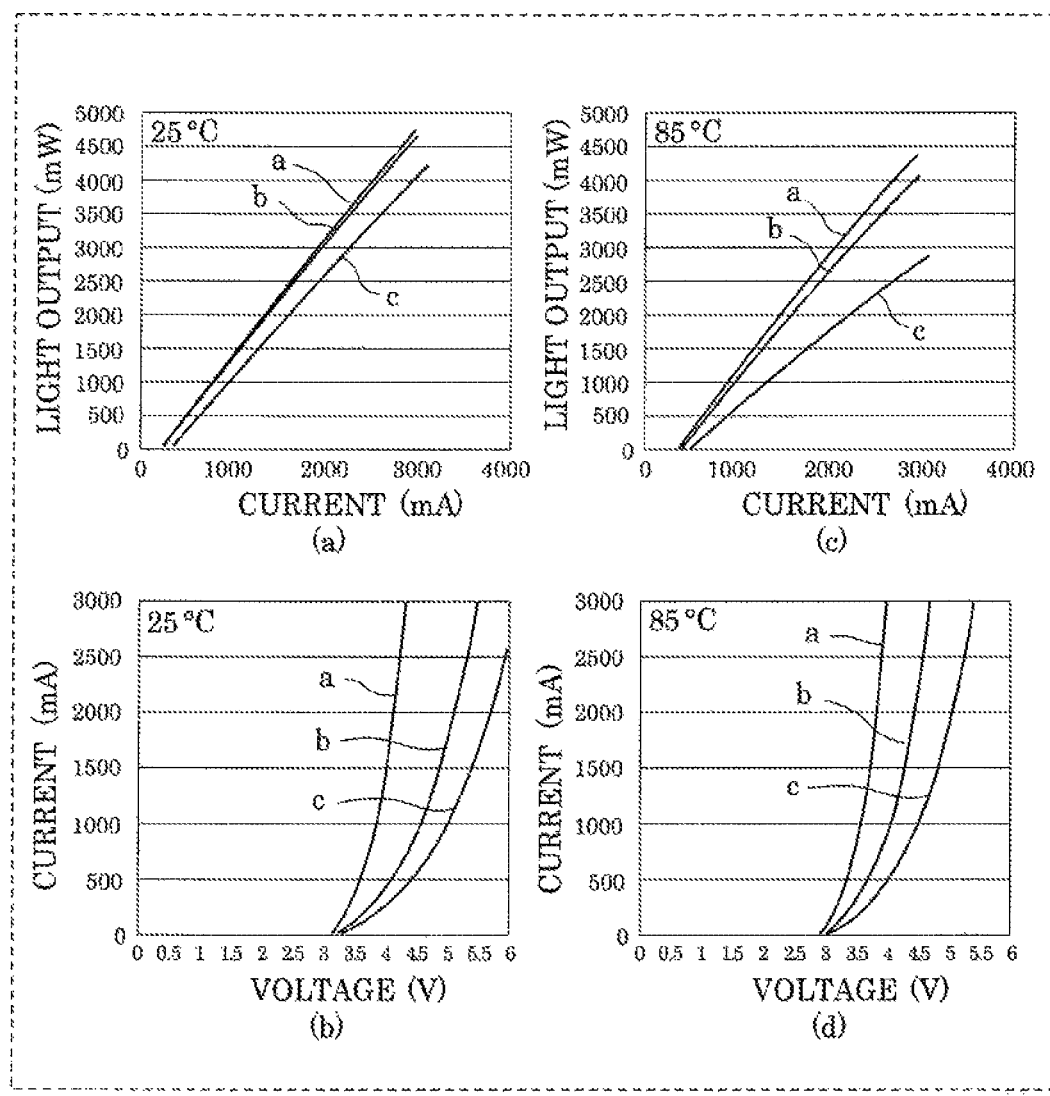
FIG. 19 includes graphs each showing characteristics of the semiconductor light emitting elements when the Al composition ratio distribution shapes of electron barrier layers are shape a, shape b, and shape c.

Next, relationships between Al composition ratio distribution shapes of the electron barrier layer and characteristics of the semiconductor light emitting element are described with reference to FIG. 19. FIG. 19 includes graphs each indicating characteristics of the semiconductor light emitting elements in the cases where the Al composition ratio distribution shapes of the electron barrier layers are shape a, shape b, and shape c. Here, shape a corresponds to the Al composition ratio distribution shape of the electron barrier layer according to this embodiment. In the shape, the Al composition ratio in a first region having a film thickness of 4 nm at the active layer side increases linearly from 0 to 0.15, and the Al composition ratio in a second region having a film thickness of 3 nm at the second semiconductor layer side increases linearly from 0.15 to 0.35. Shape b is a shape in which: in the region having a film thickness of 4 nm at the active layer side, the Al composition ratio increases linearly from 0 to 0.35 which is the largest value with advancement from the active layer side to the second semiconductor layer side; and in the region having a film thickness of 3 nm at the second semiconductor layer side, the Al composition ratio is constant at 0.35 which is the largest value. Shape c is a shape in which the Al composition ratio in the electron barrier layer having a film thickness of 7 nm is constant at 0.35.

In FIG. 19: graph (a) shows current-light output characteristics at 25 degrees Celsius; graph (b) shows current-voltage characteristics at 25 degrees Celsius; graph (c) shows current-light output characteristics at 85 degrees Celsius; and graph (d) shows current-voltage characteristics at 85 degrees Celsius.

As known from FIG. 19, with shape a, forming the first region having a small Al composition ratio change rate and the second region having a large Al composition ratio change rate in the Al composition ratio distribution shape of the electron barrier layer produces effects of reducing the operation voltage and increasing the temperature characteristics in current-light output characteristics.

In this embodiment: the Al composition ratio distribution shape in which the Al composition ratio is increased from 0 to 0.15 in the region having the film thickness of 4 nm is employed in the first region of the electron barrier layer; and the Al composition ratio distribution shape in which the Al composition ratio is increased from 0.15 to 0.35 in the region having the film thickness of 3 nm is employed in the second region of the electron barrier layer. However, the film thicknesses of the first region and the second region of shape a are not limited to the film thicknesses described above.

The measurement results shown in FIG. 19 have been obtained using a semiconductor light emitting element mounted on a sub-mount including diamond by junction down so that an active layer side is closer to the sub-mount side. This mounting embodiment increases temperature characteristics for reducing a heat resistance of the semiconductor light emitting element. Diamond has a heat conductivity of at least 1000 W/m·K which is significantly larger than heat conductivities of materials used in other sub-mounts, for example, SiC having a heat conductivity of approximately 200 W/m·K and AlN having a heat conductivity of approximately 150 W/m·K. Thus, diamond is suitable for achieving heat resistance. For this reason, increase in the temperature of the semiconductor light emitting element in a high-output operation at a high temperature is also decreased. For this reason, generally, increase in temperature increases the activation rate of doped Mg which is a p-type impurity. This reduces resistance in a p-type layer, resulting in reduction in operation voltage. However, use of such diamond sub-mount reduces temperature increase in the semiconductor light emitting element, which leads to reduction in operation voltage in the case where the temperature is increased from the room temperature to a high temperature. Accordingly, for the purpose of reducing power to be consumed, it is more effective to reduce an operation voltage by increasing electricity conductivity of holes using the electron barrier layer according to this embodiment having the Al composition ratio distribution described above when causing the semiconductor light emitting element having an increased heat dissipation and a reduced heat resistance to operate.

For example, in addition to mounting the semiconductor light emitting element on a diamond sub-mount by junction down, examples of heat resistance reducing methods include: mounting the semiconductor light emitting element on a single-crystal SiC sub-mount by junction down; and configuring the semiconductor light emitting element to have a resonator length of 1200 μm or more and a stripe width of 40 μm or more to increase heat dissipation to reduce heat resistance.

In particular, when configuring a super high-output semiconductor laser element which outputs at 10 W or more, the semiconductor laser element may be configured to have a stripe length of 40 μm or more and have a resonator length of 1500 μm or more, in terms of heat dissipation. In this way, the electron barrier layer according to this embodiment further effectively reduce the operation voltage.

Embodiment 2

A semiconductor light emitting element according to Embodiment 2 is described. The semiconductor light emitting element according to this embodiment is different from semiconductor light emitting element 100 according to Embodiment 1 in (i) an impurity doping configuration in a third light guide layer and (ii) a barrier layer which is in an active layer and at a second optical guide side or an impurity doping configuration at an interface of the barrier layer at the second optical guide side. Hereinafter, the semiconductor light emitting element according to this embodiment is described mainly focusing on differences from semiconductor light emitting element 100 according to Embodiment 1.

[2-1. Overall Configuration]

As described above, the semiconductor light emitting element according to this embodiment has a layer structure which is similar to the layer structure of semiconductor light emitting element 100 according to Embodiment 1 illustrated in FIG. 1A.

The semiconductor light emitting element according to this embodiment is different from semiconductor light emitting element 100 according to Embodiment 1 in the configurations of third light guide layer 16 and barrier layer 15a in active layer 15. Configurations of third light guide layer 16 and barrier layer 15a and effects produced by the same are described.

[2-2. Impurity Doping Configuration in Third Optical Guide Layer]

Figure 20:
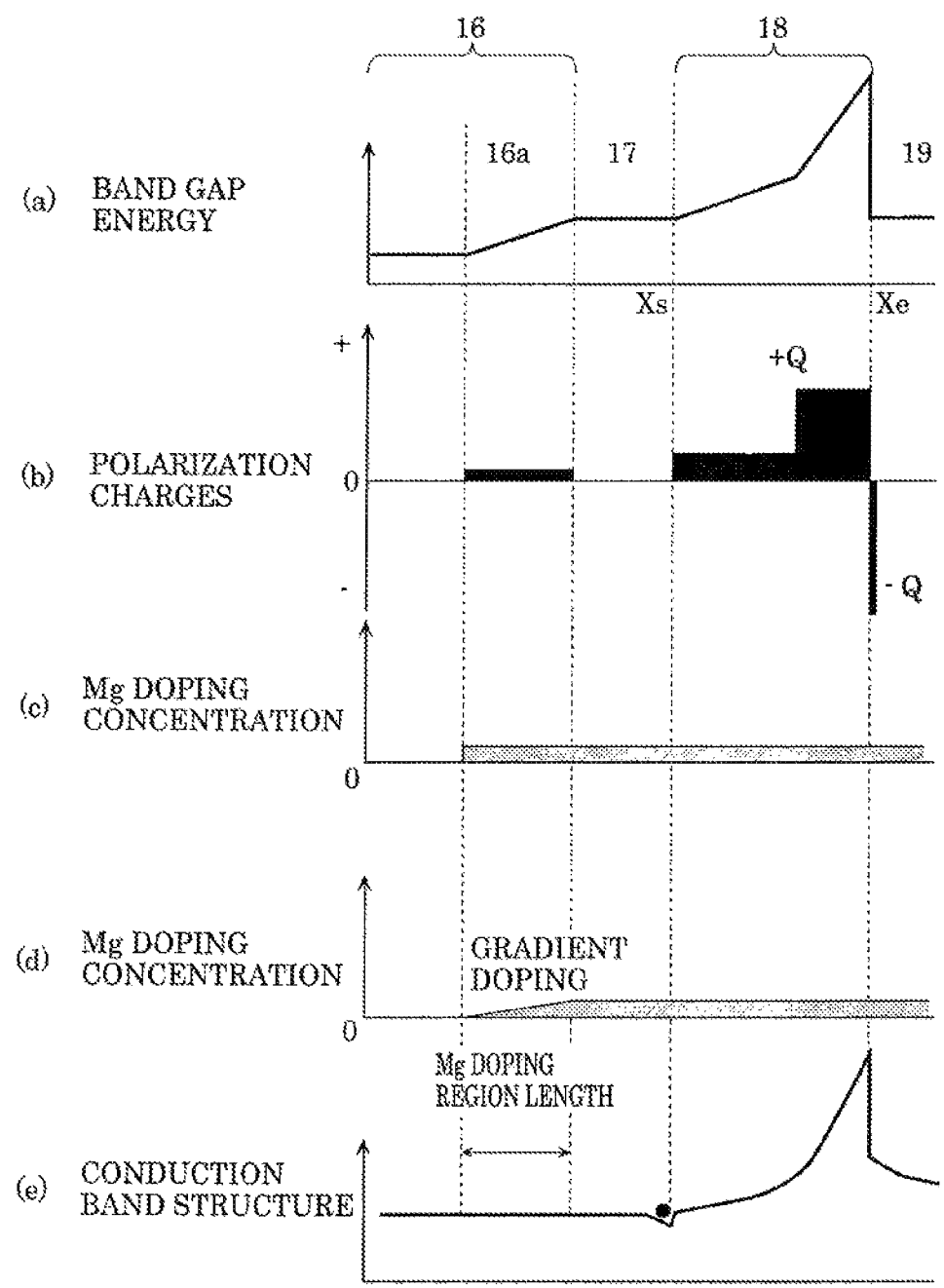
FIG. 20 is a schematic diagram explaining the shape of polarization charges in a composition ratio gradient region in a third light guide layer of a semiconductor light emitting element according to Embodiment 2.

Composition ratio gradient region 16a is disposed in a region which is in third light guide layer 16 and at the side of intermediate layer 17 in the semiconductor light emitting element according to this embodiment. In this embodiment, Mg is doped in composition ratio gradient region 16a. Hereinafter, impurity doping distributions in the semiconductor light emitting element according to this embodiment are described with reference to FIGS. 20 and 21. FIG. 20 is a schematic diagram for explaining formation of polarization charges in composition ratio gradient region 16a in third light guide layer 16 in the semiconductor light emitting element according to this embodiment. In FIG. 20, schematic diagram (a) schematically shows the band structure (that is, a band gap energy) of a near-interface region of composition ratio gradient region 16a in third light guide layer 16. In FIG. 20, schematic diagram (b) schematically shows a polarization charge distribution in the near-interface region of composition ratio gradient region 16a in third light guide layer 16. In FIG. 20, each of schematic diagrams (c) and (d) schematically shows an Mg doping profile of a near-interface region of composition ratio gradient region 16a in third light guide layer 16. The profile shown in schematic diagram (c) has a uniform Mg doping concentration in composition ratio gradient region 16a. The profile shown in schematic diagram (d) has a gradient Mg doping concentration in composition ratio gradient region 16a. More specifically, the Mg doping concentration increases from the active layer 15 side toward electron barrier layer 18 side in composition ratio gradient region 16a. Schematic diagram (e) schematically shows the conduction band structure in the near-interface region of composition ratio gradient region 16a in third light guide layer 16.

Figure 21:
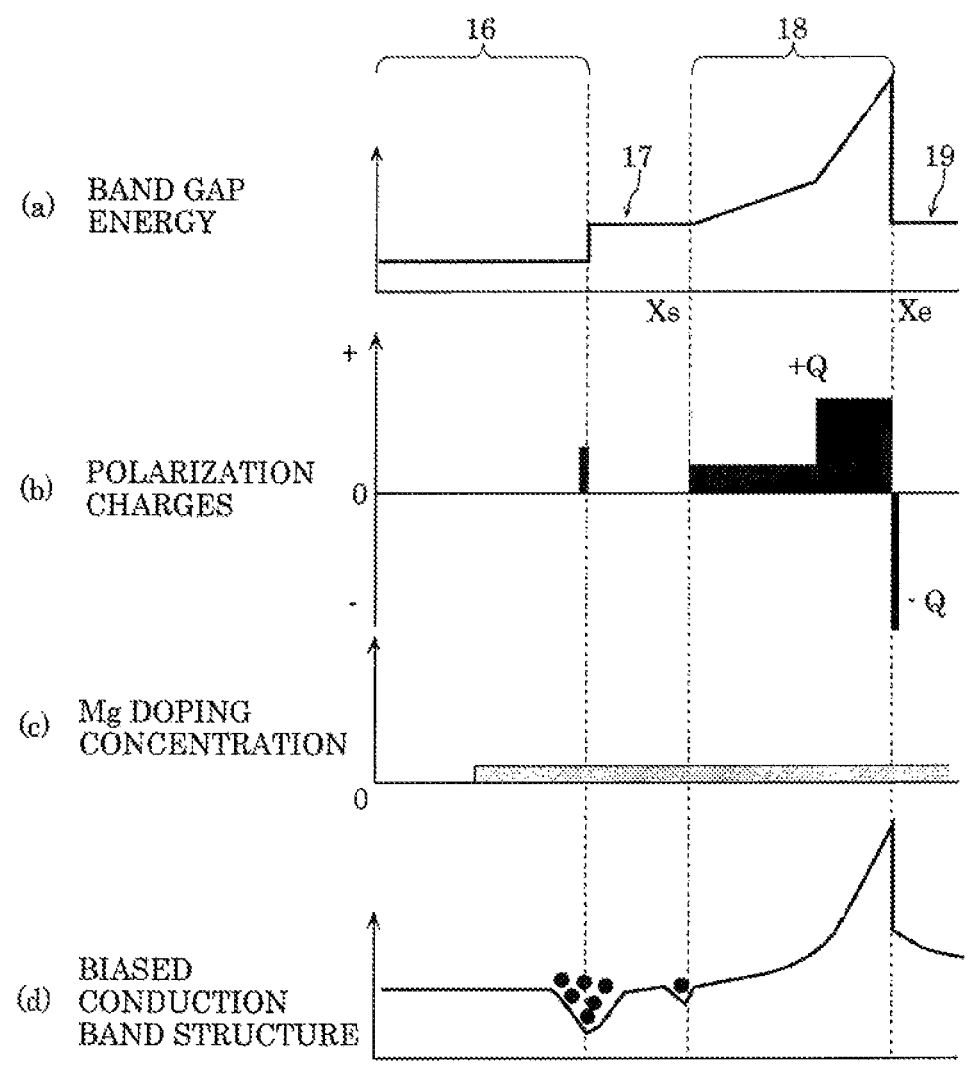
FIG. 21 is a schematic diagram explaining the shape of polarization charges in a third light guide layer of a semiconductor light emitting element according to Comparison Example 4.

FIG. 21 is a schematic diagram explaining formation of polarization charges in third light guide layer 16 of a semiconductor light emitting element according to Comparison Example 4. The semiconductor light emitting element according to Comparison Example 4 shown in FIG. 21 is different from the semiconductor light emitting element according to this embodiment in that third light guide layer 16 does not include a composition ratio gradient region, and the same in the other points. In FIG. 21, schematic diagram (a) schematically shows the band structure (that is, band gap energy) of a near-interface region in third light guide layer 16. In FIG. 21, schematic diagram (b) schematically shows a polarization charge distribution in the near-interface region in third light guide layer 16. In FIG. 21, schematic diagram (c) schematically shows an Mg doping profile of a near-interface region of composition ratio gradient region 16a which is at an end part of third light guide layer 16 and at the side of electron barrier layer 18. In the profile shown in schematic diagram (c), Mg is doped, in a uniform distribution, in the region which is in third light guide layer 16 and at the side of electron barrier layer 18. Schematic diagram (d) schematically shows the conduction band structure in the near-interface region in third light guide layer 16.

The semiconductor light emitting element according to this embodiment is configured to have composition ratio gradient region 16a which has a gradient In composition rate distribution and is located at the interface between intermediate layer 17 and third light guide layer 16. It is to be noted that the semiconductor light emitting element according to Comparison Example 4 does not have composition ratio gradient region 16a.

When third light guide layer 16 does not have composition ratio gradient region 16a, as shown in FIG. 21, positive polarization charges are formed at the interface between intermediate layer 17 and third light guide layer 16. For this reason, the shape of the band structure is changed to satisfy an electrical neutrality condition, and electrons are induced to the interface between intermediate layer 17 and third light guide layer 16. As a result, a concave as shown in schematic diagram (d) in FIG. 21 is generated in the band structure at the interface, the concave functions as a potential barrier against holes. For this reason, in the semiconductor light emitting element according to Comparison Example 4, the operation voltage increases.

In comparison, when third light guide layer 16 has composition ratio gradient region 16a, as shown in schematic diagram (b) in FIG. 20, positive polarization charges formed at the interface between intermediate layer 17 and third light guide layer 16 are dispersed in the entirety of composition ratio gradient region 16a at a small density. For this reason, as shown in schematic diagram (e) in FIG. 20, the change in shape of the band structure is little, which does not produce concaves as shown in FIG. 21. For this reason, it is possible to reduce increase in operation voltage of the semiconductor light emitting element.

Furthermore, doping Mg in composition ratio gradient region 16a makes it possible to increase the hole concentration in active layer 15, and further reduce the operation voltage.

As shown in schematic diagram (c) in FIG. 20, doping Mg in composition ratio gradient region 16a at a uniform concentration increases electricity conductivity of holes in their light guide layer 16, which reduces the operation voltage.

In addition, as shown in schematic diagram (d) in FIG. 20, configuring the semiconductor light emitting element to have composition ratio gradient region 16a having a gradient concentration which decreases at the active layer 15 side makes it possible to reduce occurrence of free carrier losses incurred by light distributed in third light guide layer 16. Thus, it is possible to reduce operation voltages and reduce increase in waveguide losses.

Figure 22A:
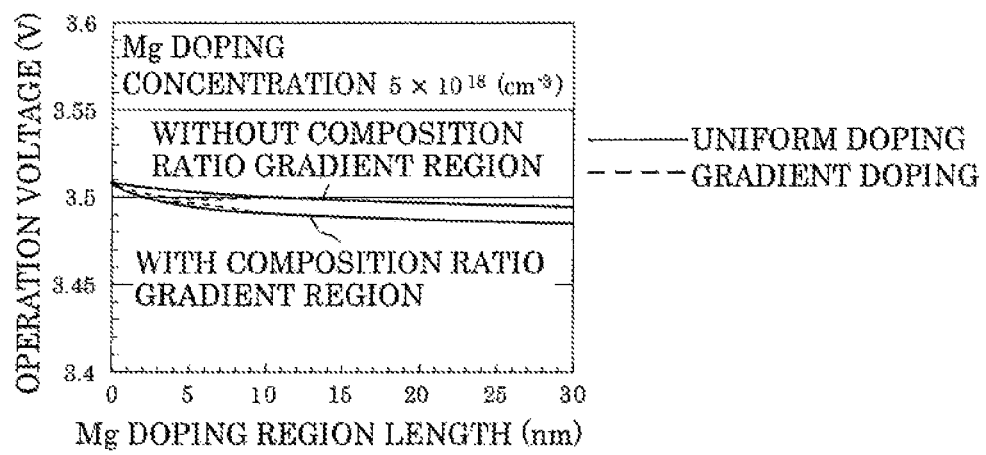
FIG. 22A is a graph showing an Mg doping region length dependencies with respect to operation voltages of the semiconductor light emitting element according to Embodiment 2 in each of the cases where Mg doping concentrations are $5 \times 10^{18}$ cm$^{-3}$, $1 \times 10^{19}$ cm$^{-3}$, or $2 \times 10^{19}$ cm$^{-3}$.
Figure 22B:
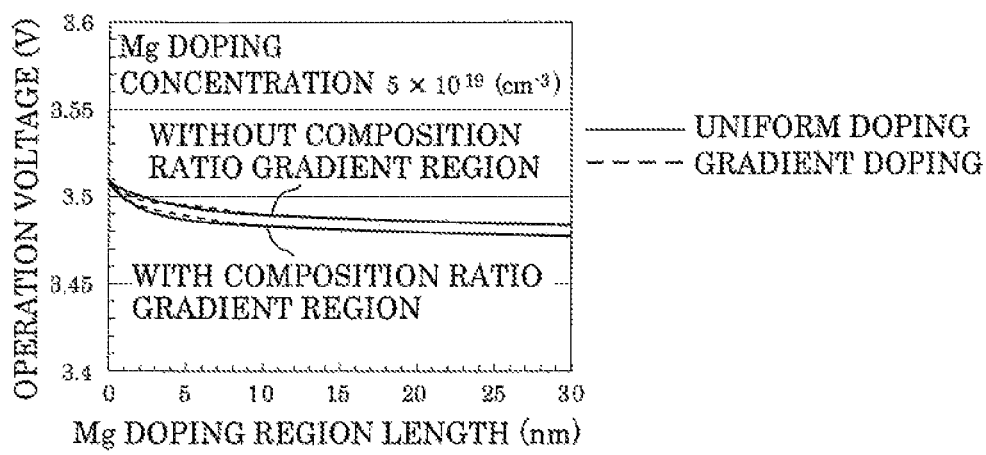
FIG. 22B is a graph showing an Mg doping region length dependencies with respect to operation voltages of the semiconductor light emitting element according to Embodiment 2 in each of the cases where Mg doping concentrations are $5 \times 10^{18}$ cm$^{-3}$, $1 \times 10^{19}$ cm$^{-3}$, or $2 \times 10^{19}$ cm$^{-3}$.
Figure 22C:
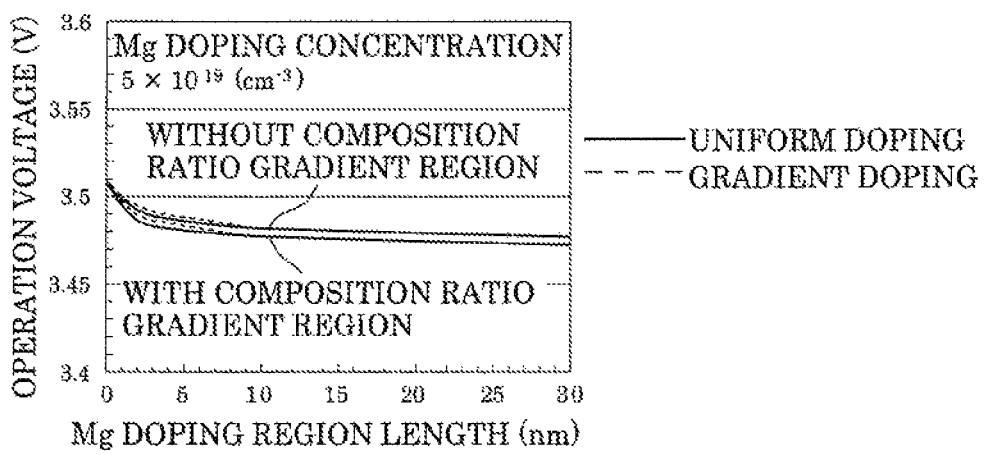
FIG. 22C is a graph showing an Mg doping region length dependencies with respect to operation voltages of the semiconductor light emitting element according to Embodiment 2 in each of the cases where Mg doping concentrations are $5 \times 10^{18}$ cm$^{-3}$, $1 \times 10^{19}$ cm$^{-3}$, or $2 \times 10^{19}$ cm$^{-3}$.

Here, effects provided by composition ratio gradient region 16a are described with reference to FIGS. 22A to 22C. FIGS. 22A, 22B, and 22C are graphs showing Mg doping region length dependencies with respect to operation voltages of semiconductor light emitting element according to this embodiment in the case where Mg doping concentrations are $5 \times 10^{18}$ cm$^{-3}$, $1 \times 10^{19}$ cm$^{-3}$, and $2 \times 10^{19}$ cm$^{-3}$, respectively. Each diagram shows calculation results of operation voltages in operations at 300 mA in the case where there is composition ratio gradient region 16a and in the case where there is no composition ratio gradient region 16a. When changing the Mg doping region length in the case where there is composition ratio gradient region 16a, the film thickness of composition ratio gradient region 16a is changed so that the Mg doping region and the composition ratio gradient region have the same film thickness. In addition, in each diagram, each of the solid lines shows a case in which Mg doping is performed in composition ratio gradient region 16a at a uniform concentration, and each of dotted lines shows a case in which gradient doping of a low Mg doping concentration is performed at the active layer 15 side.

As known from FIGS. 22A to 22C, the operation voltage is reduced by approximately 0.01 V more significantly when the Mg doping concentration is increased. In addition, the operation voltage is reduced as the Mg doping region length becomes longer, but excessively increasing the Mg doping region length increases waveguide losses. When the Mg doping concentration is $5 \times 10^{18}$ cm$^{-3}$, it is possible to obtain an operation voltage reduction effect as long as the Mg doping region length is approximately 10 nm. When the Mg doping concentration is $1 \times 10^{18}$ cm$^{-3}$, it is possible to obtain an operation voltage reduction effect as long as the Mg doping region length is approximately 5 nm.

When the Mg doping concentration is $2 \times 10^{18}$ cm$^{-3}$, it is possible to obtain an operation voltage reduction effect as long as the Mg doping region length is approximately 3 nm.

In addition, the operation voltage reduction effects are almost equivalent between when uniform doping is performed in composition ratio gradient region 16a and when gradient doping is performed. Accordingly, in terms of reduction in increase in waveguide losses, gradient Mg doping is performed in composition ratio gradient region 16a.

Mg doping in composition ratio gradient region 16a provides not only the effect of reducing the operation voltage but also the effect of increasing hole electricity conductivity at lower operation voltage. For this reason, Mg doping in composition ratio gradient region 16a is extremely important in terms of increase in temperature characteristics in high-output operations at a Watt-class high temperature and guarantee of long term operation reliability.

In addition, study is given of a case in which the In composition ratio at the electron barrier layer 18 side in composition ratio gradient region 16a is changed to the value which is the same as In composition ratio (that is, In composition ratio of 0) of intermediate layer 17 including p-type GaN. In this case, performing Mg doping at the interface with composition ratio gradient region 16a as described above creates p-type GaN at the interface of composition ratio gradient region 16a at the side of electron barrier layer 18. Thus, an intermediate layer of a second conductivity type including p-type GaN layer is not always necessary.

[2-3. Impurity Doping Configuration in Barrier Layer]

Next, a description is given of an impurity doping structure in barrier layer 15a in active layer 15 according to this embodiment.

The semiconductor light emitting element according to this embodiment includes an n-type impurity doped region at least in barrier layer 15a or at the interface between second light guide layer 14 and barrier layer 15a. In this way, cancelling the influence of negative polarization charges which are generated at the interface between second light guide layer 14 and barrier layer 15a and reduces the potential of the valence band in barrier layer 15a makes it possible to uniform the shape of the valence band structure in well layer 15d. In this way, it is possible to increase the uniformity of the shape of a quantum wave function to be formed in two layers which are well layer 15b and well layer 15d. For this reason, it is possible to increase amplification gains by approximating the wavelengths at which the highest amplification gains are to be obtained in the respective well layers. In this way, it is possible to reduce the oscillation threshold current value necessary for laser oscillation.

Furthermore, performing impurity doping according to this embodiment makes it possible to reduce occurrence of hole overflows in which holes leak to the first light guide layer. For this reason, it is possible to increase temperature characteristics of the semiconductor light emitting element.

Here, impurity doping according to this embodiment is described with reference to FIG. 23. FIG. 23 is a schematic diagram illustrating an aspect of impurity doping according to this embodiment. In FIG. 23, schematic diagram (a) shows polarization charges per unit volume to be formed at the interface between the layers in active layer 15. Schematic diagram (b) shows the band structure in a near-interface region in active layer 15. Schematic diagram (c) shows an impurity doping profile in the case where doping is performed in barrier layer 15a. Schematic diagram (d) shows an impurity doping profile in the case where doping is performed at the interface between barrier layer 15a and second light guide layer 14.

As illustrated in schematic diagrams (c) and (d) in FIG. 23, the semiconductor light emitting element according to this embodiment is configured to include an n-type impurity doped region at least in barrier layer 15a or at the interface between second light guide layer 14 and barrier layer 15a. In this embodiment, Si is doped as an impurity.

Figure 24:
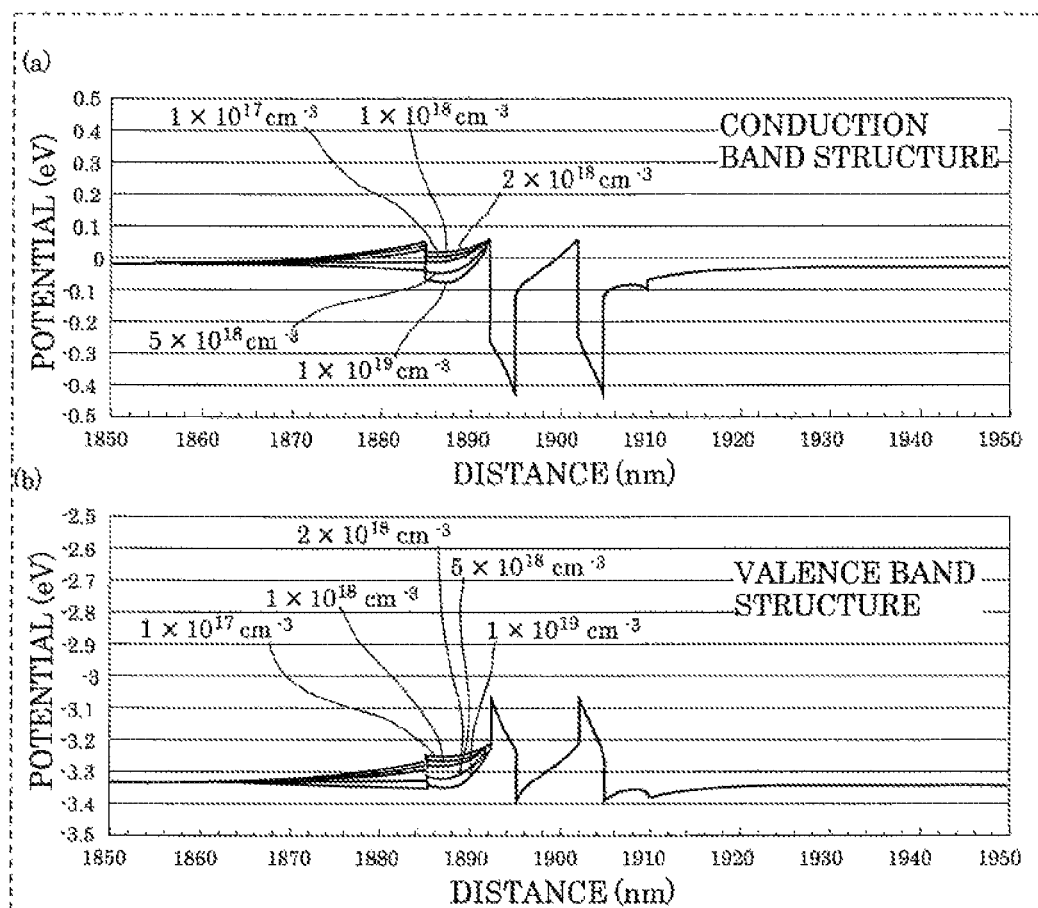
FIG. 24 includes graphs showing a conduction band structure and a valence band structure in the case where Si is doped in a barrier layer in the semiconductor element according to Embodiment 2.

Next, impurity doping effects according to this embodiment is described with reference to FIGS. 24 and 25. FIG. 24 includes graphs indicating a conduction band structure and a valence band structure in the case where Si is doped in barrier layer 15a in a semiconductor element according to this embodiment. In FIG. 24, graph (a) shows calculation results of doping concentration dependencies of the conduction band structure, and graph (b) shows calculation results of doping concentration dependencies of the valence band structure.

The band structures change to satisfy an electrical neutrality condition at the interface, due to negative polarization charges which are generated at the interface between second light guide layer 14 and barrier layer 15a. Furthermore, holes are generated due to negative polarization charges. Accordingly, the potential of the interface increases. For this reason, compensating negative polarization charges which are generated at the interface between second light guide layer 14 and barrier layer 15a makes it possible to reduce increase in the valence band potential. Therefore, it is effective to dope the n-type impurity in the near-interface region.

As illustrated in graph (b) in FIG. 24, increasing the concentration of Si to be doped in barrier layer 15a reduces the potential of the valence band structure in barrier layer 15a, which uniforms the shapes of the valence band structures of well layer 15b and well layer 15d. In addition, increase in the potential barrier of the valence band which is in barrier layer 15a and at the side of second light guide layer 14 makes it possible to prevent or reduce expansion of a hole wave function to the second light guide layer 14 side. In this way, the cross correlations between electrons and hole wave functions are increased. This makes it possible to increase amplification gains to injected carriers in well layer 15b, which enables reduction in the oscillation threshold current value. In addition, it is possible to reduce hole overflows in which holes leak to the second light guide layer 14 side. For this reason, it is possible to increase temperature characteristics of the semiconductor light emitting element.

The effect of increasing the potential barrier of the valence band at the second light guide layer 14 side becomes large as the concentration of Si doped in barrier layer 15a becomes large. As known from the results shown in graph (b) in FIG. 24, when concentration of Si doped is at $5\times10^{18}$ $cm^{-3}$ or more, the potential barrier of the valence band increases, and also it is possible to sufficiently increase the uniformity of the valence band structures of well layer 15b and well layer 15d.

Figure 25:
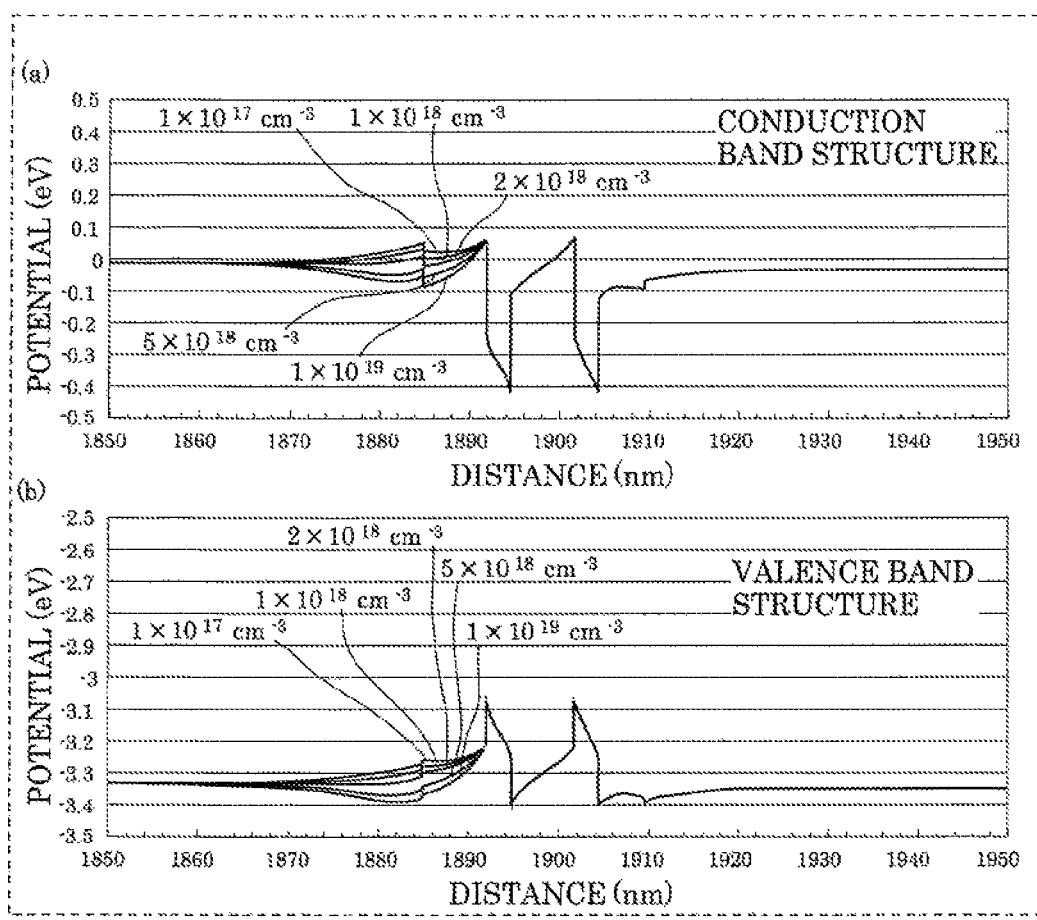
FIG. 25 includes graphs showing a conduction band structure and a valence band structure in the case where Si is doped at the interface between the barrier layer and a second light guide layer in the semiconductor element according to Embodiment 2.

FIG. 25 includes graphs indicating a conduction band structure and a valence band structure in the case where Si is doped at the interface between barrier layer 15a and second light guide layer 14 in a semiconductor element according to this embodiment. In FIG. 25, graph (a) shows calculation results of doping concentration dependencies of the conduction band structure, and graph (b) shows calculation results of doping concentration dependencies of the valence band structure. In this simulation, Si is doped in a region within ±5 nm from the interface between barrier layer 15a and second light guide layer 14.

As shown in graph (b) in FIG. 25, increasing concentration of Si to be doped at the interface between barrier layer 15a and second light guide layer 14 reduces the potential of the valence band structure in barrier layer 15a, which uniforms the shapes of the valence band structures of well layer 15b and well layer 15d. In addition, increase in the potential barrier of the valence band which is in barrier layer 15a and at the side of second light guide layer 14 makes it possible to prevent or reduce expansion of a hole wave function to the second light guide layer 14 side. In this way, the cross correlations between electrons and hole wave functions are increased. This enables increase in amplification gains to injected carrier in well layer 15b, and thus it is possible to reduce the oscillation threshold current value. In addition, it is possible to reduce hole overflows in which holes leak to the second light guide layer 14 side.

Comparison with graph (b) in FIG. 24 and graph (b) in FIG. 25 shows that, as the hole overflow reduction effect, also the potential of the valence band of second light guide layer 14 decreases more significantly when Si is doped at the interface between barrier layer 15a and second light guide layer 14. For this reason, it is possible to increase the effect of preventing or reducing expansion of a hole wave function to second light guide layer 14 and the effect of reducing hole overflows.

The effect of increasing the potential barrier of the valence band at the second light guide layer 14 side becomes large as the concentration of Si doped at the interface between barrier layer 15a and second light guide layer 14 becomes large. However, the result in graph (b) in FIG. 25 shows that, in the case of $5\times10^{18}$ $cm^{-3}$ or more, the potential barrier of the valence band increases, and it is possible to sufficiently increase the uniformity of the valence band structures of well layer 15b and well layer 15d.

Embodiment 3

A semiconductor light emitting element according to Embodiment 3 is described. The semiconductor light emitting element according to this embodiment is different from the semiconductor light emitting element according to Embodiment 2 in the configurations of a barrier layer in active layer 15. Hereinafter, the semiconductor light emitting element according to this embodiment is described mainly focusing on differences from the semiconductor light emitting element according to Embodiment 2.

In the semiconductor light emitting element according to this embodiment, each of barrier layer 15a, barrier layer 15c, and barrier layer 15e includes not InGaN having an In composition ratio of 0.04 but GaN without In.

Forming each barrier layer to include GaN without In makes it possible to enlarge the valence band barrier in each well layer. However, even in this structure, the band structures change to satisfy an electrical neutrality condition at the interface, due to negative polarization charges which are generated at the interface between second light guide layer 14 and barrier layer 15a. Furthermore, holes are generated due to negative polarization charges. Accordingly, the potential of the interface increases. For this reason, compensating negative polarization charges which are generated at the interface between second light guide layer 14 and barrier layer 15a makes it possible to reduce increase in the valence band potential. Therefore, it is effective to dope the n-type impurity in the near-interface region.

For this reason, the semiconductor light emitting element according to this embodiment includes an n-type impurity doped region at least in barrier layer 15a or at the interface between second light guide layer 14 and barrier layer 15a.

In this way, it is possible to increase amplification gains of the semiconductor light emitting element and reduce the oscillation threshold current value necessary for laser oscillation, as in Embodiment 2. In addition, it is possible to reduce hole overflows in which holes leak to second light guide layer 14 side. For this reason, it is possible to increase temperature characteristics of the semiconductor light emitting element.

Figure 26:
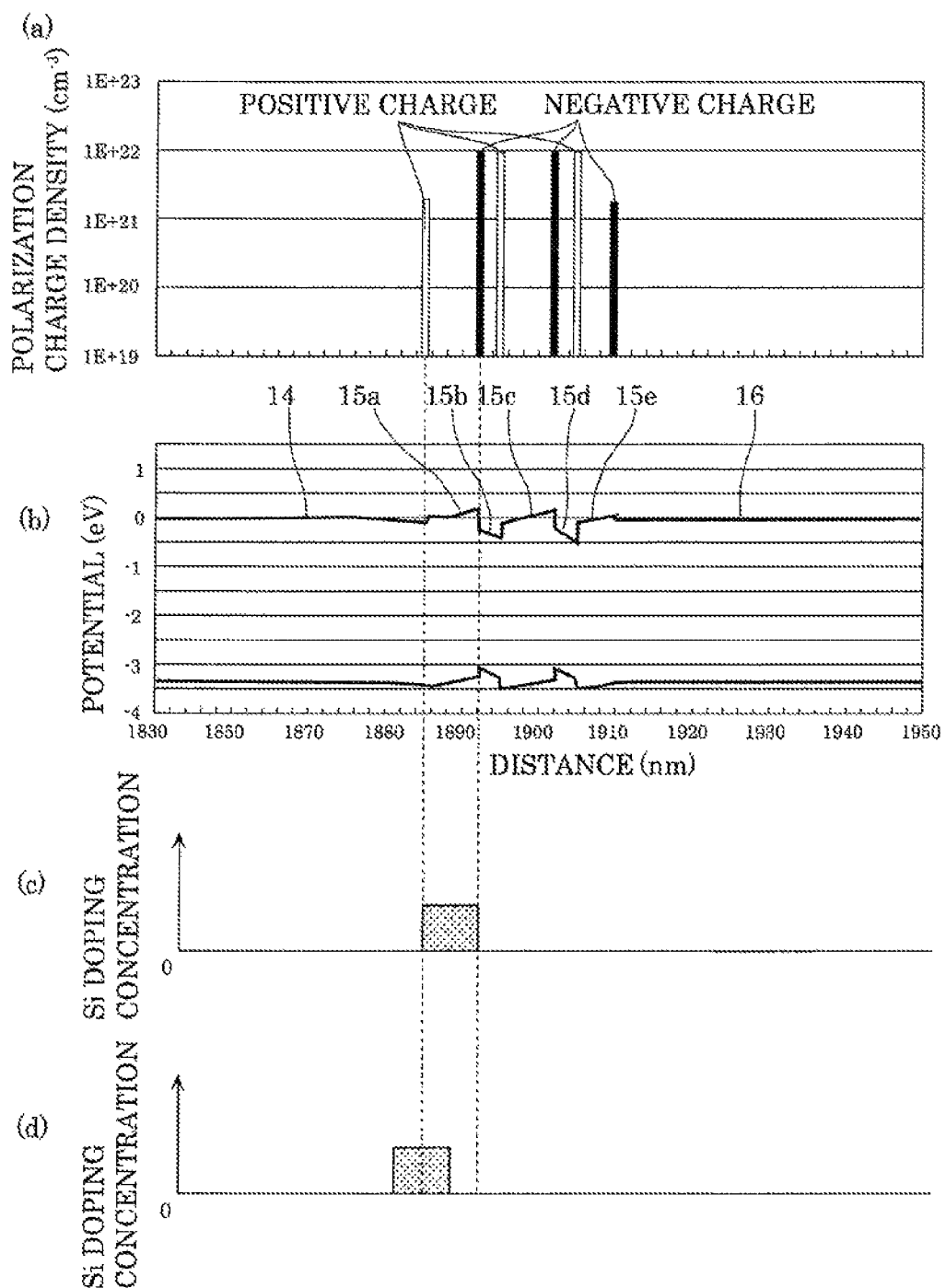
FIG. 26 is a schematic diagram illustrating an aspect of impurity doping according to Embodiment 3.

Here, impurity doping according to this embodiment is described with reference to FIG. 26. FIG. 26 is a schematic diagram illustrating an aspect of impurity doping according to this embodiment. In FIG. 26, schematic diagram (a) shows polarization charges per unit volume to be formed at the interface between the layers in active layer 15. Schematic diagram (b) shows the band structure in a near-interface region in active layer 15. Schematic diagram (c) shows an impurity doping profile in the case where doping is performed in barrier layer 15a. Diagram (d) shows an impurity doping profile in the case where doping is performed at the interface between barrier layer 15a and second light guide layer 14.

As illustrated in schematic diagrams (c) and (d) in FIG. 26, the semiconductor light emitting element according to this embodiment is configured to include an n-type impurity doped region at least in barrier layer 15a or at the interface between second light guide layer 14 and barrier layer 15a. In this embodiment, Si is doped as an impurity.

Figure 27:
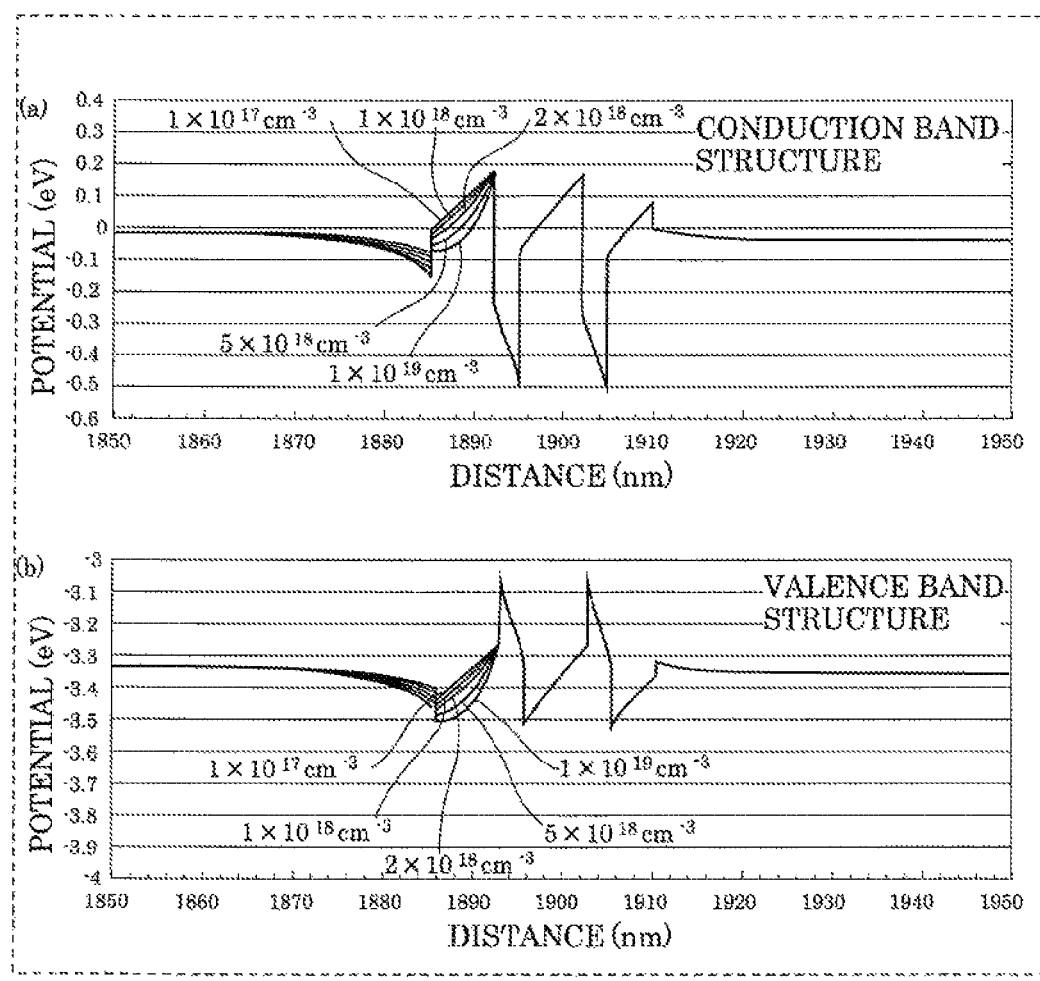
FIG. 27 includes graphs showing a conduction band structure and a valence band structure in the case where Si is doped in a barrier layer in a semiconductor element according to Embodiment 3.

Next, impurity doping effects according to this embodiment is described with reference to FIGS. 27 and 28. FIG. 27 includes graphs indicating a conduction band structure and a valence band structure in the case where Si is doped in barrier layer 15a in a semiconductor element according to this embodiment. In FIG. 27, graph (a) shows calculation results of doping concentration dependencies of the conduction band structure, and graph (b) shows calculation results of doping concentration dependencies of the valence band structure.

As illustrated in graph (b) in FIG. 27, increasing concentration of Si to be doped in barrier layer 15a reduces the potential of the valence band structure in barrier layer 15a, which uniforms the shapes of the valence band structures of well layer 15b and well layer 15d. In addition, increase in the potential barrier of the valence band which is in barrier layer 15a and at the side of second light guide layer 14 makes it possible to prevent or reduce expansion of a hole wave function to the second light guide layer 14 side. In this way, the cross correlations between electrons and hole wave functions are increased. This makes it possible to increase amplification gains to injected carriers in well layer 15b, which enables reduction in the oscillation threshold current value. In addition, it is possible to reduce hole overflows in which holes leak to the second light guide layer 14 side. For this reason, it is possible to increase temperature characteristics of the semiconductor light emitting element.

The effect of increasing the potential barrier of the valence band at the second light guide layer 14 side becomes large as concentration of Si doped in barrier layer 15a becomes large. As known from the results shown in graph (b) in FIG. 27, when concentration of Si to be doped is at $5 \times 10^{18}$ cm$^{-3}$ or more, the potential barrier of the valence band increases, and also it is possible to sufficiently increase the uniformity of the valence band structures of well layer 15b and well layer 15d.

Figure 28:
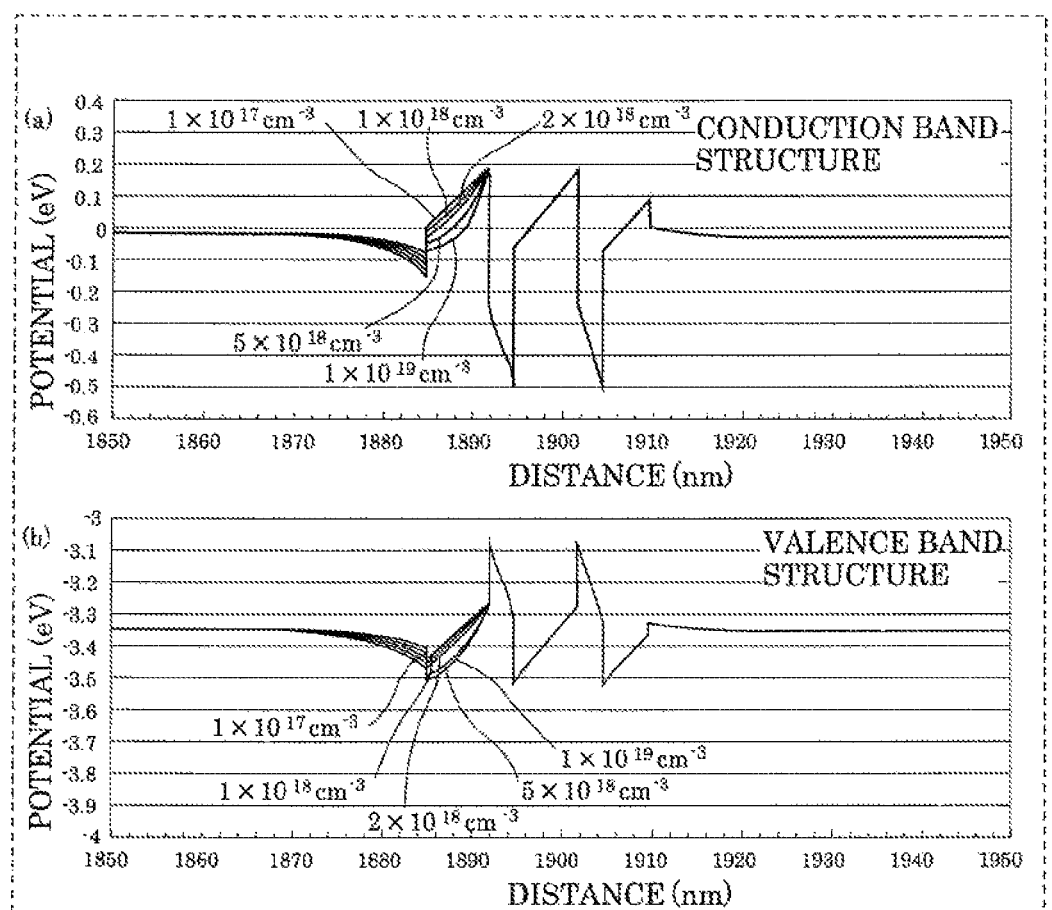
FIG. 28 includes graphs showing a conduction band structure and a valence band structure in the case where Si is doped at the interface between the barrier layer and a second light guide layer in the semiconductor element according to Embodiment 3.

FIG. 28 includes graphs indicating a conduction band structure and a valence band structure in the case where Si is doped at the interface between barrier layer 15a and second light guide layer 14 in a semiconductor light emitting element according to this embodiment. In FIG. 28, graph (a) shows calculation results of doping concentration dependencies of the conduction band structure, and graph (b) shows calculation results of doping concentration dependencies of the valence band structure. In this simulation, Si is doped in a region within ±5 nm from the interface between barrier layer 15a and second light guide layer 14.

As shown in graph (b) in FIG. 28, increasing the concentration of Si to be doped at the interface between barrier layer 15a and second light guide layer 14 reduces the potential of the valence band structure in barrier layer 15a, which uniforms the shapes of the valence band structures of well layer 15b and well layer 15d. In addition, increase in the potential barrier of the valence band which is in barrier layer 15a and at the side of second light guide layer 14 makes it possible to prevent or reduce expansion of a hole wave function to the second light guide layer 14 side. In this way, the cross correlations between electrons and hole wave functions are increased. This enables increase in amplification gains to injected carrier in well layer 15b, and thus it is possible to reduce the oscillation threshold current value. In addition, it is possible to reduce hole overflows in which holes leak to the second light guide layer 14 side.

By comparison between graph (b) in FIG. 27 and graph (b) in FIG. 28, as the hole overflow reduction effects, a higher effect of decreasing the potential of the valence band is obtained when Si is doped in barrier layer 15a because the band gap energy in barrier layer 15a is large. For this reason, it is possible to increase the effect of preventing or reducing expansion of hole wave functions to second light guide layer 14 and the effect of reducing hole overflows.

The effect of increasing the potential barrier of the valence band at the second light guide layer 14 side becomes large as the concentration of Si doped at the interface between barrier layer 15a and second light guide layer 14 becomes large. As known from the results shown in graph (b) in FIG. 28, when the concentration of Si doped is at $5 \times 10^{18}$ cm$^{-3}$ or more, the potential barrier of the valence band increases, and also it is possible to sufficiently increase the uniformity of the valence band structures of well layer 15b and well layer 15d.

Each of Embodiments 2 and 3 describes the result of doping an impurity in at least one of (i) the interface between barrier layer 15a and second light guide layer 14 and (ii) barrier layer 15a. However, doping an impurity in the both makes it possible to increase the effect of preventing or reducing expansion of a hole wave function to second light guide layer 14 and the effect of reducing hole overflows.

Embodiment 4

A semiconductor light emitting element according to Embodiment 4 is described. The semiconductor light emitting element according to this embodiment is different from semiconductor light emitting element 100 according to Embodiment 1 in that impurity doping is performed at the interface between first semiconductor layer 12 and first light guide layer 13 and the interface between first light guide layer 13 and second light guide layer 14. Hereinafter, the semiconductor light emitting element according to this embodiment is described mainly focusing on differences from semiconductor light emitting element 100 according to Embodiment 1.

Figure 29:
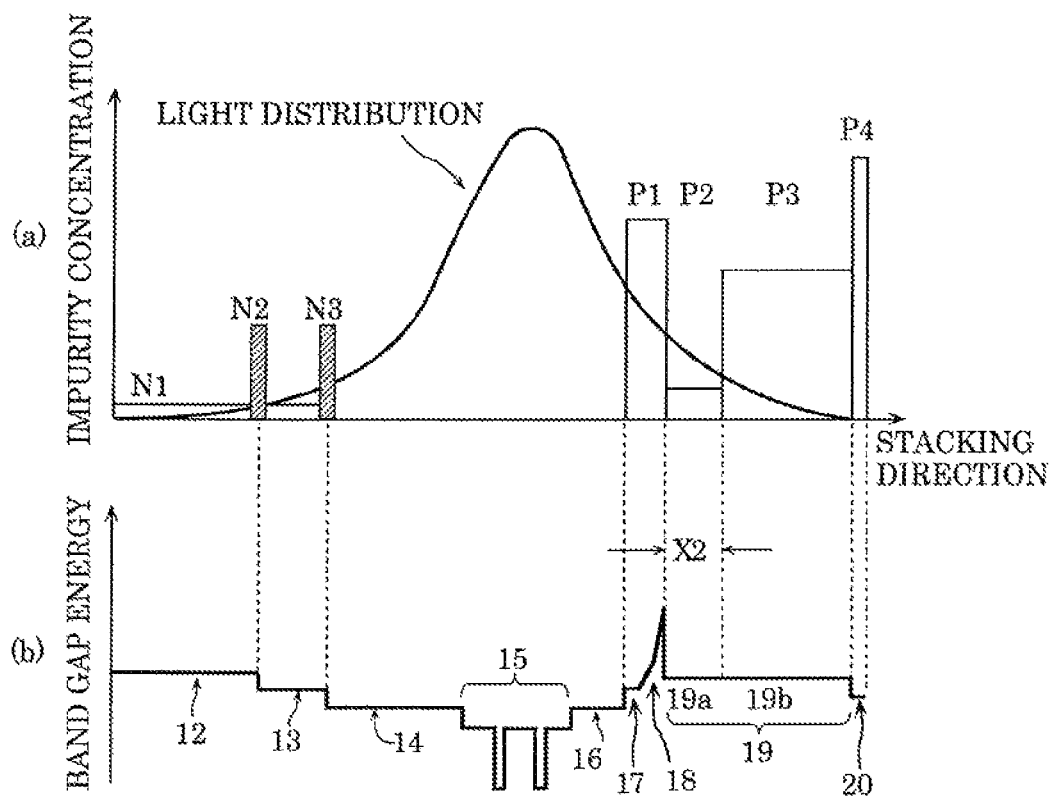
FIG. 29 is a schematic diagram indicating a relationship between an impurity doping profile and a band gap energy distribution of a semiconductor light emitting element according to Embodiment 4.

FIG. 29 is a schematic diagram indicating a relationship between an impurity doping profile of a semiconductor light emitting element and a band gap energy distribution according to this embodiment. In FIG. 29, schematic diagram (a) shows an impurity doping profile of the semiconductor light emitting element according to this embodiment, and (b) shows a band gap energy distribution of the semiconductor light emitting element according to this embodiment.

As illustrated in FIG. 29, the semiconductor light emitting element according to this embodiment has a structure obtained by, in the semiconductor light emitting element according to Embodiment 1, further doping an n-type impurity including Si to the region within ±5 nm from the interface between first semiconductor layer 12 and first light guide layer 13 and the region within ±5 nm from the interface between first light guide layer 13 and second light guide layer 14 at relatively high concentrations of N2 and N3, respectively. In first semiconductor layer 12 and first light guide layer 13, the doping concentration of an n-type impurity including Si in a region in which doping at a relatively high concentration has not been performed is assumed to be N1 (=$1\times10^{18}$ cm$^{-3}$).

Performing doping in this way changes the shape of the band due to holes electrically induced to negative polarization charges at each interface, which enables prevention of occurrence of a spike-shaped potential barrier at the interface. In addition, since the regions in which high-concentration doping has been performed are narrow, it is possible to reduce waveguide losses. As a result, it is possible to achieve further reduction in operation voltage while maintaining a low waveguide loss value.

Figure 30:
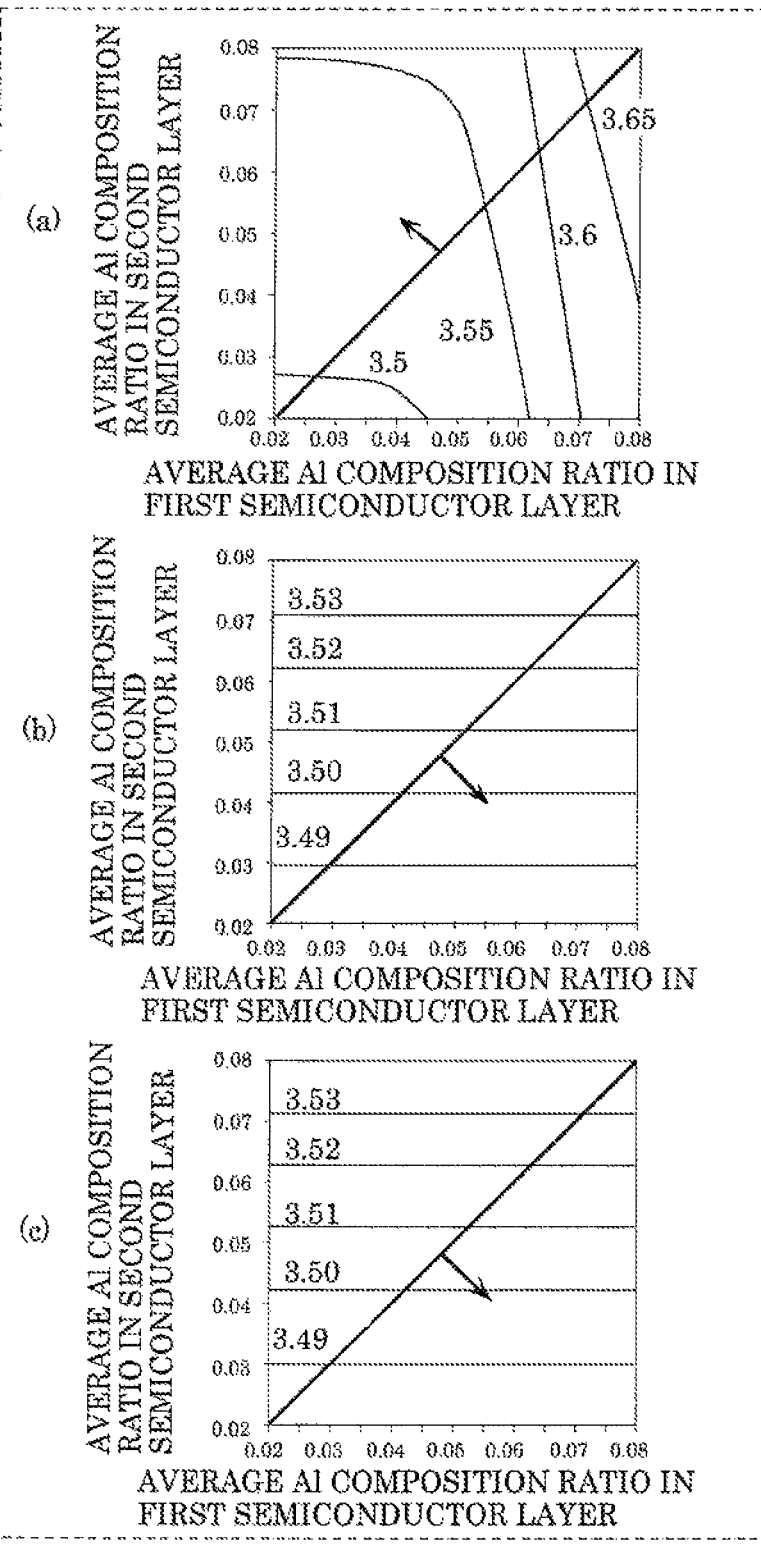
FIG. 30 includes graphs showing calculation results of Al composition ratio dependencies in a first semiconductor layer and a second semiconductor layer with respect to operation voltages in operations at 300 mA in the semiconductor light emitting element according to Embodiment 4.

Next, impurity doping effects according to this embodiment is described with reference to FIG. 30. FIG. 30 includes graphs showing calculation results of Al composition ratio dependencies of first semiconductor layer 12 and second semiconductor layer 19 with respect to operation voltages in operations at 300 mA in the semiconductor light emitting element according to this embodiment. The lines assigned with numerals in each graph show coordinates in the case of a same operation voltage, and the numerals assigned to the lines show operation voltages. In FIG. 30, graphs (a), (b), and (c) show calculation results in the cases where Si of $1\times10^{18}$ cm$^{-1}$, $5\times10^{18}$ cm$^{-1}$, and $1\times10^{19}$ cm$^{-1}$ is doped, respectively, at both the interface between first semiconductor layer 12 and first light guide layer 13 and the interface between first light guide layer 13 and second light guide layer 14.

When the concentration of Si doped at the interface is $1\times10^{18}$ cm$^{-1}$, increasing the Al composition ratio of first semiconductor layer 12 including n-type AlGaN to 0.04 or more increases the operation voltage. When the concentration of Si doped at the interface is $5\times10^{18}$ cm$^{-1}$ or more, increasing the Al composition ratio in first semiconductor layer 12 does not change the operation voltage. In view of this, doping Si of $5\times10^{18}$ cm$^{-1}$ or more at the interface makes it possible to prevent change in the shape of the band structure due to polarization charges that occur at the interface as long as the Al composition ratio is within the range of 0.08. This enables further reduction in operation voltage.

In the semiconductor light emitting element according to this embodiment, doping Si of $5\times10^{18}$ cm$^{-1}$ or more enables reduction in operation voltage in an operation at 300 mA by approximately 0.03 V.

Performing doping in this way changes the shape of the band due to holes electrically induced to negative polarization charges at each interface, which enables prevention of occurrence of a spike-shaped potential barrier at the interface.

When holes at the interfaces of the n-type layer changes the shape of the band, many electrons are present at the n-type region, and thus Auger no-light-emission recombination between electrons and holes becomes more likely to occur at the interfaces. The Auger no-light-emission recombination when occurred at each of the hetero interfaces locally increases the temperature in the region in the vicinity of the center of no-light-emission recombination. In this case, due to the difference in lattice constant, amplification of lattice defects becomes more likely to occur, which leads to decrease in reliability of the semiconductor light emitting element.

In order to prevent increase in waveguide loss and prevent Auger no-light-emission recombination from occurring at each hetero interface in the n-type semiconductor, it is effective to dope an impurity in the regions in the vicinity of the hetero interfaces at high concentration. In addition, it is only necessary that concentrations N2 and N3 are $5\times10^{18}$ cm$^{-1}$ or more, and thus concentrations N2 and N3 are not always the same.

In addition, the regions in which the impurity is to be doped at a high concentration are to be formed to generate opposite-polarity charges that cancel polarization charges at the hetero interfaces. Accordingly, it is also excellent that the impurity is doped in the hetero interface at a concentration of $5\times10^{18}$ cm$^{-3}$ or more, and that the concentration of the impurity doped in the region other than the hetero interface may decrease. In this case, the widths of regions including the impurity at a high concentration are equally narrowed. This reduces free carrier losses, which reduces waveguide losses. This results in reduction in operation current value and increase in temperature characteristics.

Embodiment 5

A semiconductor light emitting element according to Embodiment 5 is described. The semiconductor light emitting element according to this embodiment is different from semiconductor light emitting element 100 according to Embodiment 1 in the point of including a configuration for further reducing waveguide losses. Hereinafter, with reference to FIG. 31, the semiconductor light emitting element according to this embodiment is described mainly focusing on differences from semiconductor light emitting element 100 according to Embodiment 1.

Figure 31:
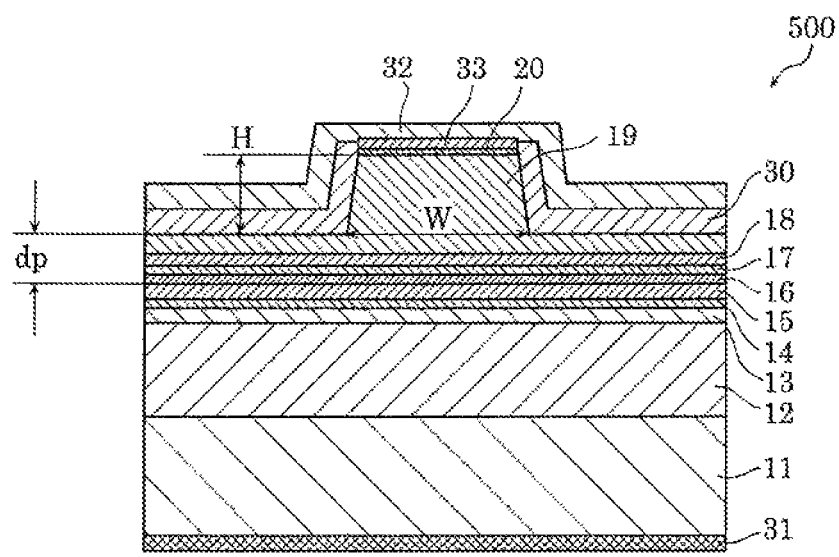
FIG. 31 is a schematic cross-sectional diagram illustrating a schematic configuration of a semiconductor light emitting element according to Embodiment 5.

FIG. 31 is a schematic cross-sectional diagram illustrating a schematic configuration of semiconductor light emitting element 500 according to this embodiment. As illustrated in FIG. 31, semiconductor light emitting element 500 according to this embodiment further includes conductive oxide film 33, in addition to the configuration of semiconductor light emitting element 100 according to Embodiment 1.

Conductive oxide film 33 is a film disposed between contact layer 20 on the ridge and p-side electrode 32. Conductive oxide film 33 is an oxide film which transmits visible light. Examples of conductive oxide film 33 include tin-doped indium oxide (ITO), GaN-doped zinc oxide, Al-doped zinc oxide, In- and Ga-doped zinc oxide.

In this case, forming conductive oxide film 33 having a low refractive index between contact layer 20 and p-side electrode 32 enables reduction in absorption losses of light that propagates in the waveguide in the p-side electrode. Furthermore, because of the low refractive index, a strong light confinement effect is obtained. Thus, even when forming a ridge shown in FIG. 31 to have a height of 0.45 µm or less, it is possible to reduce absorption losses which are generated by leakage of light to p-side electrode 32. Since the p-type AlGaN layer that forms the ridge has a refractive index higher than the refractive index of n-type AlGaN, reducing the ridge height H (the film thickness of second semiconductor layer 19 in the ridge part) is effective to reduce series resistance in semiconductor light emitting element 500.

In semiconductor light emitting element 500 according to this embodiment, an ITO layer having a film thickness of 0.2 µm is used as conductive oxide film 33.

Figure 32:
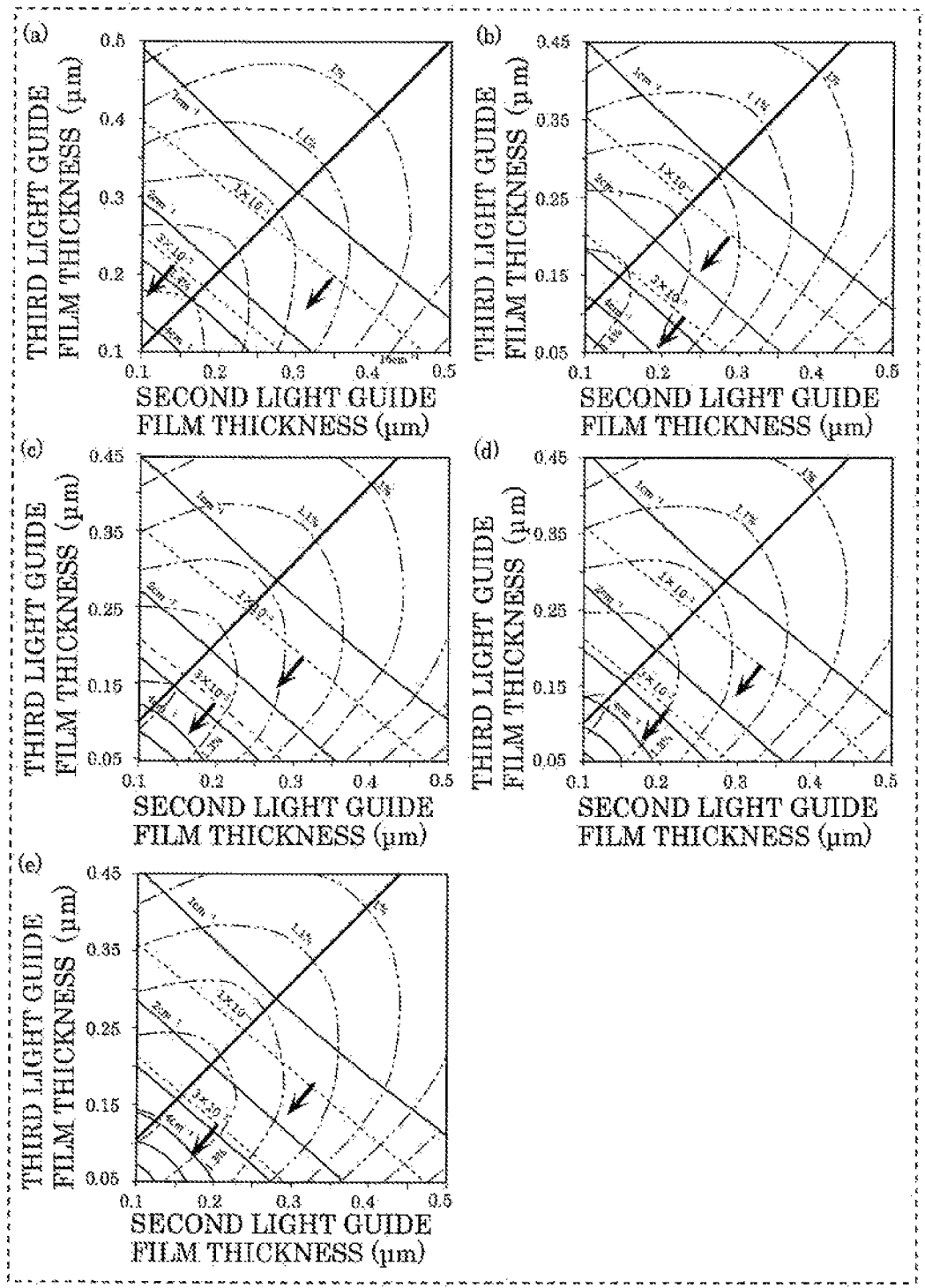
FIG. 32 includes graphs showing calculation results of light confinement coefficients and effective refractive index differences in the semiconductor light emitting element according to Embodiment 5.
Figure 33:
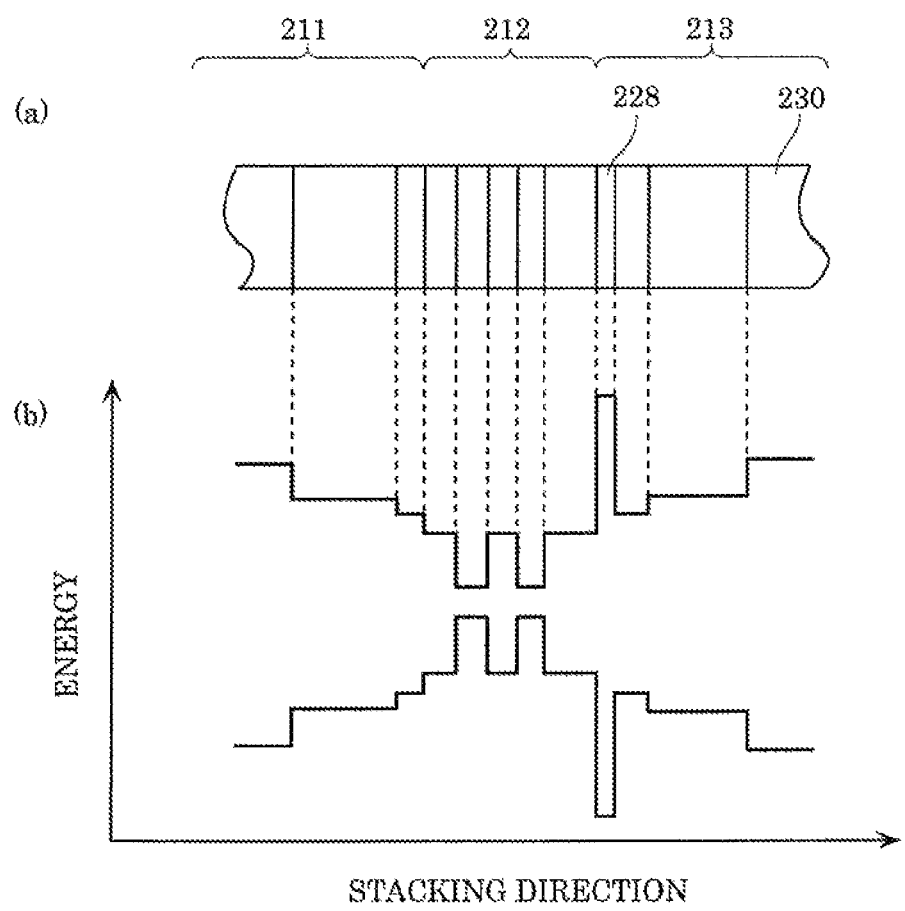
FIG. 33 is a schematic diagram illustrating a layer structure of a semiconductor light emitting element disclosed in Patent Literature 1.
Figure 34:
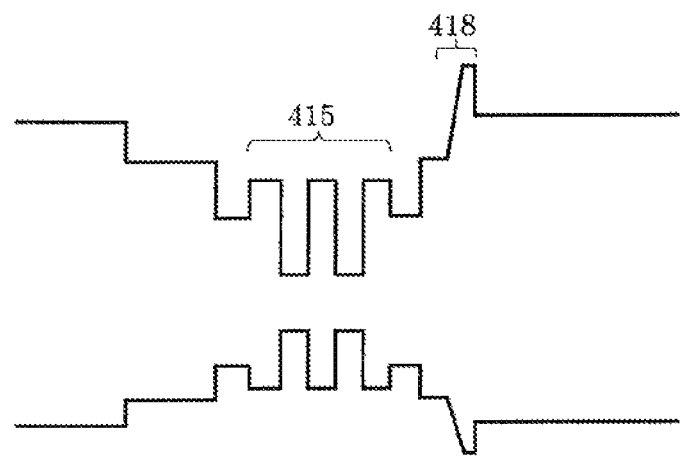
FIG. 34 is a schematic diagram illustrating a band structure distribution of a semiconductor light emitting element disclosed in Patent Literature 2.

Next, effects provided by semiconductor light emitting element 500 according to this embodiment is described with reference to FIG. 32. FIG. 32 includes graphs each indicating calculation results of light confinement coefficients and effective refractive index differences of semiconductor light emitting element 500 according to this embodiment. Graphs (a), (b), (c), (d), and (e) in FIG. 32 show calculation results in the cases where the ridge heights are 0.25 µm, 0.35 µm, 0.45 µm, 0.55 µm, and 0.65 µm, respectively. In FIG. 32, waveguide losses (indicated by solid lines in each graph), light confinement coefficients (indicated by chain double-dashed lines in each graph) in light distributions in the stacking direction to well layer 15*b* and well layer 15*d*, and differences ΔN (indicated by dotted lines) between effective refractive indices inside the ridge and effective refractive indices outside the ridge, using the film thicknesses of second light guide layer 14 and third light guide layer 16 as parameters.

The differences ΔN between the effective refractive indices inside the ridge and the effective refractive indices outside the ridge are differences between effective refractive indices in the light distributions in the stacking direction inside the ridge and effective refractive indices in the light distributions in the stacking direction outside the ridge. When ΔN is large, the light confinement in the horizontal direction (direction parallel to the stacking interface) inside and outside the ridge in the light distributions becomes large, and the light distributed in the horizontal direction is strongly confined inside the ridge. When ΔN is small, the highest order in a horizontal transverse mode in which light can propagate in the waveguide becomes small.

Assuming that a basic transverse mode having the lowest order is 0th order mode, nonlinearly bent line regions (kinks) are likely to occur in current-light output characteristics in a graph unless light of at least three kinds of high-order modes is present in the light distribution, which affects stability of light output power of the semiconductor light emitting element. Accordingly, in order to prevent cut-off of the high-order horizontal transverse mode which is a mode of at least second-order, there is a need to set an effective refractive index difference ΔN to a certain constant value or more.

When ridge width W is large, the highest order of the horizontal transverse mode to be cut off becomes large, which reduces required effective refractive index difference ΔN. When ridge width W is in a range from 10 µm to 30 µm, laser oscillation is unlikely to occur at the same time in the horizontal transverse modes of three kinds of different orders unless effective refractive index difference ΔN is $3\times10^{-3}$ or more. As long as effective refractive index difference ΔN is $1\times10^{-4}$ or more when ridge width W is 40 µm or more, laser oscillation occurs stably in the high-order horizontal transverse modes of second-order from at least the basic transverse mode, which reduces occurrence of kinks. When ridge width W is 50 µm or more, the order of the horizontal transverse mode in which light waves can be guided in the ridge stripe increases abruptly. When effective refractive index difference ΔN is larger than 0, laser oscillation occurs stably in the high-order horizontal transverse modes of second-order from at least the basic transverse mode.

Here, an ITO film as conductive oxide film 33 is formed between contact layer 20 and p-side electrode 32 on the ridge. In this case, as illustrated in FIG. 32, in order to achieve effective refractive index difference ΔN of $1\times10^{-4}$ or more in ridge height H in a range from 0.25 µm to 0.65 µm, inclusive, it is only necessary to form second light guide layer 14 and third light guide layer 16 having a total thickness of 0.45 µm or less. In addition, in order to achieve effective refractive index difference ΔN of $3\times10^{-3}$ or more in ridge height H in a range from 0.25 µm to 0.65 µm, inclusive, it is only necessary to form the second light guide layer and the third light guide layer having a total thickness of 0.3 µm or less. When ridge width W is 50 µm or more, the waveguide loss becomes smaller as the total thickness of second light guide layer 14 and third light guide layer 16 becomes larger. However, when the total thickness of second light guide layer 14 and third light guide layer 16 becomes large, the thickness of undoped regions in second light guide layer 14 and third light guide layer 16 also becomes large, which increases resistance. For this reason, it is also excellent to form the second light guide layer and the third light guide layer to have a total film thickness of 0.6 µm or less.

In addition, FIG. 32 shows that forming conductive oxide film 33 including ITO between contact layer 20 and p-side electrode 32 on the ridge does not increase waveguide losses even when the height of the ridge is reduced to 0.25 µm.

Forming conductive oxide film 33 between contact layer 20 and p-side electrode 32 on the ridge prevents abrupt increase in waveguide loss even when the height of the ridge is reduced to 0.35 µm. Thus, it is particularly effective to set the ridge height to be in a range from 0.25 µm to 0.45 µm, inclusive, because it is possible to reduce series resistance of the semiconductor light emitting element.

Semiconductor light emitting element 500 according to this embodiment is obtained by forming, in semiconductor light emitting element 100 according to Embodiment 1, conductive oxide film 33 including an ITO and having a film thickness of 0.2 µm. Semiconductor light emitting element 500, when configured to include a ridge having height H of 0.25 µm, and include second light guide layer 14 and third light guide layer 16 having a total film thickness of 0.25 µm, can achieve a reduced waveguide loss of 1.6 cm$^{-1}$. In semiconductor light emitting element 500, effective refractive index difference ΔN is approximately as small as $1\times10^{-3}$, and thus it is possible to reduce kinks in current-light output characteristics when ridge width W is 40 µm or more.

In addition, also the semiconductor light emitting element according to Embodiment 1, when configured to include a ridge having height H of 0.45 µm and include the second light guide layer and the third light guide layer having a total film thickness of 0.25 µm, is capable of achieving waveguides in which losses are reduced significantly to 1.8 cm$^{-1}$ and 2 cm$^{-1}$ or less. Also in this configuration, effective refractive index difference ΔN is approximately as small as $1\times10^{-3}$, and thus it is possible to reduce kinks in current-light output characteristics when ridge width W is 40 µm or more.

In addition, forming conductive oxide film 33 including ITO between contact layer 20 and p-side electrode 32 on the ridge, waveguide losses are reduced to 3 cm$^{-1}$ or less when ridge height H is in a range from 0.25 µm to 0.65 µm and the total film thickness of the second light guide layer and the third light guide layer is 0.3 µm or more. When the total film thickness of second light guide layer 14 and third light guide layer 16 is 0.39 µm or more, the waveguide losses are reduced to 2 cm$^{-1}$ or less. When ridge width W is 50 µm or more, kinks are less likely to occur although effective refractive index ΔN becomes small. When the total film thickness of the second light guide layer and the third light guide layer is 0.5 µm or more, it is possible to achieve a waveguide that provides a super low loss of 1.5 cm$^{-1}$ or less.

Alternatively, when any conductive oxide film including ITO is not formed between contact layer 20 and p-side electrode 32 on the ridge, the waveguide loss is calculated to be 4 cm$^{-1}$ or less in the same manner as described above when the total film thickness of second light guide layer 14 and third light guide layer 16 is 0.31 µm or more when ridge height H is in a range from 0.45 µm to 0.65 µm, inclusive. In addition, the waveguide loss is 3 cm$^{-1}$ or less when the total film thickness of second light guide layer 14 and third light guide layer 16 is 0.36 µm or more, and the waveguide loss is 2 cm$^{-1}$ or less when the total film thickness of second light guide layer 14 and third light guide layer 16 is 0.4 µm or more. When ridge width W is 50 µm or more, kinks are less likely to occur although effective refractive index ΔN becomes small. When the total film thickness of second light guide layer 14 and third light guide layer 16 is 0.5 µm or more, it is possible to achieve a waveguide that provides a super low loss of 1.5 cm$^{-1}$ or less.

In addition, when ridge height H is in a range from 0.55 to 0.65 µm, inclusive: the waveguide loss is 5 cm$^{-1}$ or less when the total film thickness of second light guide layer 14 and third light guide layer 16 is 0.25 µm or more; the waveguide loss is 4 cm$^{-1}$ or less when the total film thickness of second light guide layer 14 and third light guide layer 16 is 0.33 µm or more; and the waveguide loss is 2 cm$^{-1}$ or less when the total film thickness of second light guide layer 14 and third light guide layer 16 is 0.42 µm or more.

In addition, forming conductive oxide film 33 including ITO on the ridge reduces expansion of a light distribution on the waveguide to p-side electrode 32 because conductive oxide film 33 has a low refractive index. As a result, light absorption in the p-side electrode is reduced, which reduces waveguide losses. As described above, in order to reduce waveguide losses, it is excellent to increase the total film thickness of second light guide layer 14 and third light guide layer 16. With this configuration, light distributed in the stacking direction is gathered in the active layer having a high refractive index. This reduces not only expansion of the light distribution to p-side electrode 32, but also the rate of light distributed in either an n-type layer or a p-type layer each having a high electron concentration or a high hole concentration. This reduces free carrier losses.

Here, polarization charges occur in a near-interface region in the vicinity of the interface between second light guide layer 14 and third light guide layer 16. In order to reduce the influence of polarization charges, it is only necessary that doping is performed only in the near-interface region at which polarization charges occur. It is better not to dope an impurity in the region other than the near-interface region intentionally because the concentration of electrons and the concentration of holes in second light guide layer 14 and third light guide layer 16 are rather small in the case of skipping doping in the other region and thus free carrier losses incurred by light distributed in second light guide layer 14 and third light guide layer 16 become small.

However, doping of the impurity reduces the difference ΔN between the effective refractive index inside the ridge and the effective refractive index outside the ridge, and reduces light confinement in the horizontal transverse direction. In the case where effective refractive index difference ΔN becomes 3×10$^{-3}$ or less when ridge width W is 30 µm or less, laser oscillation is unlikely to occur at the same time in the horizontal transverse modes of three kinds of different orders, and kinks occur in current-light output characteristics.

In view of this, in order to increase effective refractive index difference ΔN in a state where the total film thickness of second light guide layer 14 and third light guide layer 16 is large, it is effective to increase the Al composition ratio in first semiconductor layer 12 higher than the Al composition ratio in second semiconductor layer 19. With this configuration, since increase in Al composition ratio reduces the refractive index, light in a light distribution is biased toward the side of second semiconductor layer 19 at which the refractive index is high. This results in increase in the influence in effective refractive indices due to the difference between inside the structure of the ridge in the horizontal direction and outside the structure of the ridge in the horizontal direction. This enables increase in refractive index difference ΔN.

In this case, forming conductive oxide film 33 including ITO on the ridge and setting ridge height H to 0.45 µm or less make it possible to reduce series resistance of semiconductor light emitting element 500, which reduces the rate of light which is inside the ridge which is a p-type layer and is distributed in the stacking direction. For this reason, free carrier losses are reduced. Furthermore, it is possible to reduce absorption losses in p-side electrode 32.

At this time, as shown in FIG. 30, in the case where the concentration of Si doped at the interface between first semiconductor layer 12 and first light guide layer 13 and the interface between first light guide layer 13 and second light guide layer 14 is 1×10$^{18}$ cm$^{-1}$, an operation voltage increases when the Al composition ratio in first semiconductor layer 12 is increased to 0.04 or more. In the opposite case where the concentration of Si doped at each interface is 5×10$^{18}$ cm$^{-1}$ or more, an operation voltage does not change even when the Al composition ratio in first semiconductor layer 12 is increased. In view of this, doping Si of 5×10$^{18}$ cm$^{-1}$ or more at each interface makes it possible to prevent change in the shape of the band structure due to polarization charges that occur at the interface as long as the Al composition ratio is within the range of 0.08 or less. In this way, it is further possible to achieve further reduction in operation voltage.

When the Al composition ratio in first semiconductor layer 12 is increased to 0.04 or more, it is possible to achieve reduction in operation voltage even when Si of 5×10$^{18}$ cm$^{-1}$ or more is doped only to the interface between first semiconductor layer 12 and first light guide layer 13 among the interface between first semiconductor layer 12 and first light guide layer 13 and the interface between first light guide layer 13 and second light guide layer 14.

As a result, it is possible to reduce series resistances, increase effective refractive index difference ΔN, and reduce waveguide losses at the same time. Accordingly, it is possible to achieve a semiconductor light emitting element which has low operation voltage characteristics, provides a high light emitting efficiency, and has current-light output characteristics which do not cause kinks.

Variations, Etc.

Although the semiconductor light emitting element according to the present disclosure has been described based on each of the embodiments above, the present disclosure is not limited to the embodiment.

For example, although a blue laser element having an oscillation wavelength band including 450 nm has been described in any of the embodiments, the present disclosure is applicable also to a blue-violet laser element having an oscillation wavelength band including 405 nm.

For example, it is possible to achieve a semiconductor laser element which has a wavelength in a band of approximately 365 nm to 390 nm, inclusive, and emits laser light at a light output of approximately 1 W to 5 W, inclusive, by applying a current approximately in a range from 2 A to 10 A, inclusive, and applying a voltage approximately in a range from 3.5 V to 6 V, inclusive, to a semiconductor laser element which has (i) a ridge width (for example, a stripe width) of approximately in a range from 8 μm to 100 μm, inclusive, and (ii) a resonator length of approximately 800 μm to 5000 μm, inclusive.

For example, it is possible to achieve a semiconductor laser element which has a wavelength in a band of approximately 390 nm to 420 nm, inclusive, and emits light at a light output of approximately 3 W to 10 W, inclusive, by applying a current approximately in a range from 2 A to 10 A, inclusive, and applying a voltage approximately in a range from 4 V to 6 V, inclusive, to a semiconductor laser element which has (i) a ridge width (stripe width) of approximately in a range from 30 μm to 100 μm, inclusive, and (ii) a resonator length of approximately 1200 μm to 5000 μm, inclusive.

For example, it is possible to achieve a semiconductor laser element which has a wavelength in a band of approximately 420 nm to 460 nm, inclusive, and emits light at a light output of approximately 6 W to 15 W, inclusive, by applying a current approximately in a range from 4 A to 15 A, inclusive, and applying a voltage approximately in a range from 4 V to 7 V, inclusive to a semiconductor laser element which has (i) a ridge width (stripe width) of approximately in a range from 50 μm to 150 μm, inclusive, and (ii) a resonator length of approximately 1300 μm to 5000 μm, inclusive.

For example, it is possible to achieve a semiconductor laser element which has a wavelength in a band of approximately 460 nm to 500 nm, inclusive, and emits light at a light output of approximately 3 W to 15 W, inclusive, by applying a current approximately in a range from 4 A to 15 A, inclusive, and applying a voltage approximately in a range from 4 V to 7 V, inclusive, to a semiconductor laser element which has (i) a ridge width (stripe width) of approximately in a range from 30 μm to 150 μm, inclusive, and (ii) a resonator length of approximately 1200 μm to 5000 μm, inclusive.

For example, it is possible to achieve a semiconductor laser element which has a wavelength in a band of approximately 500 nm to 540 nm, inclusive, and emits light at a light output of approximately 2 W to 10 W, inclusive, by applying a current approximately in a range from 4 A to 15 A, inclusive, and applying a voltage approximately in a range from 4.5 V to 7 V, inclusive, to a semiconductor laser element which has (i) a ridge width (stripe width) of approximately in a range 40 μm to 150 μm, inclusive, and (ii) a resonator length of approximately 1300 μm to 5000 μm, inclusive.

For example, the semiconductor laser element may be a multi-emitter semiconductor laser element having a plurality of stripes (for example, approximately 60 stripes) which confine current.

In addition, although each of the embodiments describes the example in which the semiconductor light emitting element is the semiconductor laser element, it is to be noted that the semiconductor light emitting element is not limited to the semiconductor laser element. For example, the semiconductor light emitting element may be a super luminescent diode.

In addition, although current is confined using the ridge structure in each of the semiconductor light emitting elements according to the embodiments and variations, the means for confining current is not limited to the ridge. An electrode stripe structure, an embedment-type structure, or the like may be used.

Furthermore, the present disclosure encompasses embodiments obtainable by making various kinds of modifications that may be arrived at to any of the above embodiments and embodiments obtainable by suitably combining some of the constituent elements and functions in any of the embodiments without materially departing from the present disclosure.

INDUSTRIAL APPLICABILITY

The semiconductor light emitting elements according to the present disclosure are applicable to, for example, on-vehicle head light sources, etc. as light sources which only consume low power even in operations at a high temperature.

What is claimed is:

1. A semiconductor light emitting element, comprising:
   a GaN substrate;
   a first semiconductor layer above the GaN substrate, the first semiconductor layer including a nitride semiconductor of a first conductivity type;
   an active layer above the first semiconductor layer, the active layer including a nitride semiconductor including Ga or In;
   an electron barrier layer above the active layer, the electron barrier layer including a nitride semiconductor including at least Al; and
   a second semiconductor layer above the electron barrier layer, the second semiconductor layer including a nitride semiconductor of a second conductivity type different from the first conductivity type;
   wherein when:
   in the electron barrier layer, a stacking direction perpendicular to a main surface of the GaN substrate is an x-axis direction;
   in the stacking direction: a position closest to the active layer is represented by position x=Xs; and a position farthest from the active layer is represented by position x=Xe;
   in the stacking direction, a position having a highest Al composition ratio between position x=Xs and position x=Xe is represented by position x=Xm;
   in the electron barrier layer, an Al composition ratio at position x that satisfies Xs≤x≤Xe is represented by function f(x); and
   a first derivative of function f(x) with respect to x is f'(x), and a second derivative of function f(x) with respect to x is f"(x),
   the electron barrier layer includes a first concave region that satisfies f"(x)>0 and f'(x)>0, the first concave region being included in a region that satisfies Xs<x≤Xm regarding position x, and the electron barrier layer includes a first decrease region and a second decrease region in order from a side of the active layer, the first decrease region having an Al composition ratio that decreases monotonically in a direction from position x=Xm toward the second semiconductor layer, the second decrease region having an Al composition ratio that decreases monotonically less than in the first decrease region in the direction from position x=Xm toward the second semiconductor layer.

2. The semiconductor light emitting element according to claim 1, wherein the first conductivity type is n-type, and the second conductivity type is p-type.

3. The semiconductor light emitting element according to claim 1, wherein the electron barrier layer is of the second conductivity type.

4. The semiconductor light emitting element according to claim 1, further comprising:
an intermediate layer between the electron barrier layer and the active layer, the intermediate layer including a nitride semiconductor,
wherein the active layer includes InGaN, and
the intermediate layer includes GaN of the second conductivity type.

5. The semiconductor light emitting element according to claim 1, wherein the semiconductor light emitting element is a semiconductor laser element having a resonator length of 1200 μm or more.

6. The semiconductor light emitting element according to claim 1, wherein the semiconductor light emitting element is a semiconductor laser element having a resonator length of 1500 μm or more.

7. The semiconductor light emitting element according to claim 1,
wherein the semiconductor light emitting element is a semiconductor laser element having a stripe, and
the stripe has a width of 40 μm or more.

8. The semiconductor light emitting element according to claim 1,
wherein the semiconductor light emitting element is a semiconductor laser element having a stripe, and
the stripe has a width of 50 μm or more.

9. The semiconductor light emitting element according to claim 1, further comprising:
a conductive oxide film on the second semiconductor layer.

10. The semiconductor light emitting element according to claim 1, wherein the semiconductor light emitting element is a semiconductor laser element having a light output of 10 W or more.

11. The semiconductor light emitting element according to claim 1,
wherein the semiconductor light emitting element is a semiconductor laser element,
the second semiconductor layer has a ridge, and
the ridge has a height in a range from 0.25 μm to 0.65 μm, inclusive.

12. The semiconductor light emitting element according to claim 1, wherein the semiconductor light emitting element is a semiconductor laser element having an oscillation wavelength band including 450 nm.

13. The semiconductor light emitting element according to claim 1, wherein the semiconductor light emitting element is a semiconductor laser element having an oscillation wavelength band including 405 nm.

14. The semiconductor light emitting element according to claim 1, further comprising:
a lower light guide layer between the first semiconductor layer and the active layer; and
a upper light guide layer between the active layer and the electron barrier layer.

15. The semiconductor light emitting element according to claim 14, further comprising:
a first light guide layer between the first semiconductor layer and the lower light guide layer.

16. The semiconductor light emitting element according to claim 1, wherein the semiconductor light emitting element is a semiconductor laser element having a resonator length of 1500 μm or more.

17. The semiconductor light emitting element according to claim 1,
wherein the semiconductor light emitting element is a semiconductor laser element having a stripe, and
the stripe has a width of 50 μm or more.

18. The semiconductor light emitting element according to claim 1, wherein the semiconductor light emitting element is a semiconductor laser element having a light output of 6 W or more.

19. The semiconductor light emitting element according to claim 1, wherein the semiconductor light emitting element is a semiconductor laser element having an oscillation wavelength of 420 nm or less and a light output of 3 W or more.

20. The semiconductor light emitting element according to claim 1, wherein the semiconductor light emitting element is a semiconductor laser element having an oscillation wavelength of 500 nm or more and a light output of 2 W or more.

* * * * *